United States Patent
Nazarathy et al.

(10) Patent No.: US 8,953,950 B2
(45) Date of Patent: Feb. 10, 2015

(54) ULTRA-HIGH-SPEED PHOTONIC-ENABLED ADC BASED ON MULTI-PHASE INTERFEROMETRY

(75) Inventors: Moshe Nazarathy, Haifa (IL); Igor Zelniker, Haifa (IL)

(73) Assignee: Technion Research and Development Foundation Ltd., Haifa (IL)

( * ) Notice: Subject to any disclaimer, the term of this patent is extended or adjusted under 35 U.S.C. 154(b) by 399 days.

(21) Appl. No.: 13/386,422

(22) PCT Filed: Jul. 25, 2010

(86) PCT No.: PCT/IL2010/000590
§ 371 (c)(1),
(2), (4) Date: May 3, 2012

(87) PCT Pub. No.: WO2011/010314
PCT Pub. Date: Jan. 27, 2011

(65) Prior Publication Data
US 2012/0213531 A1    Aug. 23, 2012

Related U.S. Application Data

(60) Provisional application No. 61/228,162, filed on Jul. 24, 2009.

(51) Int. Cl.
*H04B 10/06* (2006.01)
*H03M 1/14* (2006.01)
*H03M 1/16* (2006.01)
*H03M 1/36* (2006.01)
*H03M 1/46* (2006.01)
*H03M 1/74* (2006.01)
*H03M 3/00* (2006.01)
*H04B 10/04* (2006.01)

(52) U.S. Cl.
CPC .............. *H03M 1/145* (2013.01); *H03M 1/146* (2013.01); *H03M 1/168* (2013.01); *H03M 1/361* (2013.01); *H03M 1/46* (2013.01); *H03M 1/74* (2013.01); *H03M 3/434* (2013.01); *H03M 3/402* (2013.01); *H03M 3/424* (2013.01); *H03M 3/43* (2013.01); *H03M 3/456* (2013.01)
USPC ........................... 398/203; 398/213; 398/188

(58) Field of Classification Search
CPC .... H04B 10/61; H04B 10/613; H04B 10/616; H04B 10/6165
USPC .................. 398/188, 202, 203, 212, 214, 204
See application file for complete search history.

(56) References Cited

U.S. PATENT DOCUMENTS

| | | | |
|---|---|---|---|
| 6,700,517 B1 * | 3/2004 | Kellar ........................... | 341/137 |
| 7,826,752 B1 * | 11/2010 | Zanoni et al. .................. | 398/205 |
| 2002/0067299 A1 * | 6/2002 | Clark et al. .................... | 341/137 |

* cited by examiner

*Primary Examiner* — Daniel Dobson
(74) *Attorney, Agent, or Firm* — Oren Reches

(57) ABSTRACT

A ultra high speed photonic Analog to Digital Converted (ADC) for sampling and quantizing an electrical voltage signal, internally enabled by photonics uses coherent optical detection architectures for photonic quantization. Coherent light is phase modulated by the test signal. Using an interferometer, or an array of interferometers the phase of modulated light is compared with a reference light. Flash ADC, successive approximation ADC and delta-sigma ADC configurations are presented.

19 Claims, 46 Drawing Sheets

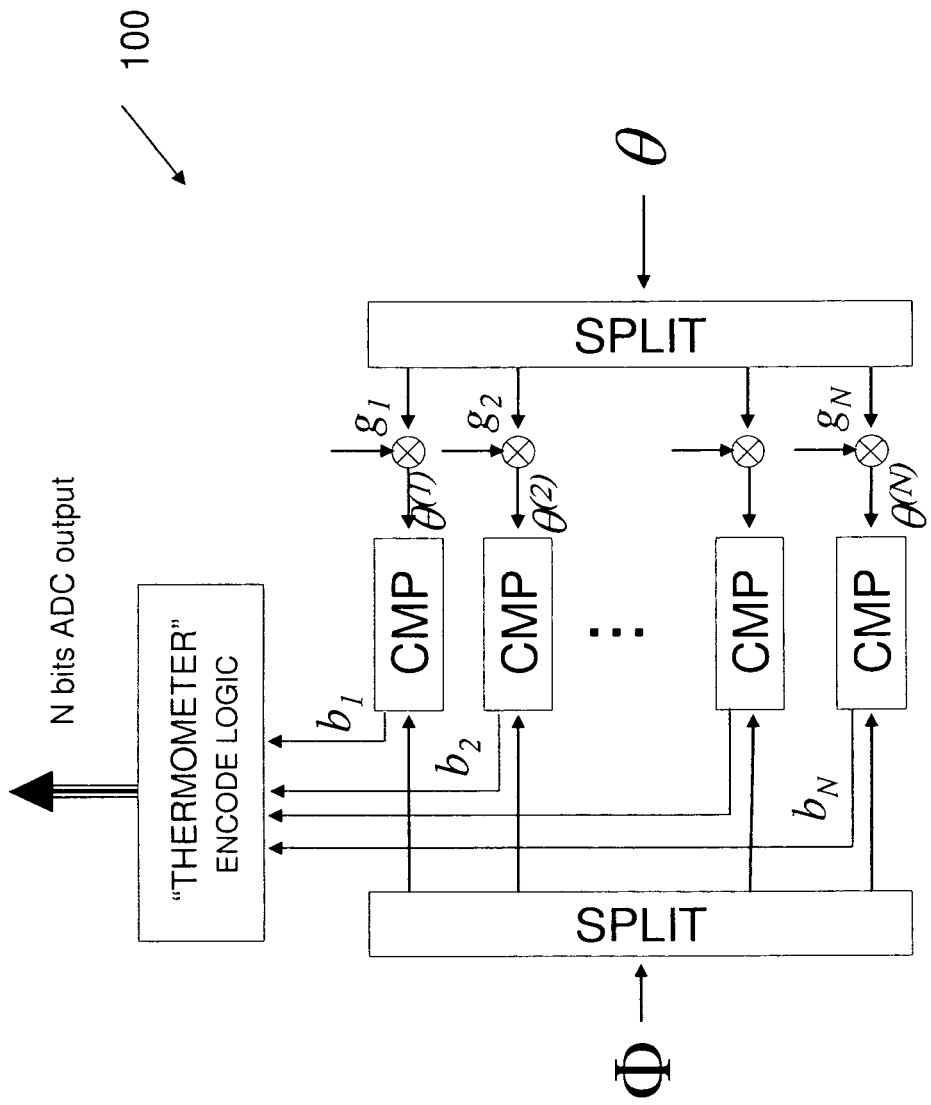
FIG. 1 (art)

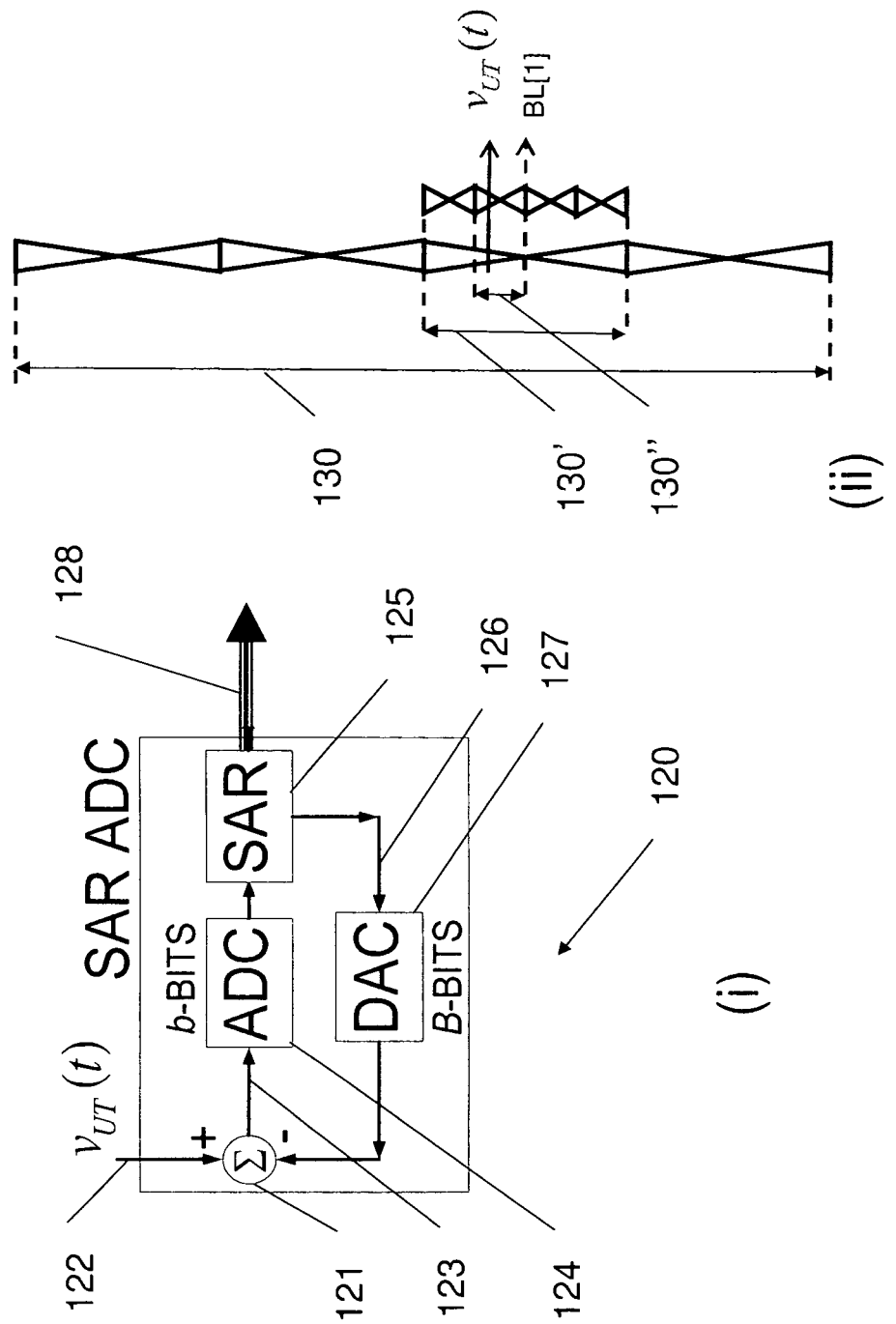
FIG. 2a (art)

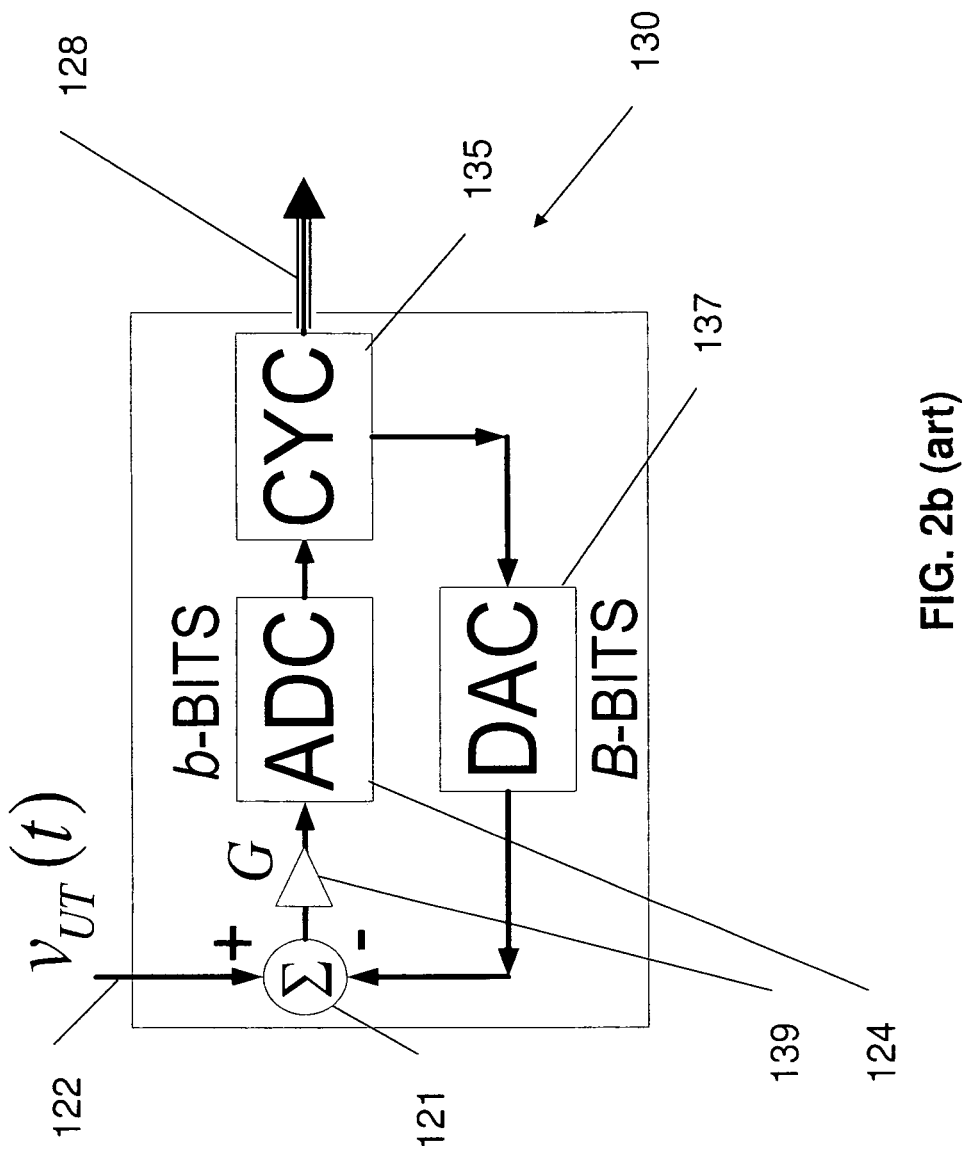
FIG. 2b (art)

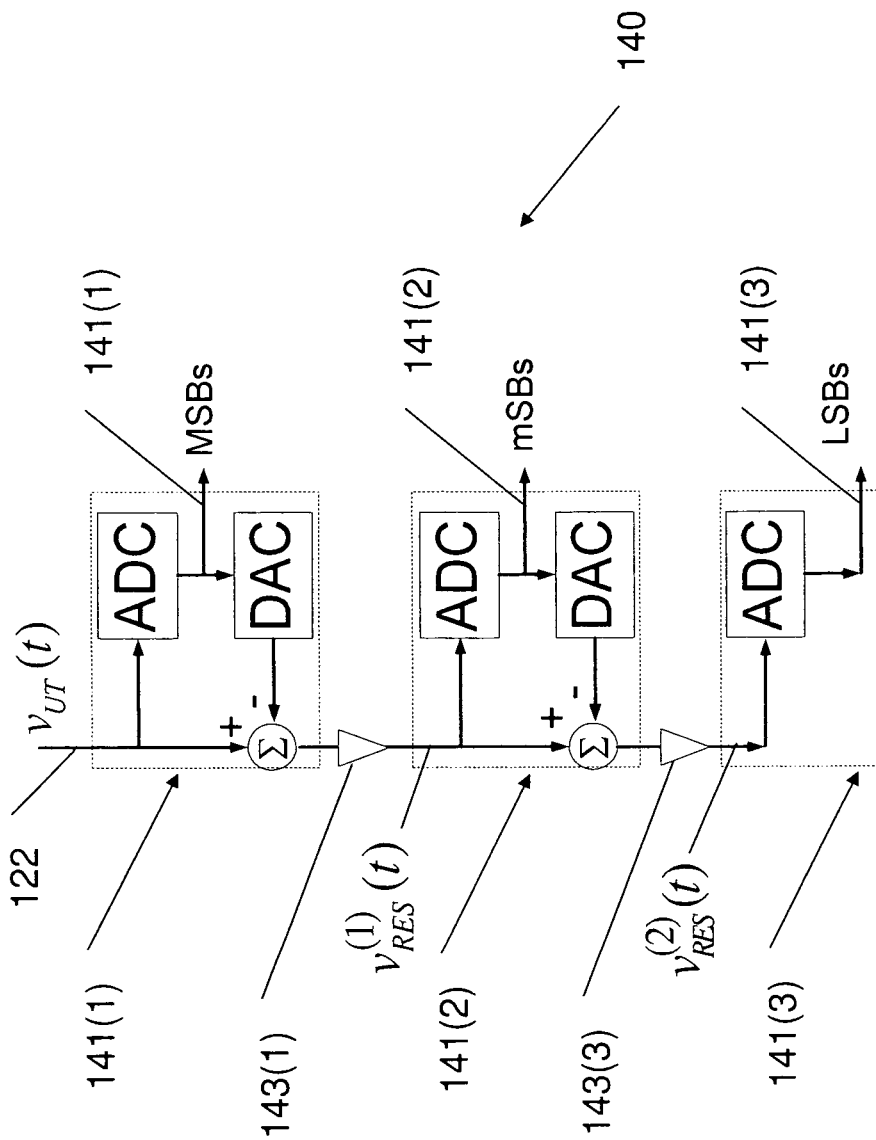
FIG. 3 (art)

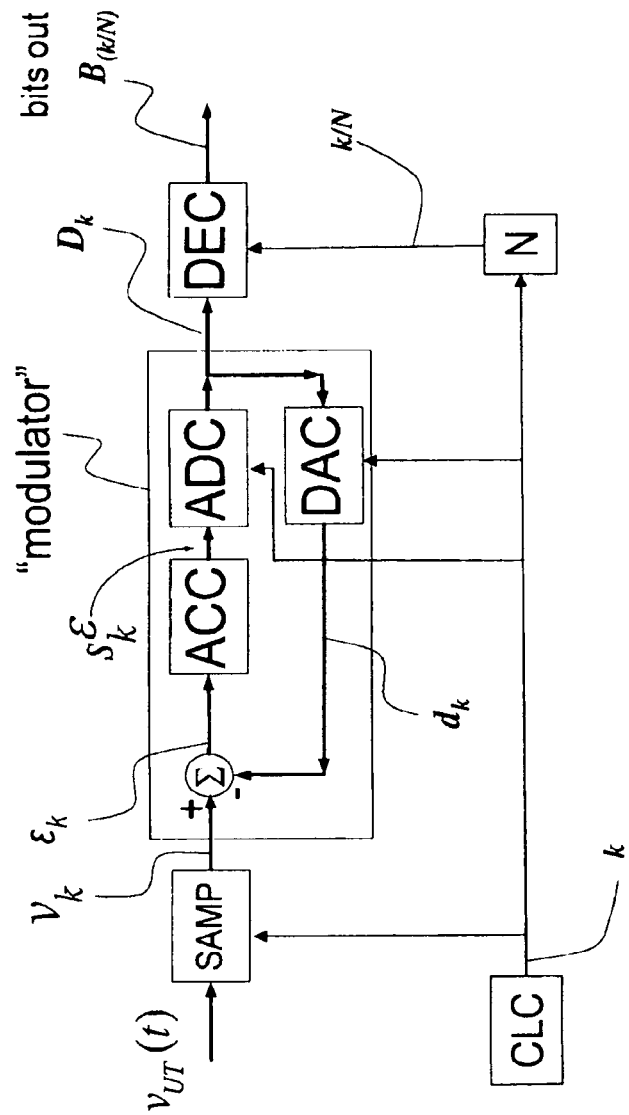
FIG. 4A (art)

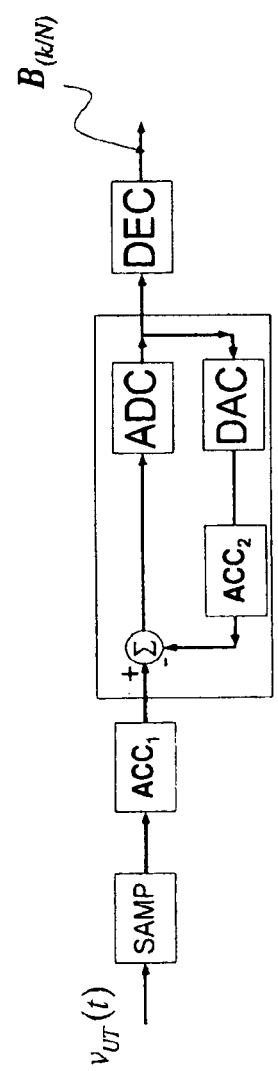
FIG. 4B (art)

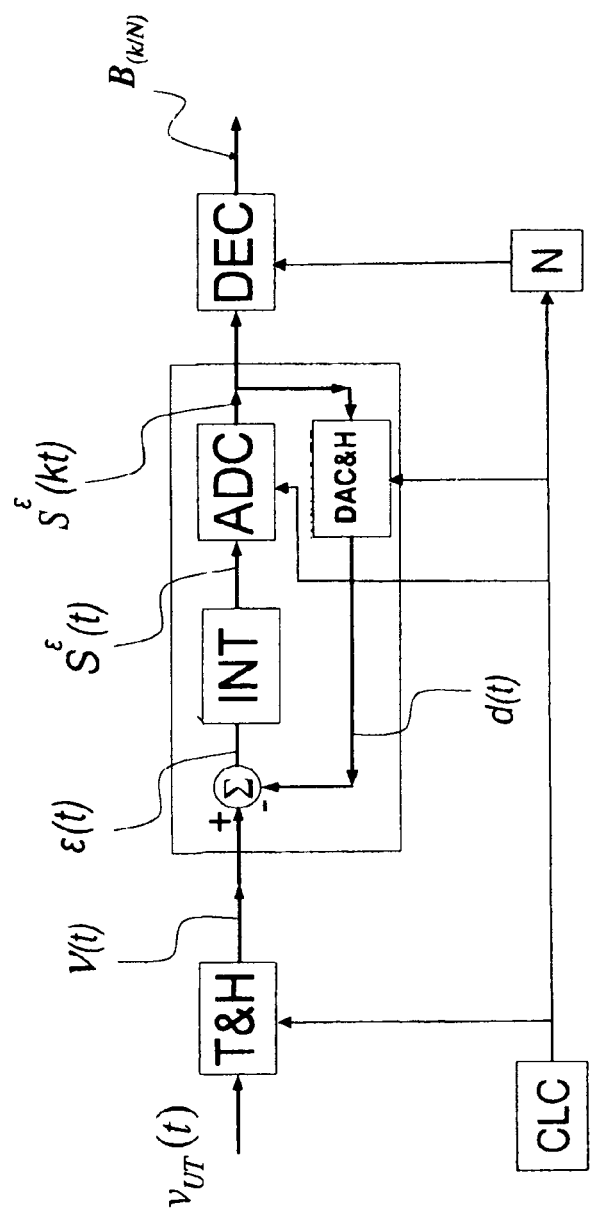
FIG. 4C (art)

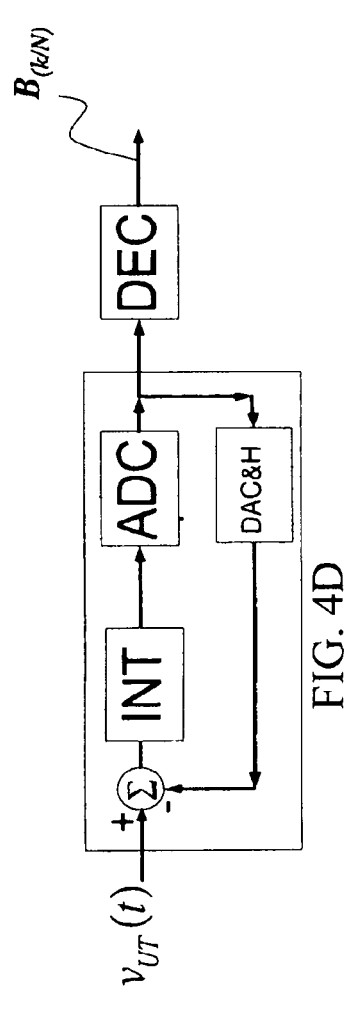
FIG. 4D
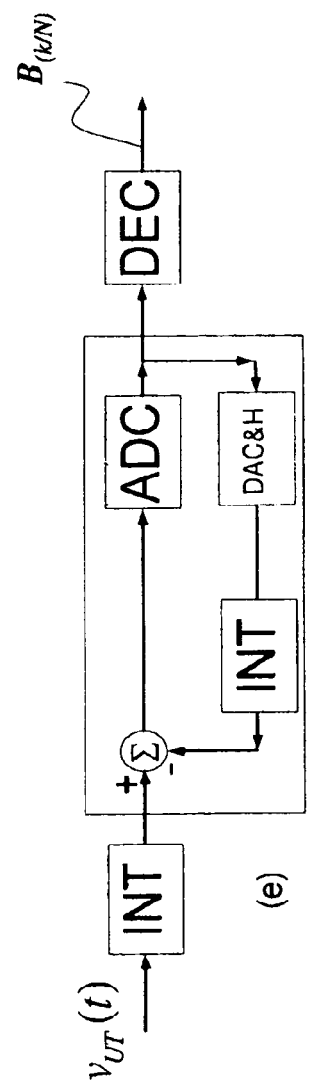
FIG. 4E (art)

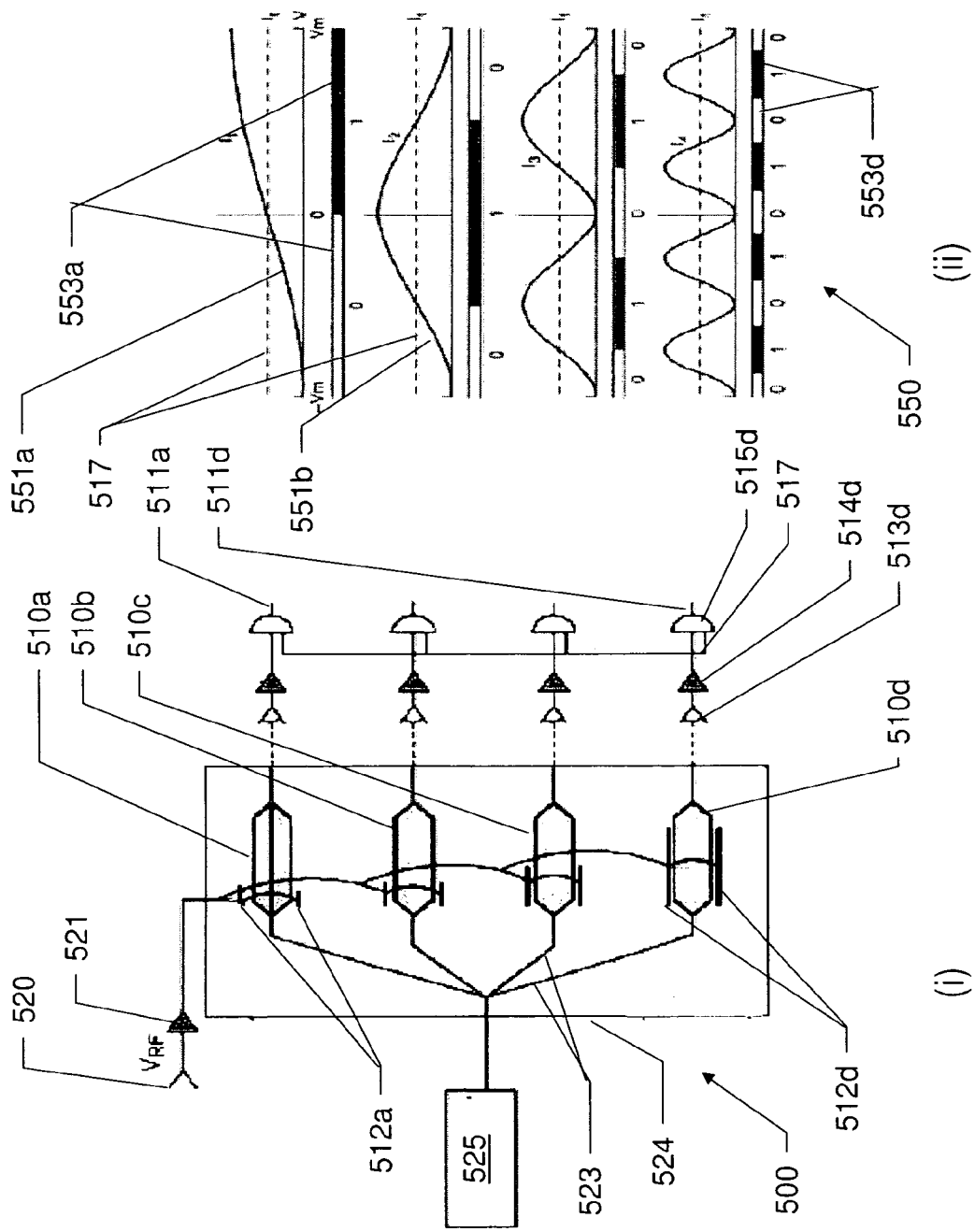
FIG. 5 (art)

ized ADC conversion required for mass applications, based on switched-capacitor CMOS mixed-signal circuitry. As technology improves, successively more powerful ADCs have been introduced; however, achieving a large ENOB for signals of multi-GigaHz wideband signals is an outstanding challenge.

ULTRA-HIGH-SPEED PHOTONIC-ENABLED ADC BASED ON MULTI-PHASE INTERFEROMETRY

FIELD OF THE INVENTION

The present invention relates to novel Photonic Analog to Digital Converter (PADC) schemes sampling and quantizing an electrical voltage signal, internally enabled by photonics.

BACKGROUND OF THE INVENTION

Overview of Conventional Electronic High-Speed Analog-to-Digital Conversion

Overviews of conventional electronic ADC techniques and their state-of-the-art are available in [4-9]. Two main Analog to Digital Converter (ADC) characteristics are the sampling rate (or signal bandwidth), and the quantization resolution, expressed in bits. To extract the full information available in an analog signal, one has to sample it at least as fast as the "Nyquist Rate", a rate equal to twice its maximum frequency. It follows that a high sample rate is required in order to reproduce large bandwidth signals. High quantization resolution permits to lower the quantization noise. Practical implementations of ADCs add extra noise and distortion to the signal, further limiting the actual quantization resolution. In the presence of noise, the relevant quantity that captures the actual resolution is called Effective Number Of Bits (ENOB), namely the number of bits (resolution) that an ideal ADC would have to have, such that its quantization noise would be equal to the total noise generated by the actual ADC (including both the quantization noise and the other sources of noise and distortion). Notice that fractional ENOBs are also allowed. Electronic (ADC) technology cost-effectively provides the bulk of ADC conversion required for mass applications, based on switched-capacitor CMOS mixed-signal circuitry. As technology improves, successively more powerful ADCs have been introduced; however, achieving a large ENOB for signals of multi-GigaHz wideband signals is an outstanding challenge.

While progress in ADC electronic technology has been steady, the limitations of electronic technology are most evident for high-end ADC systems, exceeding sampling rates of a few Giga samples per second (GS/s). In this regime as few as 3 bits of effective resolution are achievable only at high complexity and effort, as evident in the high cost and large size of 10-40 GS/s sampling oscilloscopes (which actually digitize repetitive waveforms rather than real-time arbitrary waveforms, hence their performance is better than a hypothetical ADC at the same sampling rate). Similarly, the ADC systems used for capturing RF waveforms in Electronic Warfare (EW) systems are bulky, occupying whole racks.

There are multiple classes of ADCs, the main ones being
(i) Flash ADCs
(ii) Successive Approximations Register (SAR) ADCs
(iii) Pipelined ADCs
(iv) Oversampling ADCs, such as $\Sigma$-$\Delta$ ADCs.

The most dominant limitation of high-speed A/D conversion is the jitter and phase-skew of the sampling clock, degrading the sampling performance of the Track & Hold (T&H) ADC front-ends. Other limitations of the T&H circuitry pertain to the transients of the electronic circuitry, parasitics (e.g. stray capacitances), offsets and gain variations, component mismatches, nonlinearities, couplings between sampling and sampled signals, the detrimental effect of all of which compounds as ADC speed is increased.

For high-speed applications, which are our interest here, flash ADCs are typically used, often in conjunction with time-interleaving, as described below.

In flash ADC systems the T&H front-end is followed by a quantizer, realized as a parallel bank of comparators, in effect comparing the input signal against a sequence of equally-spaced threshold comparators representing the ADC levels. Each comparator acts like a 1-bit ADC, in effect digitally generating the sign of the difference between its two inputs signal (the RF signal under test and the voltage threshold). The technology of these comparators, considered individually, is relatively well-developed (one of the comparator impairments is the so-called metastability of the latch circuitry). It turns out that comparator speeds are currently not the bottleneck of flash ADC systems, however significant additional degradation arises upon "gluing together" multiple comparators to form a complete flash-quantizer: The generation and stability of the set of threshold voltages and the undistorted distribution of replicas of the signal under test to the comparator manifest as an additional performance-limiting factors for high-speed ADCs.

Finally, given ADCs of a certain speed, a faster ADC system may be generated by time interleaving the slower modules, in effect dividing the train of samples under test into m interleaved sub-trains and using a bank of slower ADCs (each operating at a m-times slower sampling rate) in order digitize each of the sampling sub-trains (notice however that the front-end T&H of each such ADC should be able to capture the full signal bandwidth). The issues limiting the performance of such Time-Interleaved ADC (TI-ADC) are the control and matching of the timing phases, gains and offsets of the individual ADCs.

We end up this review section by introducing conceptual signal-theoretic block diagrams for the main types of ADCs which our invention will disclose photonic realizations thereof. We start with a key building block, the comparator (CMP), which is a system with two analog scalar S, R and a Boolean output $b \in (0,1)$ such that $b=1$ if $S>R$, $b=0$ otherwise. In this disclosure we also consider a comparator with a single input S, implying that the second input is "grounded" $R=0$, i.e. $b=1$ if $S>0$, $b=0$ if $S \leq 0$. Hence, such single-input comparator is a sign-detector, alternatively referred to in this disclosure as slicer, or 1-bit ADC. The three named terms are then synonymous. We also use comparators with bipolar Boolean $b=\pm 1$ outputs. A single input comparator with bipolar output is then described as $b=\text{sign}\{S\}$. A two-input comparator with bipolar output may be described in terms of a single input comparator as $b=\text{sign}\{S-R\}$.

Actually an ADC which is not a compound structure, typically a flash ADC, is the cascade of a Track & Hold module otherwise known as Sample & Hold (S&H), wherein sampling is performed, followed by a Quantizer, followed by an Encoder producing the final bit-string.

Generally, the logical block diagram of a Photonic ADC (PADC) follows a logical block diagram of an Electronic ADC as known in the art. Thus, this overview is relevant to both ACD and PADC.

The current invention details ways of implementing the PADC using optical and electro-optical components instead of at least some of the electronic components used in ADCs.

We next survey four types of ADCs and PADC, focusing on their quantizers, i.e. assuming the sample is held to a fixed value, essentially treating it as a scalar input:

FIG. 1 schematically depicts a block diagram of a generic flash ADC as known in the art.

A flash ADC is described in FIG. 1. The signal under test $\Phi$ (which could conventionally be a voltage—an electrical potential (in the PADC according to the invention, Φ is represented by an optical phase, as would be discussed below) is split $N=2^b$ ways, with b the number of bits and N the number of levels, and compared in parallel to a sequence of levels (thresholds) $\{\theta^{(1)}, \theta^{(2)}, \ldots, \theta^{(N)}\}=\{g_1\theta, g_2\theta, \ldots, g_N\theta\}$ where θ is a reference signal and $\{g_n\}_{n=1}^N$ are scaling factors. Typically, $\{\theta^{(1)}, \theta^{(2)}, \ldots, \theta^{(N)}\}$ form an arithmetic sequence, i.e. they are equally spaced.

In a conventional electronic implementation of the flash converter 100, the levels $\theta^{(n)}=g_n\theta$ are generated by means of a voltage divider ladder, with θ the reference voltage feeding the ladder and $g_n$ the n-th voltage division factor. In our PADC realization the thresholds $\{\theta^{(1)}, \theta^{(2)}, \ldots, \theta^{(N)}\}$ are in the angular domain—optically generated reference phases. The quantizer section then generates, in parallel (hence the name "flash") N decisions described by the vector of bipolar bits $B=\{b_1, b_2, \ldots, b_N\}=\{\text{sign}\{\Phi-\theta^{(n)}\}\}_{n=1}^N$. In the absence of errors, B is of the form $B=\{+1, +1, \ldots, +1, +1, -1, -1, \ldots, -1\}$, i.e. it comprises contiguous +1-s followed by contiguous −1s, assuming that the scaling factors $\{g_n\}_{n=1}^N$ are ascending. Typically, for a mid-rise quantizer (which has a transition right at zero) $\theta_n=(n-N/2)\Delta$, $n=1, 2, \ldots N-1$ and for a mid-tread quantizer $\theta_n=[n-(N+1)/2]\Delta$, $n=1, 2, \ldots N-1$, $\Delta=FS/N=FS/2^b$ the step-size or LSB. The encoder section consists of the so-called "thermometer code" generating an indication of the element position whereat the sign is flipped, which is expressed in binary (as generated by the encoding section hardware, from the B vector input $\{b_1, \ldots b_N\}$), yielding the ADC decision for the given signal under test Φ. This element position is the index of the decision region within which the signal under test Φ falls.

FIGS. 2a and 2b schematically depicts a Successive Approximations Register (SAR) ADC as known in the art.

A block diagram of a SAR ADC 120 is described in FIG. 2a(i).

The output of a Digital to Analog Converter (DAC) is subtracted 121 off the signal under test 122, and then the difference 123 is quantized to b bits by a b-bits ADC 124. The ADC decision is presented to the SAR logic 125 which generates a control word 126 driving the B-bits DAC 127, closing the loop.

The output 128 has B bits wherein B>b, or B=b+d, with d>0.

In electronics invariably we have b=1, i.e. the ADC 124 is actually a highly accurate slicer (sign-detector). Then the principle of operation amounts to binary search starting with full scale and halving up the interval d=B−1 times. SAR ADCs are not actually used in electronics with b>1, however for the purpose of the current invention, it is of interest to consider such "higher-order" SAR, as it is the basis for the optical SAR realization according to the current invention.

FIG. 2a(ii) schematically depicts the first two steps of SAR process for b=2 case (two bits ADC)

Now the ADC must have an adaptive full scale, starting with the full-scale 130 of the voltage under test and scaling down its full-scale in each cycle by a factor of $2^b$. This calls for the ability to modify the positions of the $2^b$ ADC thresholds $g_nU$, which will be seen possible in the inventive PADC case. Practically, this cannot be continued indefinitely, as the thresholds get too close together, becoming hard to resolve. The SAR operates as follows: starting with the full scale 130, each recursive interval is segmented in $2^b$ intervals, to generate a new sub-intervals 130'; 130", etc., and the signal under test is determined to be in one of these $2^b$ intervals by virtue of the b-hits ADC action. Then the DAC subtracts in the n-th stage the "baseline" (BL[n]) of the recursive interval just found off the signal (the "baseline" is either the center of the interval or the bottom value of the interval, depending on the type of ADC), then another cycle of b-bits ADC is performed (with a $2^b$ times more compressed full-scale), pinpointing the signal under test to a new sub-interval. Again the baseline of the new sub-interval is subtracted off from the voltage under test by the DAC, and the process is repeated, zooming in deeper.

FIG. 2(b) schematically described a block diagram of a cyclic ADC 130 as known in the art.

This structure is very similar to the SAR ADC 120 (in fact the CYC 135 logic is virtually identical to the SAR logic 125), except that the difference output is rescaled 139 by a factor $G=2^b$, prior to being ADC-ed, hence the ADC 137 does not need to have an adaptive full scale, but can have a fixed full scale. Evidently this is preferable to the SAR ADC, but unfortunately, we cannot apply such scaling in our photonic implementation, hence we shall not be able to realize the cyclic ADC but just the SAR ADC.

FIG. 3 schematically depicts a block diagram 140 of a Pipelining ADC.

It may be described as a spatially laid out version of the Cyclic ADC. Each stage, such as stages 141(1), 141(2) and 141(3) generates a partial decision (respectively 142(1), 142(2) and 142(3) being the Most Significant Bits (MSBs), Medium Significant Bits (mSBs); and Least Significant Bits (LSBs)), on some of the ADC bits, as well as a residual error. The error is in turn amplified 143(1) and 143(2) by a factor of $2^b$ wherein b is the number of bits of the ADC and DAC to form the input $V^{(1)}_{RES}(t)$ and $V^{(2)}_{RES}(t)$ of stages 141(2) and 141(3) respectively. Inputs $V^{(1)}_{RES}(t)$ and $V^{(2)}_{RES}(t)$ are then requantized again in the following section, and so on.

FIG. 4 schematically depicts a block diagrams 5 exemplary variations of Sigma-Delta (ΣΔ) ADC A ΣΔ ADC is a system sampling its input at a much higher rate ($d_{\Sigma\Delta}\times$) than the Nyquist sampling rate by means of the ΣΔ "modulator" module, followed by the decimator (DEC) module, bringing the rate down by the integer factor of $d_{\Sigma\Delta}$, in order to gain in quantization noise shaping.

We only consider here a first-order ΣΔ ADC, using an analog integrator (INT) or analog accumulator (ACC) in the loop. It turns out that the improvement in the ENOB factor in the first-order filtering case is $1.5 \log_2 d_{\Sigma\Delta}$ i.e. 1.5 bits for each octave (doubling) of the rate. The figures show several variants, some of which are of theoretical interest. In FIGS. 4A, 4B, and 4C a T&H is used in the first stage, hence the modulator actually describes a discrete-time system, acting on the analog-valued discrete-time samples generated by the T&H.

The basic mathematical structure of FIG. 4A is with all the signals within the modulator being stylized as discrete-time sequences.

In operation, the sampler "SAMP" performs analog sampling of the input voltage $v_{UT}(t)$ at regular times $t=T*k$, producing series of analog samples $v_k$. Synchronization is maintained by a clock (CLC), producing a pulse "k" at these regular time intervals "T".

After analog subtraction at subtractor Σ, of the output $d_k$ of the Digital to Analog Converter DAC, the voltage at the input to the accumulator ACC is given by $\epsilon_k$.

The accumulator ACC performs analog accumulation of the signal $\epsilon_k$. producing a sum signal $S^\epsilon_k$ so that:

$$\epsilon_k = v_k - d_k; \; s_k^\epsilon = \Sigma_{k'=0}^k \epsilon_{k'} = s_{k-1}^\epsilon + \epsilon_{k-1}.$$

Analog accumulator ACC accumulates the residual signals $\epsilon_k$ to produce the accumulated signal $S^\epsilon_k$.

Accumulated signal $S^\epsilon_k$ is digitized by a fast analog to digital converter ADC.

The digital results of ADC are converted back to analog signal $d_k$ to be subtracted from the sampled input signal. Due to the small number of bits of ADC, the signal $d_k$ is generally smaller than sample $v_k$. However, the residual difference is not lost, but remain in the subtracted residual signal $d_k$ to be accumulated at the ACC.

After one or few cycles, the accumulated residuals $d_k$+$d_{k+1}$+, . . . may add up to influence the result of ADC.

Decimator DEC receives it synchronization k/N from a cyclic counter N, reducing the rate of clock CLC by a factor of N. Decimator DEC digitally adds up the digital results $D_k$ of analog to digital converter DEC produced in the time interval t=T*k*N to t=T*k*(N+1) and presents at the output $B_{(k/n)}$ at the "bits out" digital output.

It is easy to see that if the resolution of ADC and DAC is $2^n$, where n is the number of bits of ADC and DAC, than the resolution given by DEC is $N*2^n$.

A discussion of a one-bit case may be seen for example in http://en.wikipedia.org/wiki/Delta-sigma modulation.

In FIG. 4B we find it convenient to pull up the ACC ahead of the subtractor Σ, hence replacing the sole ACC within the loop in FIG. 4A with a pair of ACCs: $ACC_1$ at the input and $ACC_2$ within the loop, the outputs of which are subtracted at subtractor Σ.

For clarity, the clock subsystem and sum of the markings are not drawn in this figure.

The version in FIG. 4C is a more realistic one, representing now the outputs of the Track and Hold (T&H) and the digital to analog DAC&H not as discrete-time sequences but as "shift-invariant" analog continuous-time signals $v(t)=\Sigma_k v_k h(t-kT)$ and $d(t)=\Sigma_k d_k h(t-kT)$, respectively, where h(t) is a "hold" pulse shape, e.g. a rectangle for a zero-order-hold (ZOH). Let us make the assumption that h(t) has support [0,T], and its integral is normalized to unity $\int_{-\infty}^{-\infty} h(t')dt'=\int_0^T h(t')dt'=1$.

The accumulator is now replaced by an analog integrator, generating $$s^\varepsilon(t) = \int_{-\infty}^t \varepsilon(t')dt'$$

$$= \int_{-\infty}^t [v(t') - d(t')]dt'$$

$$= \int_{-\infty}^t \left[\sum_{k'} v_{k'} h(t-kT) - \sum_{k'} d_{k'} h(t-kT)\right] dt'$$

$$= \sum_k (v_{k'} - d_{k'}) \int_{-\infty}^t h(t'-kT)dt'$$

$$= \sum_{k'} \varepsilon_{k'} \int_{-\infty}^t h(t'-k'T)dt'.$$

Notice that the digital to analog converter DAC&H and analog to digital converter ADC now incorporates a holding function. Analog to digital converter ADC ideally generates the samples $s^\varepsilon(kT)$, which are readily evaluated at the discrete times by setting t=kT in the last equation: $s^\varepsilon(kT)=\Sigma_k \varepsilon_k \int_{-\infty}^{kT} h(t'-k'T)dt'$. It is readily seen that under the assumptions on h(t), the integral in the last expression is given by $\int_{-\infty}^{kT} h(t'-k'T)dt'=1$ if k'≤k-1, $\int_{-\infty}^{kT} h(t'-k'T)dt'=0$ otherwise. Then $\int_{-\infty}^{kT} h(t'-k'T)dt'=u_{k-1-k'}$ where $u_k$ is a discrete-time step function. Then, $s^\varepsilon(kT)=\Sigma_k \varepsilon_k u_{k-1-k'}=\Sigma_{k'=-\infty}^{k-1} \varepsilon_k=s_k^\varepsilon$, i.e. we have established that the system in FIG. 4C is equivalent to those in FIGS. 4A and 4B.

As for the systems in FIGS. 4D and 4E which are evidently equivalent to each other, it is possible to show their equivalence to the previous ones. Specifically this is the case if the input $v_{UT}(t)$ is bounded to a certain level which depends on the full scale of the ADC, and the area under the DAC pulse.

We have normalized the area under the DAC pulse to unity, and let us further assume that the full scale range of the ADC is [-1,1]. The condition on $v_{UT}(t)$ is then that its integral over consecutive T seconds intervals, where $T^{-1}$ is the oversampling rate, be bounded by unity, a sufficient (but not necessary) condition for which is that the input signal $v_{UT}(t)$ be bounded as $|v_{UT}(t)|<T^{-1}$.

Overview of Existing Opto-Electronic Approaches to Analog-to-Digital Conversion

In an effort to achieve higher-performance ADCs, there have been a number of applications of photonic technologies to the problem of A/D conversion. Our survey the existing photonic principle of analog to digital conversion revealed a large number of optically-related architectures, studied over the past 30 years. Starting with the early 70's, researchers provided some proof-of-concept of ADCs taking advantage of interesting optical properties. The comprehensive 2007 survey of photonic ADCs architectures by Valley [1] (available online) is recommended as an excellent review source quoting, summarizing and classifying over 150 papers. Valley proposes to classify the existing photonic ADC architectures in 4 groups (all these architectures assume an electronic analog input and an electronic digital output, with photonics inside):

(i) photonic-assisted
(ii) photonic sampled (electronically quantized)
(iii) Photonic quantized (electronically sampled)
(iv): photonic sampled and quantized The systems according to the current invention fall into class (iv) but work on an a new principle displaying much improved characteristics relative to all-photonic quantization approaches published so far, to the best of our knowledge. Henceforth when referring to Photonic ADC (PADC) we mean a class-(iv) system, photonic sampled and quantized, with electrical analog input and electrical digital output Below we briefly survey some representative systems out of the four classes of photonic-related ADCs.

FIG. 5(i) shows some details of a photonic ADC system 500 which is one of the earliest systems that were developed by Taylor in 1975 [10] For clarity, only some of elements "a" to "d" referring to equivalent elements of system 500 and signals in graph 550 in FIGS. 5(i) and 5(ii) may be marked in these figures.

Photonic ADC system 500 receives electrical input signal $V_{RF}$ 520, which is amplified 521 and is fed to electrodes 512 affecting relative phase shifts in the arms of electro-optic Mach-Zehnder (MZ) modulators 510a to 510d. The MZ modulators are formed by creating wave-guiding traces 523 on a substrate 524. A mode-locked laser 525 provides a train of short, coherent, intense optical pulses at regular time intervals.

He recognized that the periodicity of the corresponding outputs 511a to 511d of an interferometric electro-optic Mach-Zehnder (MZ) modulators 510a to 510d are homomorphic to the periodic variation of the binary representation of an analog quantity, and therefore proposed a scheme based on multiple MZ modulators with lengths of electrodes 512a to 512d forming a binary sequence, with their outputs photo-detected by Avalanche Photo Diodes (APDs) 513a-d, amplified 514a-d, and compared against a threshold 517 in comparators 515a-d.

FIG. 5(ii) shows the photocurrents $I_1$, $I_2$, $I_3$ and $I_4$, detected by APDs 513a-d respectively vs. input voltage $V_{RF}$.

Since the transfer characteristic 551a-c of a MZ 510a-c is sinusoidal with period inversely proportional to the switching voltage hence inversely proportional to the length of the corresponding electrode 512, it has a sinusoidal transfer characteristics shown in FIG. 5(ii) (output photocurrent vs. input voltage), which after thresholding half way between on and off voltages, appear like square wave transfer characteristics 553a-d with periods forming a power-of-two sequence. It is readily seen that passing an input voltage under test through such a bank of memory-less transfer characteristics yields the Gray code binary representation of the input voltage 520 under test.

An improvement was suggested by Jalali and Xie [11] eliminating the binary scaling of the MZ electrodes by incorporating an analog coding technique. This scheme is susceptible to noise from extreme values of the input, and it relies on the ability to accurately bias multiple MZ modulators to certain operating points, and the number of MZ required is $2^{\wedge}(b-2)+1$, with b the resolution in bits. We mention in particular these modulator-array based schemes (and there are many other variations based on the same underlying principles, as surveyed in [2]) since superficially they resemble what the embodiments of the current invention do. Both are based on electro-optic modulation and a relatively complex Programmable Logic Controller (PLC), but the principle of operation and ensuing qualities of the current invention are totally different.

Tsunoda and Goodman [12] proposed an approach to optical ADC based on matrix multiplication and acousto-optic beam deflection. Diverse photonic ADC system approaches, are also described in some detail in [1-3].

Recently, there has been intensive work on time-stretching ADCs [1], which can sample ultra-high rate signals but require extremely complex and large extent optical setups, and have difficulty in digitizing continuous signals, but work best with burst signals.

There has recently been work on all-optical ADC and DAC [13,14], however at this point we deem those approaches as more futuristic, as we are aiming for electronic ADCs which are internally assisted by photonics.

Notice that Valley's survey does not cover all-optical ADCs (with the analog input digital output both photonic) which have been discussed in [13] and more recently in [14], however our current position is that all-photonic ADC is a more futuristic technology and we wish to focus on class (iv) photonic ADCs with electrical interfaces.

Notice that most of the PADC advances in the last 30 years have occurred in the field of photonic sampling, which has nicely progressed, however the photonic quantization approaches offered so far remain inadequate. Our comparison benchmark for the resulting performance of our novel class (iv) photonically sampled & quantized PADC, will then be provided by a "conventional" class (ii) photonically sampled (electronically quantized) PADC system.

For a review of the state-of-the-art of photonic ADC see Valley's 2007 review paper [1], surveying over 150 papers on photonic on photonic sampling and/or photonic quantization. See also [2,3] for earlier contributions.

REFERENCES

1. G. C. Valley, Photonic analog-to-digital converters, Opt. Express, Vol. 15, p. 1955 (2007) http://www.opticsinfobase.org/oe/abstrat.cfm?URI=oe-15-5-1955.
2. A. Kuver et. al., "Photonic Components for Analogue to Digital Converters," EMRS DTC Technical Conference, Edinburgh (2004).
3. B. L. Shoop, *Photonic Analog-to-Digital Conversion*, Springer, Berlin (2001).
4. R. H. Walden, Analog-to-digital converter survey and analysis, IEEE J. Sel. Areas Comm. Vol. 17 p. 539 (1999).
5. R. V. D. Plassche, *CMOS Integrated Analog-to-Digital and Digital-to-Analog Converters, $2^{nd}$ ed.*, Kluwer, 2003.
6. R. J. Baker, *CMOS Mixed-Signal Circuit Design, $2^{nd}$ ed.*, IEEE Press, 2009.
7. R. H. Walden, Analog-to-digital conversion in the early 21st century, In:Wiley Encyclopedia of Computer Science and Engineering, (edited by Benjamin Wah) Hoboken: John Wiley &Sons, Inc., Sep. 9, 2008.
8. IEEE Standard for Terminology and Test Methods for Analog-to-Digital Converters, IEEE Std 1241-2000, (2001)
9. B. Murmann, A/D Converter Trends: Power Dissipation, Scaling and Digitally Assisted Architectures, IEEE 2008 Custom Integrated Circuits Conference (CICC), (2008)
10. H. F. Taylor, Proc. IEEE 63, 10, 1524-1525 (1975).
11. B. Jalali and Y. M. Xie, Optics Letters, 20, 1901-1903 (1995).
12. Y. Tsunoda, J. W. Goodman, Applied Optics, 16, 10, pp. 2607-2609 (1977).
13. L Brzozowski and E. H. Sargent, "All-optical analog-to digital converters, hardlimiters and logic gates," J. Lightwave Technol. 19, 114-119 (2001).
14. A. Maruta and Shoichiro Oda, "Optical Signal Processing based on all-optical Analog-to-Digital Conversion," Optics and Photonics News, pp. 31-35, April 2008.
15. J. Klamkin, L. A. Johansson, A. Ramaswamy, N. Nunoya, S. Ristic, U. Krishnamachari, J. Chen, J. E. Bowers, S. P. DenBaars, L. A. Coldren, "*Highly Linear Integrated Coherent Receivers for Microwave Photonic Links.*" *Optical Fiber Communication (OFC) (invited)*, paper no. OMK4, San Diego, Calif., MARCH 2009
16. A. Feldster, Y. P. Shapira, M. Horowitz, A. Rosenthal, S. Zach and L. Singer, "Optical under-sampling and reconstruction of several bandwidth-limited signals," J. Lightwave Technol., (accepted for publication).
17. Digital background and blind calibration for clock skew error in time-interleaved analog-to-digital converters," Camarero, D.; Naviner, J.-F.; Loumeau, P.; Integrated Circuits and Systems Design, 2004. SBCCI 2004. 17th Symposium on 7-11 Sep. 2004 Page(s):228-232 http://ieeexplore.ieee.org/stamp/stamp.jsp?arumber=1360574&isnumber=29841
18. Blind equalization of time errors in a time-interleaved ADC system Elbornsson, J.; Custafsson, F.; Eklund, J.-E.; Signal Processing, IEEE Transactions on Volume 53, Issue 4, April 2005 Page(s):1413-1424 http/ieeexplore.ieee.org/stamp/stamp.jsp?arnumber=1408192&isnumber=30539
19. Y. Oh and B. Murmann, "System Embedded ADC Calibration for OFDM Receivers," IEEE Trans. on Circuits and Systems I, Vol. 53, No. 8, pp. 1693-1703, August 2006. http://ieeexplore.ieee.org/stamp/stamp.jsp?arnumber=01673639
20. D. Fu, K. C. Dyer, S. H. Lewis, and P. J. Hurst, "A digital background calibration technique for time-interleaved analog-to-digital converters, "IEEE J. Solid-State Circuits, vol. 33, no. 12, pp. 1904-1911, December 1998.
21. S. M. Jamal, D. Fu, N. C.-J. Chang, P. J. Hurst, and S. H. Lewis, "A 10-b 120-msample/s time-interleaved analog-to-digital converter with digital background calibration," IEEE J. Solid-State Circuits, vol. 37, no. 12, pp. 1618-1627, December 2002.

22. Huang, S., Levy, B. C., "Blind calibration of timing offsets for four-channel time-interleaved ADCs," IEEE Trans. Circuits and Systems I, vol. 54, no. 4, pp. 863-876, April 2007.
23. Huang, S., Levy, B. C., "Adaptive blind calibration of timing offset and gain mismatch for two-channel time-interleaved ADCs," IEEE Trans.Circuits and Systems I, vol. 53, no. 6, pp. 1278-1288, June 2006.
24. http/ieeexplore.ieee.org/Xplore/login.jsp?url=/ie15/4405666/4405667/044 05748.pdf?arnumber=4405748
25. http://ieeexplore.ieee.org/Xplore/defdeny.jsp?url=/stamp/stamp.jsp?tp=x&a rnumber=1693356&code=21
26. L. Kazovsky, S. Benedetto and A. Willner, *Optical Fiber Communication Systems*, Artech House, 1996.
27. Becker R. A. Becker, C. E. Woodward, F. J. Leonberger, and R. C. Williamson, "Wideband electrooptic guided-wave analog-to-digital converters," Proc. IEEE 72, 802-819 (1984)
28. M. Papuchon, C. Puech and A. Schnapper, "4-bits digitally driven integrated amplitude modulator for data processing", Electron. Lett., 16, pp. 142-144 (February 1980).
29. Y. Ehrlichman, O. Amrani and S. Ruschin, "Improved Digital-to-Analog Conversion using Multi-Electrode Mach-Zehnder Interferometer," J. Lightwave Technol., 26, pp. 3567-3575 (November 2008).
30. N. Satyan, W. Liang, A. Kewitsch, G. Rakuljic, and A. Yariv, "Coherent Power Combination of Semiconductor Lasers Using Optical Phase-Lock Loops" (Invited Paper), IEEE J. Selected Topics in Quantum Electronics, vol 15, pp. 240-247, 2009.
31. J. Kim, M. Park, M. H Perrott and F. X. Kartner "7-ENOB Resolution Photonic Analog-to-Digital Conversion of Narrowband Microwave Signals at 40 GHz," paper CMII1 OSA CLEO/QELS 2008.
32. B. Porat, A Course in Digital Signal Processing, John Wiley, 1997.
33. Nazarathy, M.; Sorin, W. V.; Baney, M. B; Newton, S. A., "Spectral analysis of optical mixing measurements," *J. Lightwave Technol.*, vol. 7, 1083-1096, (1989).

U.S. Pat. No. 6,525,682; to Yap Daniel, et al.; titled "Photonic parallel analog-to-digital converter" discloses a photonically sampled analog-to-digital converter using parallel channels of sampling and quantizing. The parallel combination achieves cancellation of the spurs that result from the nonlinear transfer function of the samplers. The samplers feed a dual-detector optoelectronic receiver that has differential inputs for suppression of laser intensity noise. The outputs of the multiple photonic samplers are averaged to reduce the effects of shot or thermal noise from the optoelectronic receiver of a sampler. The errors produced by the quantization process can be reduced by using a delta-sigma modulator-based analog-to-digital convertor as the quantizer which provides noise-spectrum shaping and filtering.

PCT application WO2007141598A2; to Sariel, Aviram; titled "Optical System With Coherent Feedback"; discloses a Coherent feedback linear optical measurement system for vector-vector multiplier has beam splitter with Mach-Zender interferometer and feedback loop that maintains minimal light intensity on light detector U.S. Pat. No. 6,700,517; to Kellar Kevin K; titled "Photonic analog-to-digital converter"; discloses a method of photonic analog-to-digital conversion including the steps of using an analog signal to modulate a laser, splitting the modulated optical output into 2N paths, attenuating the different paths along a gradient, then splitting each path again and recombining with an adjacent path in such a way that only one path has significant energy. An implementation architecture is also provided which includes a laser source, a modulator for modulating the laser source in accordance with an analog input signal, a first splitter section for splitting the modulated optical output into 2<N> paths, and for attenuating the different paths along a gradient, an interferometer section for splitting each path again and for recombining the signals in such a way that only one path has significant energy, and a decoder section for outputting a digital word corresponding to the analog input signal.

U.S. Pat. No. 6,7712,012; to Currie Marc; titled "Hybrid photonic analog to digital converter using superconducting electronics"; discloses a hybrid photonic analog-to-digital converter using superconducting electronics to achieve a high-speeds. This scheme differs from most current designs by combining two systems, photonic and superconducting, to utilize each system for optimal performance. The photonic system performs the optical sampling of the signal with very low aperture and jitter errors. This optically sampled data is then converted to an electronic signal via an optoelectronic switch and quantized in the superconducting system. The high-speed (>100 GHz) superconducting electronic system transforms the quantized signal into a binary output. This invention allows for analog-to-digital conversion at much higher speeds than available with current electronic analog-to-digital converters.

US application 20040799613; to Taylor Geoff, et al.; titled "Photonic digital-to-analog converter employing a plurality of heterojunction thyristor devices"; discloses a photonic digital-to-analog converter employing a plurality of heterojunction thyristor devices that are configured to convert a digital word encoded by a parallel digital optical signal (e.g., a plurality of synchronous optical bits) to an output analog electrical signal whose magnitude corresponds to the digital word. Each heterojunction thyristor device is configured to convert an optical bit in the digital word to a corresponding digital electrical signal. The voltage levels (e.g., magnitudes) of the ON state of the digital electrical signals produced by the heterojunction thyristor devices may be supplied by voltage divider networks coupled between the cathode terminal of the devices and ground potential or voltage reference sources coupled to the input terminals of the heterojunction thyristor devices. In this manner, electrical signals whose magnitude corresponds to contribution of each optical bit in the digital word are produced. These electrical signals are summed by a summing network to generate the output analog electrical signal corresponding to the digital word.

US application 20060979004; to Soderberg John J; titled "Photonic analog-to-digital converters using photonic crystals"; discloses a system and method for quantizing a photonic signal involves passing the photonic signal through a photonic crystal. The photonic crystal has localized defects for splitting the photonic signal into a plurality of quantized photonic components and for directing the quantized photonic components to a set of optical detectors. A digital conversion of the photonic signal can occur by performing a threshold comparison of the quantized components, either in the electrical domain through comparators or in the optical domain through optical limiters.

US application 20071593695; to Currie Marc Daniel, et al.; titled "Method and apparatus for photonic digital-to-analog conversion" discloses method and apparatus for receiving a digital signal having a plurality of significant bits of resolution. The apparatus includes a mode locked laser comprising a single output. The apparatus also includes a beam divider operable to receive the single output. The apparatus also includes a plurality of optical modulators operable to communicate with said beam divider and operable to receive a respective plurality of signals corresponding to a plurality of significant bits of resolution. Optionally, the apparatus also includes a source operable to output a digital waveform with the plurality of signals corresponding to the plurality of significant bits of resolution of the digital waveform, the plurality of signals operable to drive the plurality of optical modulators.

A review paper [1] published in OPTICS EXPRESS 1955/Vol. 15, No. 5/5 Mar. 2007; by George C. Valley; titled "Photonic analog-to-digital converters"; reviews over 30 years of work on photonic analog-to-digital-converters. The review is limited to systems in which the input is a radio-frequency (RF) signal in the electronic domain and the output is a digital version of that signal also in the electronic domain, and thus the review excludes photonic systems directed towards digitizing images or optical communication signals. The state of the art in electronic ADCs, basic properties of ADCs and properties of analog optical links, which are found in many photonic ADCs, are reviewed as background information for understanding photonic ADCs. The paper includes 152 references.

See also [2,3] for earlier contributions.

SUMMARY OF THE INVENTION

The current invention provides a novel Photonic ADC (PADC) schemes for sampling and quantizing an electrical voltage signal, internally enabled by photonics.

The coherent optical detection architectures for photonic quantization, are well differentiated from all previously published works, operating on principles never presented before, and attaining performance far exceeding that of purely electronic ADC systems, unattainable with previously proposed photonic sampling and/or quantization schemes.

As for electronic A/D conversion, notice that the ADC improvement trend has traditionally been slower than the Moore's law, and has recently been losing momentum, falling behind the Internet growth rate. Electronic ADCs are hard-pressed to cope with bandwidths exceeding a few GHz. We shall introduce multiple photonic ADC variants with successively improved performance levels, enabling systems able to digitally capture electronic signals with bandwidths ranging from 1 GHz to 100 GHz and beyond. The novel ultra-high speed photonic-enabled A/D conversion techniques will also impact, at the application level, the fields of wireless, satellite, radar and cable television and terrestrial broadcast transmission, as the ability to real-time digitize entire ultra-broadband (up to 100 GHz) RF/microwave spectra, regardless of their spectral structure, is highly sought in these domains, yet is currently non-feasible.

Compact and cost-effective cable television or satellite "head-ends in a box" or wireless "base-stations in a box" (the reception part), may be based on the broadband digitizer front-end, capturing the full band of frequency-stacked RF channels at once, followed by digital signal processing flexibly demuxing and detecting the individual channels, while saving hundreds of analog front-ends for the individual channels.

High performance test equipment (sampling oscilloscope) may be developed, with unprecedented bandwidth and resolution.

The disadvantages of the previous photonic quantization schemes are overcome by the new architecture. In terms of the resulting "black box" characteristics, sampling-rate vs. resolution tradeoff is much improved to performance regions inaccessible by conventional electronics. The system is made robust by the adaptive calibration techniques.

Universal applications radar, cable television, electronic and optical test equipment, ultra-high-speed optical communication, electronic warfare, and more. All of these fields would be keen on getting access to ADCs at tens of GHz (potentially even above 100 GHz) with unprecedented 6-15 bits (ENOB). This is a fundamental enabling technology that would immediately open up new applications.

The invention addresses the limitations and tradeoffs in high-performance analog-to-digital converters (ADC), substantially improving either the sampling rate or the number of effective bits or both. On the other hand, the ADC is a key building block in today's electronic technology, the performance of which must keep pace with the overall improvement curves (Moore's law and the like) but it does not. The analog and mixed-signal electronics is hard-pressed with delivering fast and faster ADCs with more and more bits, due to a combination of fundamental physical as well as technology limitations.

It is an aspect of the current invention to provide an ultra-high-speed optical ADC, the optical ADC comprising: an input receiving electrical input voltage; at least one laser source providing a train of short, equally spaced coherent light pulses; at least one phase modulator, modulating the phase of said light pulses in response to said input voltage; an optical front end comprising at least one optical channel, wherein each channel comprising an optical coupler interfering said phase modulated light with a reference light, creating a first and a second interference beams, wherein light intensities in said first and a second interference beams depends on relative phase of said phase modulated light and said reference light; at least one optical receiver receiving light from said optical channel, said receiver comprising: a first and a second photodiode detecting light from said first and a second interference beams producing a first and a second photocurrents indicative of intensity of said detected light; and an electronic comparator producing a binary signal indicative of the difference in said first and a second photocurrents; and an electronic encoding logic, creating a multi-bit result from a plurality of said binary signals.

It is another aspect of the current invention to provide a method of photonic analog-to-digital conversion having electrical analog input and electrical digital output, the method comprising: receiving electrical analog input test signal; generating a beam of coherent laser beam; phase modulating said coherent laser beam, thus linearly mapping said input signal into optical phase of said phase-modulated signal beam; generating at least a first phase-shifted reference beam coherent with said phase-modulated beam, and relatively phase shifted with respect to said phase-modulated beam by a first phase shift angle; interfering at least a portion of said phase-modulated signal beam with said first phase-shifted reference beam to generate a positive and a negative interference beams; and detecting said positive and a negative interference beams and generating a first electrical signal having Boolean value indicative of the sign of the phase difference between said phase-modulated beam and said first phase-shifted reference beam.

In some embodiments the method further comprising: generating a plurality of phase-shifted reference beams, each coherent with said phase-modulated beam, and each relatively phase shifted with respect to said phase-modulated beam by a orresponding one of phase shift angles; interfering a corresponding portion of said phase-modulated signal beam with each of said phase-shifted reference beams to generate corresponding positive and a negative interference beams; detecting said positive and a negative interference beams and generating a plurality of corresponding electrical signals having Boolean values indicative of the sign of the corresponding phase difference between said phase-modulated beam and said phase-shifted reference beams; and using said plurality of Boolean electrical signal to obtain multiple bits digital value indicative of the strength of said analog input test signal.

In some embodiments the plurality of corresponding phase shift angles are substantially evenly spaced; wherein said interfering corresponding beams; detecting said positive and a negative interference beam, generating said electrical signals, and generating said Boolean values are substantially performed in parallel; and
said using the plurality of Boolean electrical signal to obtain multiple bits digital value indicative of the strength of said analog input test signal is equivalent to performing flash-ADC of said electrical analog input test signal.

In some embodiments detecting said positive and a negative interference beams and generating an electrical signal having Boolean value indicative of the sign of the phase difference between said phase-modulated beam and said first phase-shifted reference beam comprises: converting said positive and a negative interference beams to positive and a negative electrical signal respectively using positive and a negative photodiodes respectively; and comparing said positive and a negative electrical signals.

In some embodiments comparing said positive and a negative electrical signals comprises: subtracting photo-currents generated by said positive and a negative photodiodes and generating difference electrical signal; and testing the sign of said difference electrical signal.

In some embodiments interfering a portion of said phase-modulated beam with said phase-shifted reference beam comprises using an optical directional coupler with splitting ratio substantially equal to 50/50

In some embodiments generating phase-shifted reference beam further comprising phase-modulating said reference beam by phase proportional to, but opposite to the modulation of said signal beam, In some embodiments the signal beam comprises a train of short optical pulses.

In some embodiments the reference beam comprises a train of short optical pulses.

It is yet another aspect of the current invention to provid an opto-electronic Successive Approximation Register (SAR) type ADC, the ADC comprising: an input receiving electrical input voltage; a laser source providing coherent laser beam; a beam splitter splitting said coherent laser beam to a signal beam and reference beam; at least a first input phase modulator, modulating the phase of said signal beam in response to said input voltage; at least a first feedback phase modulator, modulating the phase of said reference beam in response to a feedback voltage; at least one interferometer, interfering said signal beam and said reference beam and generating a positive and a negative interference beams; at least one channel, detecting said positive and a negative interference beams and generating an electrical signal having Boolean value indicative of the sign of the corresponding phase difference between said signal beam and said reference beam; and SAR logic unit, using said Boolean electrical signal to provide feedback voltage to said feedback phase modulator, and to obtain multiple bits digital value indicative of the strength of said analog input test signal.

In some embodiments the ADC is further comprising a second input phase modulator, modulating phase of said reference beam in response to said input voltage but oppositely to phase shift of said first input phase modulator.

In some embodiments the ADC is further comprising a second feedback phase modulator, modulating phase of said signal beam in response to said feedback voltage but oppositely to phase shift of said first feedback phase modulator.

In some embodiments the feedback phase modulator comprises: a first electrode having a first length; and a second electrode having a length substantially twice the length of said first electrode.

In some embodiments the feedback voltage is provided by a plurality of 1-bit DACs. In some embodiments the feedback phase modulator is capable of producing phase shifts substantially equal to:

$$C \times \sum_{I=0}^{N} B_i \times 2^i$$

wherein C is an arbitrary coefficient, $B_i$ are Boolean values equal to either zero or one, and N is the number of successive approximation steps associated with said feedback phase modulator.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. In case of conflict, the patent specification, including definitions, will control. In addition, the materials, methods, and examples are illustrative only and not intended to be limiting.

BRIEF DESCRIPTION OF THE DRAWINGS

The invention is herein described, by way of example only, with reference to the accompanying drawings. With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

In the drawings:

FIG. 1 schematically depicts a block diagram of a generic flash ADC as known in the art.

FIG. 2(a,b) schematically depicts the first two steps of SAR process for b=2 case (two bits ADC) as known in the art.

FIG. 3 schematically depicts a block diagram 140 of a Pipelining ADC as known in the art.

FIGS. 4A-4E schematically depicts a block diagrams five exemplary variations of Sigma-Delta ADC as known in the art.

FIG. 5 shows some details of a photonic ADC system which is one of the earliest systems that were developed by Taylor in 1975 as known in the art.

DESCRIPTION OF THE PREFERRED EMBODIMENTS

Figure 6B:
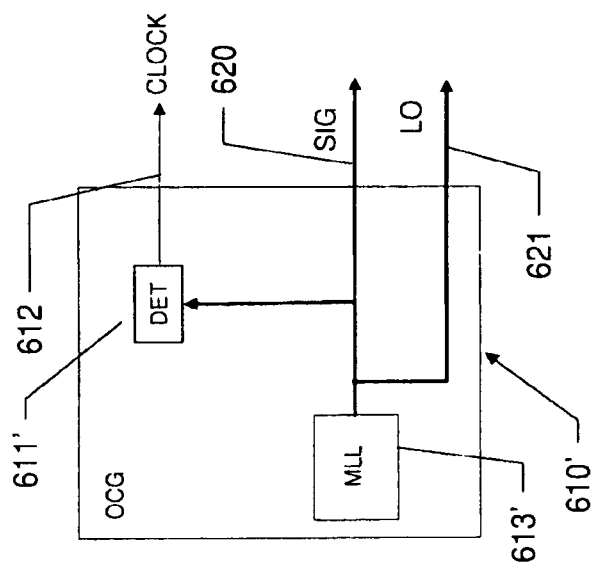
FIGS. 6A-6B schematically depicts an OCG according to an exemplary embodiment of the current invention.

Before explaining at least one embodiment of the invention in detail, it is to be understood that the invention is not necessarily limited in its application to the details set forth in the following description or exemplified by the Examples. The invention is capable of other embodiments or of being practiced or carried out in various ways.

The terms "comprises", "comprising", "includes", "including", and "having" together with their conjugates mean "including but not limited to."

The term "consisting of" has the same meaning as "including and limited to."

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible sub-ranges as well as individual numerical values within that range.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination or as suitable in any other described embodiment of the invention. Certain features described in the context of various embodiments are not to be considered essential features of those embodiments, unless the embodiment is inoperative without those elements.

In discussion of the various figures described herein below, like numbers refer to like parts. The drawings are generally not to scale. For clarity, non-essential elements were omitted from some of the drawing.

Ultra-High-Speed Flash Photonic ADC System
Phase Modulation—Key Inventive Element Unlike the previous photonic ADC schemes known in the art, which are based on converting the RF input signal under test into the optical intensity domain via electro-optic amplitude (intensity) modulation, in exemplary embodiments of the current invention, the RF input signal under test is linearly mapped into optical phase rather than into optical amplitude, entirely eliminating the amplitude-distortion-related non-linear impairments plaguing previous photonic ADC schemes. Unfortunately for conventional PADC schemes, the interference of phase modulated beams inherently generates amplitude distortion (a non-linear sine-like transfer characteristic). Our use of phase modulation is a novel inventive element providing an essential advantage:

The electrical-voltage to optical phase mapping practically becomes a perfectly linear process, unlike the sine-like characteristic of a Mach-Zehnder (MZ) amplitude modulator—in fact MZ amplitude modulation is itself indirectly based on phase modulation, yet we have managed to avoid that non-linearity, by means of the key inventive step of thresholding in the phase-domain. Despite the fact that we also use interferometric processing, we manage to avoid the non-linear transfer characteristic in our scheme: the key to achieving linear quantizing action is detect the events of the phase (linearly modulated by the voltage under test) crossing certain thresholds in the polar domain.

By coherently subtracting out a set of reference values corresponding to the quantization thresholds (transition levels) we effectively "zoom-in", in the phase domain, around each ADC transition level, as opposed to conventional photonic quantizers, wherein the full extent of the dynamic range of the signal is mapped, with distortion, onto the $2^b$ levels of the signal. Hence in our scheme we attain both high linearity, and better shot-noise limited sensitivity, i.e. the required optical SNR in our scheme may be substantially lower.

Linearly converting electronic signals to the optical phase domain is critical to the effectiveness of the proposed scheme, enabling to capitalize on key strengths of optical signal processing namely the ability to linearly generate phases and interferometrically compare them, while maintaining robustness in the wake of amplitude variations and distortions—a quality not possessed by previously proposed photonic ADC schemes which were amplitude-modulation based, using interference as a means to modulate the amplitude, unfit to exploit the linearity of the phase. Notice that linear phase modulation has previously been used in RF photonics for analog signal transport [15], but has never previously applied to analog to digital conversion.

The modulated optical phase, referred to as "the optical phase under test" is given by: $\phi(t)=\pi v_{UT}(t)/V_\pi$, with $V_\pi$ the voltage required to generate a phase shift of $\pi$. Notice that the Full Scale range (FS) in the phase-domain is FS=$2\pi$ (a full cycle around the unit circle in the complex plane, mapping into one wavelength of optical path difference). Hence, the drive voltage should be limited to $[-V_\pi,+V_\pi]$ in order to avoid phase wrap-around (amounting to ADC overflow), implying that a practical system may preferably be equipped with Automatic-Gain-Control, to limit the voltage, but on the other hand, the applied voltage $v_{UT}(t)$ should be amplified to occupy nearly the full peak-to-peak scale$\pm V_\pi$ of the phase modulator, in order to avoid degrading the Signal to Quantization Noise Ratio (SQNR).

The first disclosed embodiment of system of Electronic-Optics-Electronic (EOE) PADC architecture according to an aspect of the current invention consists of ultra-high-speed A/D converters of the flash type, wherein the optical phase under test (defined as the voltage scaled by the conversion factor $\pi/V_\pi$) is simultaneously compared against multiple thresholds by means of a novel linear coherent Interferometric Front-End (IFE), with its photo-detected balanced output ports terminated in electronic 1-bit ADCs, as illustrated in FIG. 6.

Optical Sampling

The inventive ADC system is driven by an optical sampling train generator 610, referred to as the Optical Comb Generator (OCG). Optical sampling is an evolving art which has been addressed by many researchers [1-3]. The main advantage of using an OCG for optical sampling is the ultra-low jitter of the optical pulses—much lower than the 0.5 ps jitter which is roughly the lowest pulse jitter attainable electronically. In contrast, OCGs based on Mode Locked Lasers (MLLs) may attain 1-2 orders of magnitude lower jitter, down to a few tens of fsec or a few fsec. Our contribution is not in the optical sampling per se, but rather in the novel photonic quantizing (which nevertheless presumes optical sampling).

In our invention we capitalize on proven strength of photonic ADC techniques in sampling, combining it with novel innovative photonic quantization structures, replacing (non-linear) intensity modulation by (linear) phase modulation, introducing novel coherent interferometric techniques in the phase domain in order to achieve photonic quantization. Our novel system is then of the photonic-sampling-and-quantizing type, according to Valley's classification of photonic ADCs, with the main novelty in the phase-domain coherent quantizing scheme, but with the photonic sampling more conventional character intricately intertwined with the quantizing operation.

Our system's front-end may comprise an OCG optical source 610. Typically implemented using a Mode-Locked-Laser (MLL).

An alternative OCG technology, which we may also potentially use, is based on electronic pulse generation followed by electro-absorption modulation EAM, e.g. as described in [16].

Figure 6A:
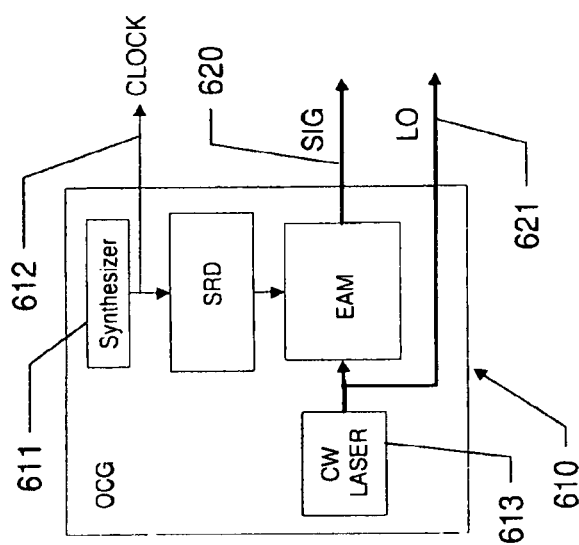

FIG. 6A schematically depicts an OCG 610 according to an exemplary embodiment of the current invention.

A frequency synthesizer 611 generates a train of pulses that may be used as clock signal 612, and drives a Step Recovery Diode (SRD) which generates for each clock pulse a very short electric impulse that drives an Electro-Absorption Modulator (EAM).

Light from Continues wave (CW) laser 613 is optionally split in two and is modulated by the EAM to form a train of very short optical pulses at the signal (SIG) output 620. Optionally, un-modulated branch of the CW laser light may be used as optional optical reference, termed also as Local Oscillator (LO) 621, in analogy to RF coherent detection terminology.

FIG. 6(*ii*) schematically depicts an OCG 610' according to another exemplary embodiment of the current invention.

A Mode Locked Laser (MLL) 613' generates a train of short pulses that may be used as signal 620. A detector (DET) recovers clock signals 612 from the optical pulses.

Our usage of the OCG then capitalizes on conventional photonic advantages usually featuring in photonic-sampling ADCs, namely the low optical jitter and the ability to decouple the electronic signal under test from the (optical) sampling comb (bringing them in interaction just in an optical modulator). Again, the uniqueness of our scheme is not the optical sampling but rather in its novel introduction of coherent interferometric techniques in the phase domain in order to achieve photonic quantization.

Flash PADC System Overview

Modulation Section.

Figure 6C:
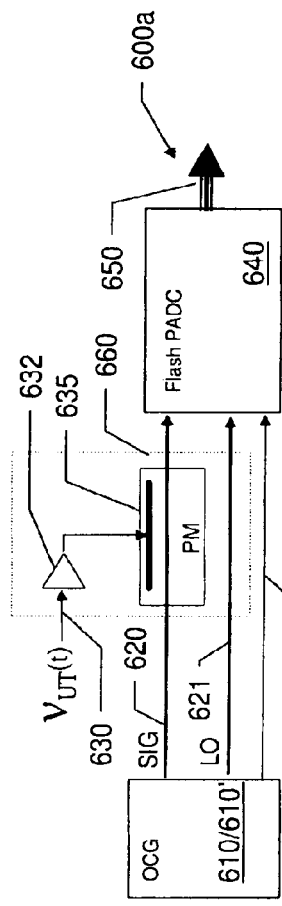
FIG. 6C depicts a PADC system using single end modulation scheme according to an exemplary embodiment of the current invention.
Figure 6D:
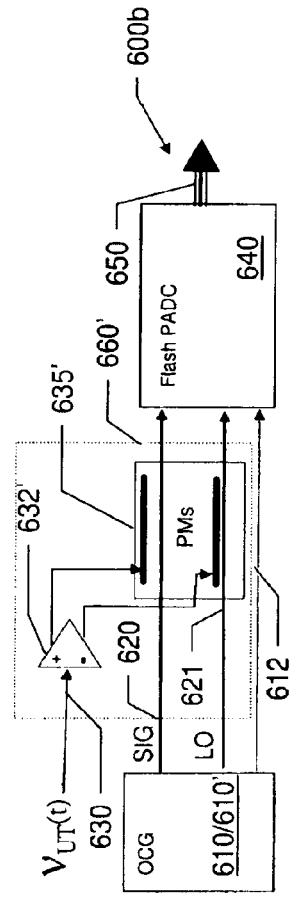
FIG. 6D depicts a PADC system using push-pull modulation scheme according to another exemplary embodiment of the current invention.
Figure 6E:
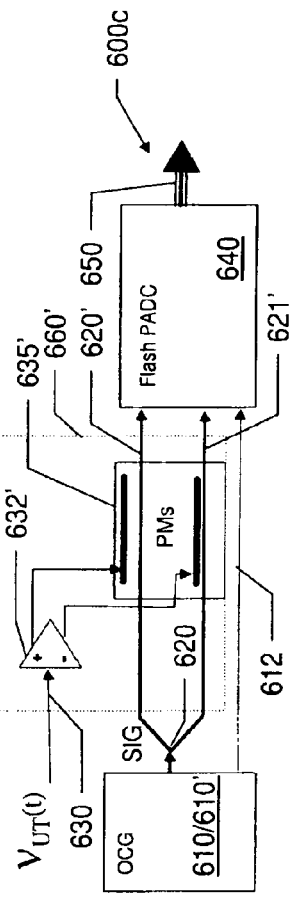
FIG. 6E depicts a PADC system using push-pull modulation scheme according to yet another exemplary embodiment of the current invention.

FIGS. 6C, 6D and 6E, schematically depicts block diagrams of PADC systems 600*a*, 600*b* and 600*c* respectively, showing the different modulation subsystems according to exemplary embodiments of the current invention.

FIG. 6C depicts a PADC system 600*a*, using single end modulation scheme 660 according to an exemplary embodiment of the current invention.

Signal light (SIG) 620, reference light (LO) 621 and clock pulses 612 are supplied by OCG 610 or 610'.

RF input signal ($v_{UT}(t)$) 630 is amplified 632 and used for driving Phase Modulator PM 635 which modulates the phase of the light in SIG channel 620. Reference light LO 621 is un-modulated.

Phase modulated SIG channel 620, reference light LO channel 621 and clock signal 612 are fed into flash PADC 640 which generates multi-bit ADC digital result 650.

Preferably, digital results 650 are generated for each time the input 630 is sampled by a light pulse generated by the OCG.

FIG. 6D depicts a PADC system 600*b*, using push-pull modulation scheme 660' according to another exemplary embodiment of the current invention.

In contrast to system 600*a*, the RF input signal ($v_{UT}(t)$) 630 is amplified 632' by a push-pull amplifier having a positive and negative outputs. The two opposing outputs are used for driving the Push-Pull Phase Modulator PMs 635' which modulates the phase of the light in SIG channel 620 and reference light LO 621 in positive and negative phases respectively.

FIG. 6E depicts a PADC system 600*c*, using push-pull modulation scheme 660' according to yet another exemplary embodiment of the current invention.

In contrast to system 600*b*, signal light SIG 620 is split to two branches 620' and 621' which are phase modulated in positive and negative phases respectively in the push-pull MPs modulator 635'

There are at least three alternative implementations of our flash photonic ADC system. In all systems the optical comb is applied to one or two Phase Modulators (PM), with modulating electrode(s) driven by the RF signal under test $v_{UT}(t)$. Two of the schemes (FIG. 6C and FIG. 6D use an un-modulated optical source as Local Oscillator (LO), with this source assumed coherent with the modulated optical pulse train (hence these variants are suitable with EAM-based OPGs, as described above). As explained above, phase modulation is a critical step, linearly mapping the analog RF signal into the optical phase domain, essentially gaining substantial linearity and the ability to perform interferometric processing. As will be seen in FIG. 7, the phase-modulated optical comb emerging from the phase modulator is input into one optical port of the Interferometric Front End (IFE). The other optical port of the IFE is fed by an optical signal split off from the CW laser feeding the OCG, which acts as an optical Local Oscillator (LO) for the purposes of coherent detection (FIG. 6C).

In the version of FIG. 6D, two phase modulators, acting in a push-pull mode are used, in effect phase modulating the lower arm signal out-of-phase relative to the modulation imparted to the upper arm signal. The optical comb is fed into the pair of Phase Modulators (PMs), with modulating electrodes driven in anti-phase by the RF signal under test, $v_{UT}(t)$. Notice that the effective $V_\pi$ voltage of a push-pull PMs configuration (FIGS. 6D and 6E) is a factor of two more favorable (half the needed voltage) than that for a single-ended PM arrangement (FIG. 6C), indicating that push-pull configurations is to be preferred.

In another embodiment, which is actually the preferred one (FIGS. 6E and 7), the two optical feeds of the two PMs of the push-pull phase modulator may consist of two replicas of the optical comb. Here again we use a compact integrated optical implementation of the push-pull modulator. Here, as well as in FIG. 6D, the push-pull phase modulator may be constructed as an integrated optic circuit consisting of two phase modulators in the two arms of a modified dual-drive Mach-Zehnder (MZ) modulator, with the optical splitter and the two phase modulators combined on the same PLC optical substrate. This just slightly differs from a conventional dual-drive MZ modulator in that the optical combiner (e.g. a directional coupler or Y-junction) conventionally terminating the dual-drive MZ, is replaced here by the IFE. However, unlike in a conventional MZ modulator, which also contains two phase modulators, the two phase modulators are not used here for amplitude modulation but rather for push-pull phase modulation while retaining linearity (whereas MZ amplitude modulation is nonlinear), as further clarified below.

The usage of a pair of phase modulators with push-pull electrical drive (i.e. two electrical signals 180 deg out of phase, as generated by a differential RF amplifier) has the advantage of doubling the signal-to-noise ratio, relative to the case that just one arm is modulated (e.g. FIG. 6C), while the other arm is fed by a CW LO. Moreover, better delay matching between the two arms is achieved in the push-pull scheme. The alternative implementation of FIG. 6C, uses just a single PM, while the other arm is un-modulated, essentially amounting to an optical local oscillator. That scheme may be simpler to comprehend, however it lacks the SNR advantage of the push-pull configuration of FIG. 7a. Notice that in both schemes the laser source phase-noise which is common-mode to both arms is essentially canceled out.

The pulses of the optical combs emerging from the two phase modulator arms then bear phase information linear in the amplitudes of each of the samples of the voltage under test, which impart antipodal phase modulations onto the corresponding pulses of the upper and lower optical combs.

Figure 7A:
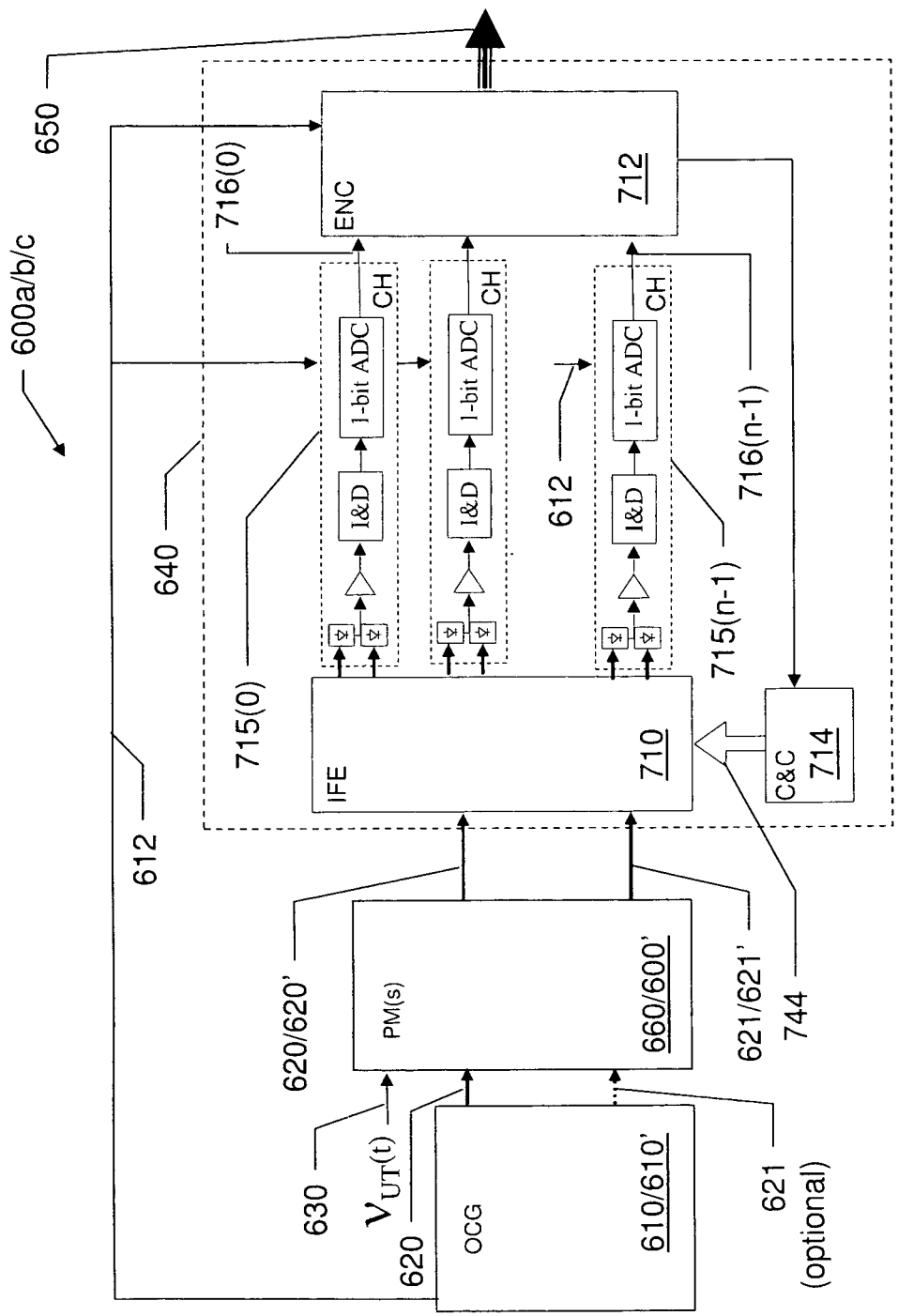
FIG. 7a schematically depicts a block diagram of a PADC system according to an exemplary embodiment of the current embodiment showing some more details of the flash PADC.

Notice that a single-ended phase modulation variant of FIG. 7a may also be conceived (but an explicit figure is not shown).

FIG. 7a schematically depicts a block diagram of a PADC system 600 according to an exemplary embodiment of the current embodiment showing some more details of flash PADC 640.

Interferometeric Front End IFE 710 of flash PADC 640 receives differentially phase modulated signals 620 and 612 (or 620' and 621'), and generates n pairs of differentially intensity modulated optical outputs, each is fed to a corresponding channel (CH) 716(0) to 716(*n*−1). Channels 715 and encoding logic (ENC) 712 are synchronized by clock line 612.

Encoding logic 712 encodes the 1-bit digital results 716(0) to 716(*n*−1) of channels 715(0) to 715(*n*−1) to produce a multi-bits results 650 corresponding to the value of input voltage 630. Encoding logic 712 further feeds back to IFE 710 via Control and Calibration (C&C) unit 714.

Figure 7B:
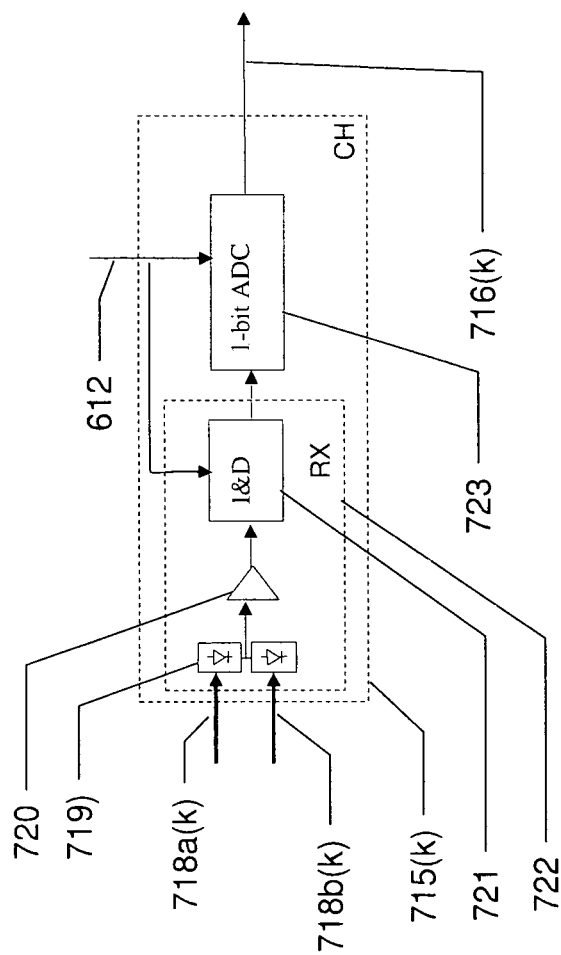
FIG. 7b schematically depicts a block diagram of one of the identical channels CH according to an exemplary embodiment of the current invention.

FIG. 7b schematically depicts a block diagram of one of the identical channels CH 715(*k*) according to an exemplary embodiment of the current invention.

CH 715(*k*) receives optical signals from the pair "k" of differentially intensity modulated optical outputs 718a(k) and 718b(k).

Optical signals 718a(k) and 718b(k) are directed, each to a corresponding photodiode of a two photodiodes in a Balanced Photo-Detector (BPD) pair 719 comprising two back-to-back diodes. The difference of the photocurrents of which is amplified 720 and fed to a Integrate and Dump (I&D) 721.

I&D 721 integrate the amplified signal from amplifier 720 and dump the integrated signal on command of clock 612 to the 1-bit ADC 723, which is in fact a sign (a slicer or zero crossing) comparator.

CH 715 may be viewed as a differential optical receiver RX 722 followed by a i-bit ADC 723 which generates a 1-bit digital result 716 depending on the relative intensity of inputs 718a and 718b.

Figure 7C:
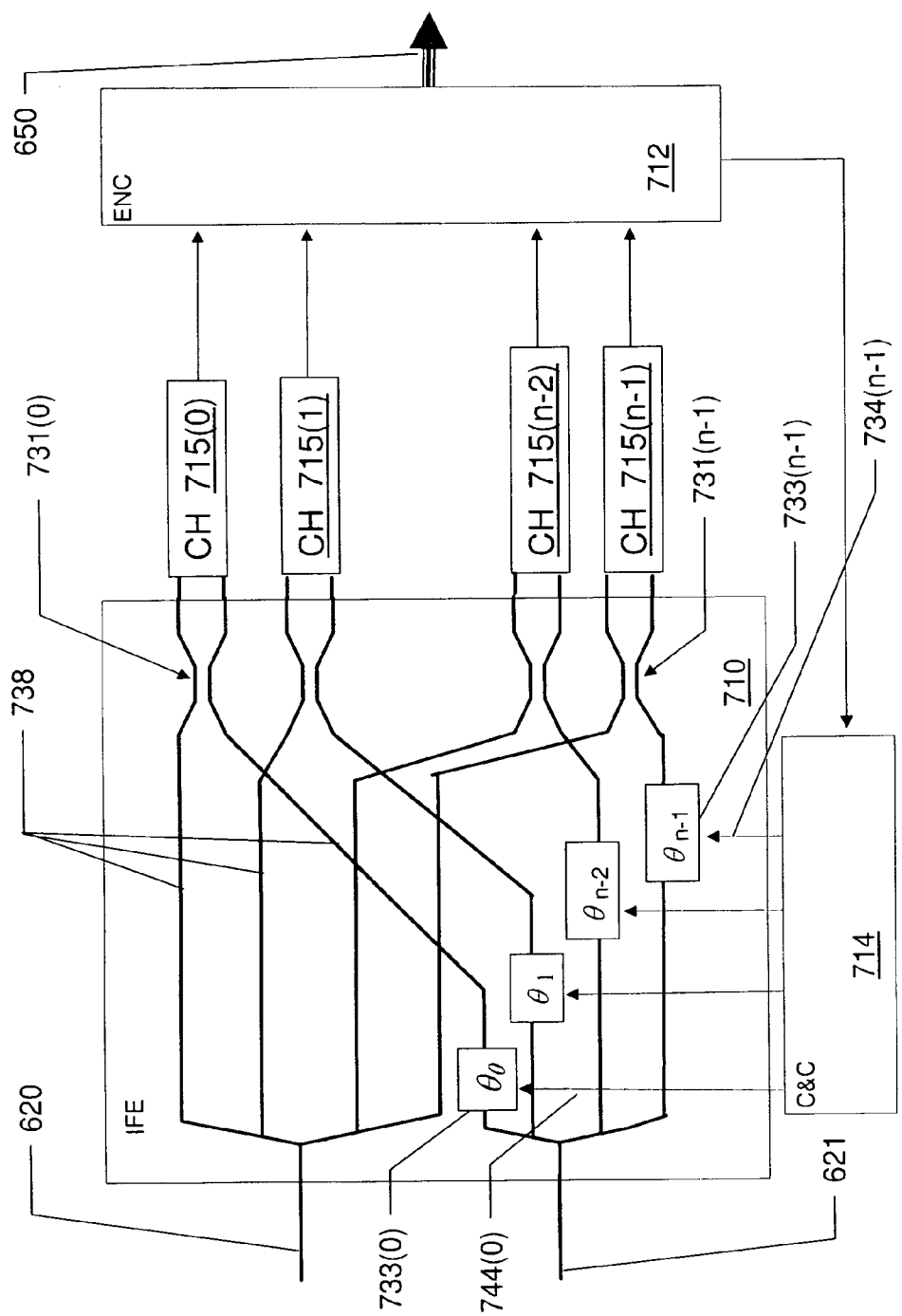
FIG. 7c schematically depicts some details of the IFE according to an exemplary embodiment of the current invention.

FIG. 7c schematically depicts some details of the IFE 710 according to an exemplary embodiment of the current invention.

The IFE, which is the 'heart' of the photonic quantization system is essentially realized as a novel coherent detection front-end (FIG. 7c), optically interfering in couplers 731(0) to 731(*n*−1), in parallel, multiple replicas of its two optical inputs 620 and 621, with various relative controlled phases $\phi_0$ to $\phi_{n-1}$ (733(0) to 733(*n*−1) corresponding to the equi-spaced ADC transition levels. Although physical construction of IFE 710 is not limited to specific manufacturing technology, light channels 738 are preferably single mode waveguides such as optical fibers or preferably wave-guiding structures created on a transparent substrate, for example by lithography or etching techniques.

The best way to describe the IFE operation is in terms of a fundamental building block, referred to here as phase comparator (PC). Let us detour into describing PC operation, prior to returning to the IFE, which is essentially an array of PCs making N phase comparisons in parallel, generating the flash ADC action.

Control and Calibration (C&C) unit 714 maintains accuracy of phase retardation elements 733(0) to 733(*n*−1) via the corresponding control lines 744(0) to 744(*n*−1), which are marked as heavy arrow 744 in FIG. 7a. This optional control may be used to adjust for manufacturing inaccuracies in phase retardation $\theta_0$ to $\theta_{n-1}$ or to negate drift of said retardation values.

Phase Comparator (PC)

Figure 8:
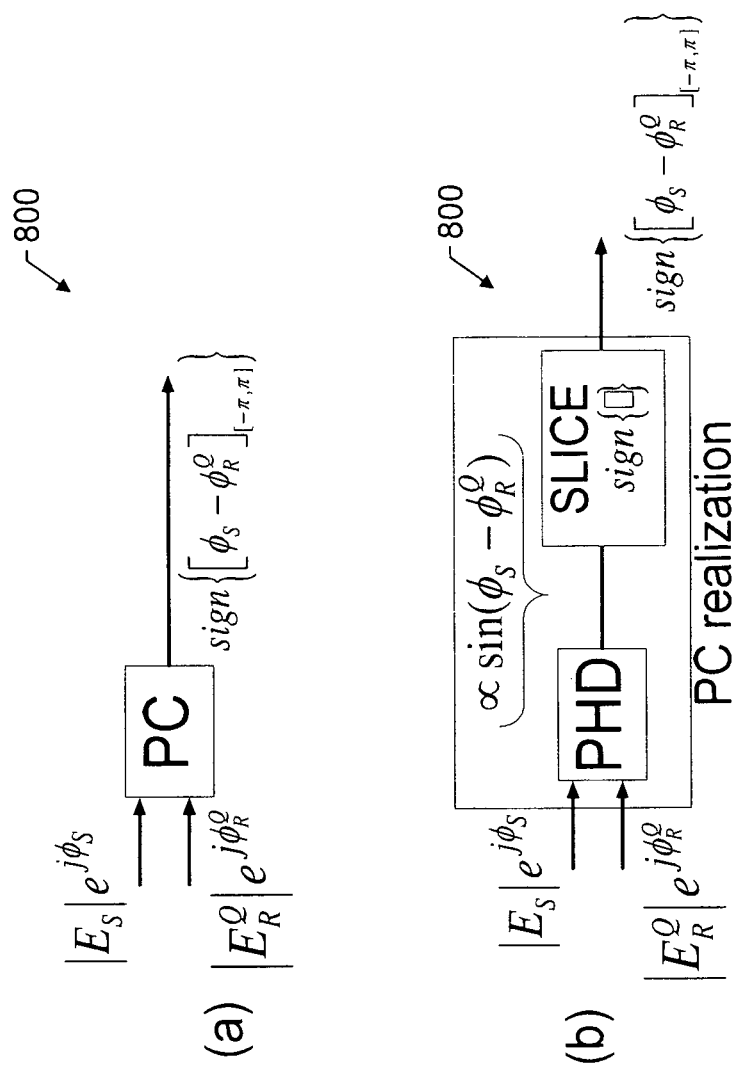
FIGS. 8(a-e) schematically depicts block diagrams and realizations of Phase Comparator (PC) according to exemplary embodiments of the current.
Figure 8:
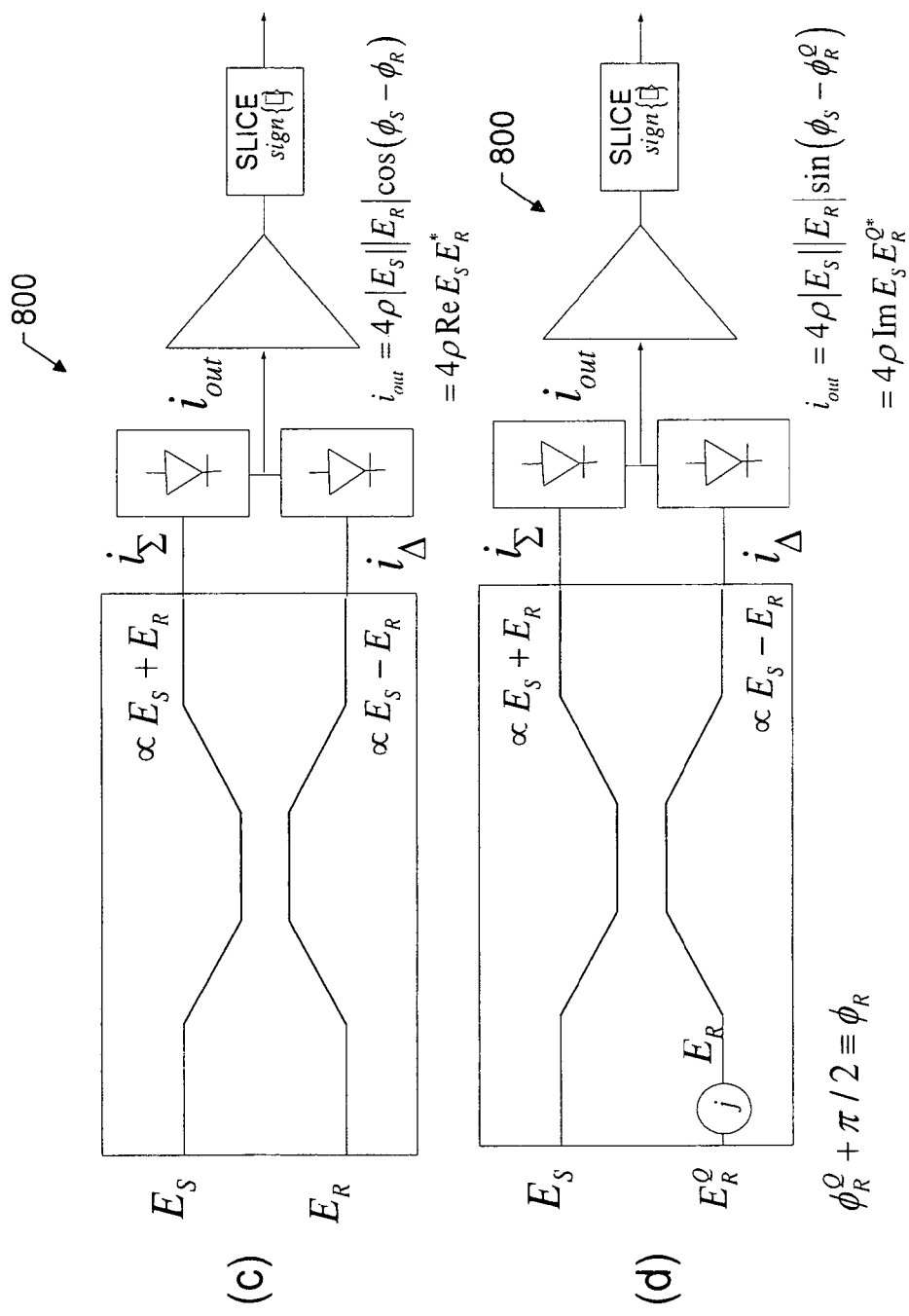
Figure 8:
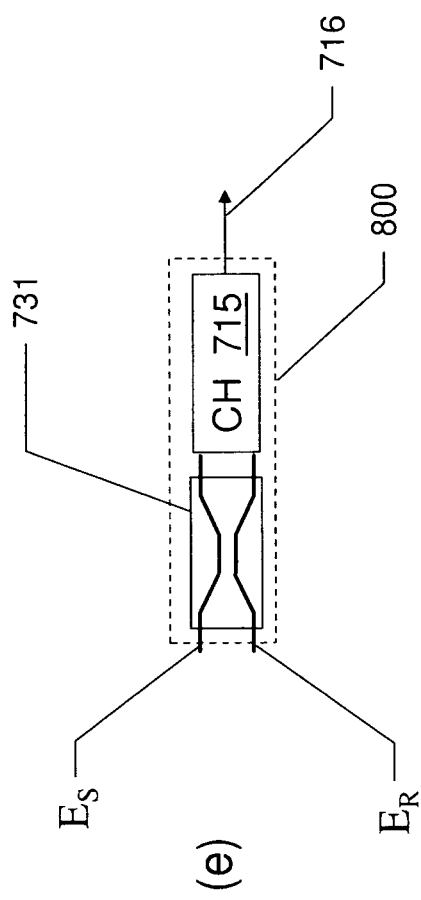

FIGS. 8(*a*) to 8(*c*) schematically depicts block diagrams and realizations of Phase Comparator (PC) 800 according to exemplary embodiments of the current invention and shows the mathematical notations and relations between the signals entering and exiting the PC.

We propose to adopt the PC as a basic interferometric building block of our photonic ADC approach (FIG. 8(*a*)).

The PC refers here to a generic opto-electronic device comparing two input optical phases (a signal phase under test $\phi_S$ vs. a reference phase $\phi_R$). The PC has two optical input ports, namely a signal port and a reference port, the optical phases of which are to be compared. Formally, we define the PC as a system which, in response to two optical inputs with phases $\phi_S, \phi_R \in [-\pi,\pi]$, produces an output PC=+/−1, with PC=+1 if $\phi_S > \phi_R$ and PC=−1 else if $\phi_S < \phi_R$ (we ignore the zero-probability case that $\phi = \phi_{ref}$). The PC transformation may be constructively expressed as PC=sign$\{[\phi_S - \phi_R]_{[-\pi,\pi]}\}$ where the subscript $[-\pi,\pi]$ indicates reduction modulo $2\pi$ to the interval $[-\pi,\pi]$. A PC may be formally described (FIG. 8(*b*)) as a PHase-Detector (PHD), (not to be confused with PD, namely photo-diode) electrically generating the difference $[\phi_S - \phi_R]_{[-\pi,\pi]}$ between phases of its two optical inputs, followed by a slicer (sign-detector, sign { }). The PHD need not be ideal in order to be used in the realization of a PC. In fact a sinusoidal PHD, K sin $[\phi_S - \phi_R]$ for some constant K>0, terminated in a slicer, also realizes a PC, since sign{K sin $[\phi_S - \phi_R]$}=sign{$[\phi_S - \phi_R]_{[-\pi,\pi]}$}

PHDs are typically used in Phase-Locked-Loops (PLL). However, our PADCs are open loop rather than closed loop system, which are not equivalent to PLLs, despite the PADCs comprising PHDs.

Again, the optical PHD is an opto-electronic system with two optical inputs and an electrical output, the polarity of which is indicative of the sign of the difference $\phi_S - \phi_R$ between the phases of the two optical inputs. Our preferred optical realization for a PHD consists of a 3 dB Optical Directional Coupler (ODC) followed by a balanced Photo-Detector (BPD) pair (FIGS. 8(*c*) and 8(*d*)), comprising two back-to-back diodes the difference of the photocurrents of which provides the PHD output. The PHD is completed to a full PC by linearly amplifying the PHD electrical output in an optical receiver front-end, and slicing it to generate a logic decision variable, indicative of the sign of the difference between the phases. Notice that ODC-BPD-RX-SLICER featuring in the PC is the same structure as used in Differential Phase-Shift Keying (DPSK) detection of DPSK in optical communication after the delay interferometer, however the context here is different, namely A/D conversion. Evidently, the devices referred to here as PHDs and PCs are well-known, and used in various optical fields for various applications, however their usage as key building blocks in PADC is novel. The PC principle of operation is interferometric: As is well known, interferometric techniques are used to measure the phase difference between two optical signals. In order to attain sensitive phase difference measurement (phase comparison) we must calibrate out the optical intensities of the individual beams, singling out the interference term between the two beams, and eliminating (or calibrating out) the direct intensity terms of the two individual beams. Hence, for our purposes it is most advantageous to use a balanced PC structure as described in FIG. 8(b). Although an interference term could be generated from a single linear combination (e.g. the sum) of two beams, we also generate the difference of the two beams (or more generally we generate two independent linear combinations), allowing us to cancel out the direct intensity (self-interference) terms of the two individual beams. Specifically, using a 3 dB ODC, we generate at its two output ports (up to a constant) the sum and difference of the two input field complex amplitudes:

$$E_\Sigma = E_S + E_R;\ E_\Delta = E_S - E_R \qquad (1)$$

The optical intensities at the two output ports, which get linearly mapped into the photocurrents of the two photo-diodes of the BPD, are then given by $i_\Sigma = \rho|E_S + E_R|^2$; $i_\Delta = \rho|E_S - E_R|^2$ where $\rho$ is the effective responsivity, also factoring in any coupling losses, splitting losses, combining losses, or optical attenuation along the path from the ODC input ports to the photo-detectors (for now we assume the effective responsivities associated with the two output ports to be equal; it turns out that the impairment resulting from imbalanced photo detectors may be calibrated out). The difference, $i_{out}$, between the two photocurrents $i_\Sigma, i_\Delta$ is then generated at the BPD output (the BPD output is also the PC electrical output):

$$\begin{aligned}
i_{out} &= i_\Sigma - i_\Delta \qquad (2)\\
&= \rho|E_S + E_R|^2 - \rho|E_S - E_R|^2\\
&= 4\rho \operatorname{Re} E_S E_R^*\\
&= 4\rho \operatorname{Re}\{|E_S|e^{j\phi_S}|E_R|e^{-j\phi_R}\}\\
&= 4\rho|E_S||E_R|\cos(\phi_S - \phi_R)
\end{aligned}$$

As seen in FIG. 8(d), it is convenient to build-in a 90° (quadrature, marked as "j") offset into the reference phase, setting $\phi_R \equiv \phi_R^q + \pi/2$, or conversely $\phi_R^Q \equiv \phi_R - \pi/2$, such that the last equation yields (with time-dependence now been explicitly indicated):

$$i_{out}(t) = 4\rho|E_S(t)||E_R(t)|\sin(\phi_S(t) - \phi_R^Q) \qquad (3)$$

As long as $|\phi_S - \phi_R^Q| < \pi$, the sine function maps a positive (negative) argument $\phi_S - \phi_R^Q$, into a positive (negative) value, respectively, formally expressed as sign{sin [x]}=sign{x}, $x \in [-\pi, \pi]$. Hence, we get either $i_{out} > 0$ or $i_{out} < 0$ according to the sign of $\Delta\phi \equiv \phi_S - \phi_R^Q$, which is the behavior expected of a comparator in the angular domain. Considering the values of $\phi_S, \phi_R^Q$ to be laid out on a circle, i.e. reduced modulo $2\pi$ to the interval $[-\pi, \pi]$, then when the given $\phi_S$ may be reached from $\phi_R^Q$ on the shortest path via CCW rotation, i.e. $0 < \phi_S - \phi_R^Q < \pi$, then $i_{out} > 0$, else when $\phi_S$ is reached from $\phi_R^Q$ on the shortest path via CW rotation i.e. $-\pi < \phi_S - \phi_R^Q < 0$, then $i_{out} < 0$. Hence, effectively due to the phase wraparound, the phase comparator with reference phase $\phi_R^Q$ sets up two angular thresholds (decision regions boundaries), $\phi_R^Q$ and its antipodal value $\phi_R^Q + \pi$. The PC then divides the $[-\pi, \pi]$ angular domain into two decision regions consisting of two half-circles as determined by the setting $\phi_R^Q$.

FIG. 8(e) schematically depicts another way to view PC 800 according to an exemplary embodiment of the current invention.

In this representation, PC 800 is viewed as a 3 OCD 731, followed by a CH 715.

IFE and Post-Detection Electronics Overview

The IFE realizes the block diagram of a flash ADC by using a collection of phase comparators, performing parallel comparisons of the signal under test against a set of transition levels. A key enabler for the scheme is having the comparisons coherently performed in the optical phase domain. E.g. in one variant of the system, described as a "one-sided system, with CW LOs" seen in FIG. 6A, the voltage under test modulates the phase of a sampled optical signal, yielding the "phase under test" which is coherently compared, in each of the PC modules, against the uniformly spaced phase of a set of reference optical signals (multiple optical LOs with phases evenly distributed around the half-circle $[0, \pi]$). The coherent interferometric interaction in each PC causes the phase of each LO to be subtracted from the phase of under test, hence each PC performs a single phase comparison. The phase under test is therefore quantized by performing N phase comparisons in parallel, corresponding to a flash ADC scheme. However, pulsed LO reference, as seen in FIGS. 6B and 6E may also be used.

In the preferred variant, referred to as the "push-pull" scheme, seen in FIGS. 6D and 6E, both the signal and reference signals into each PC are phase-modulated by the voltage under test, albeit in anti-phase (hence the name "push-pull"). In addition, static bias phases evenly distributed around the half-circle $[0, \pi]$ are added to the references ports of each PC (more precisely these phases are applied as relative differential phases between the two ports of each PC in excess of the signal-dependent phase which is modulated onto the signal port of each PC). This "push-pull" variant (e.g. FIG. 7a) is our preferred one, since its phase modulation efficiency is double that of the "one-sided" system, and there is no need to generate an LO optical signal distinct from the optical comb, but rather the optical comb is split to feed both modulators (which are modulated in anti-phase). Moreover, because of the symmetry of the modulating structure, the optical paths may be much better matched.

Figure 9:
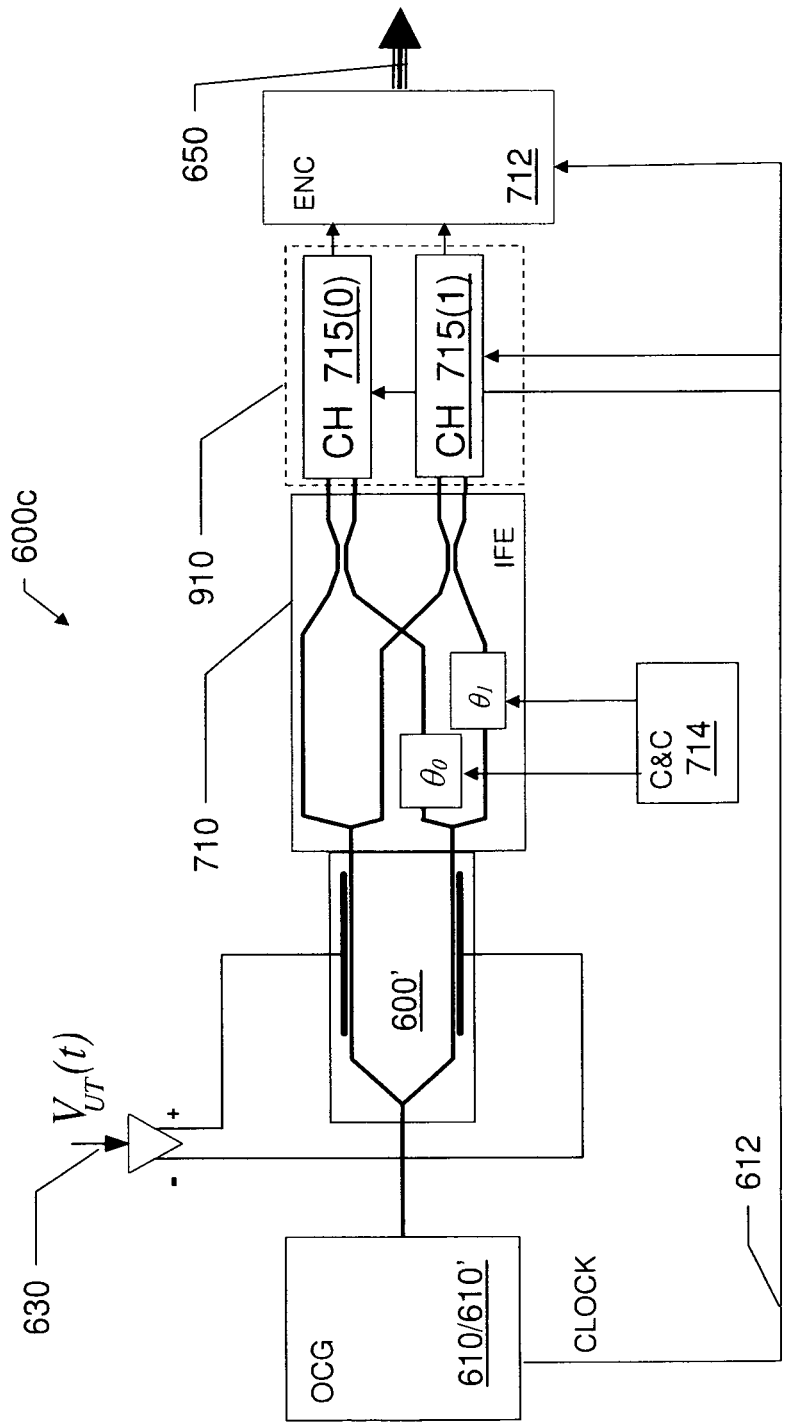
FIG. 9 schematically depicts an exemplary embodiment of Flash PADC system for the special case of 2-bits (4 levels).

FIG. 9 schematically depicts an exemplary embodiment of Flash PADC system 600c for the special case of 2-bits (4 levels).

The modulator 600' acts as the front half of a dual dive MZ modulator. The IFE 710 together with two PCs, CII 715 (schematically marked as Opto-Electronic Sign Detector (OESD) unit 910) amounts to I&Q detection.

Figure 10A:
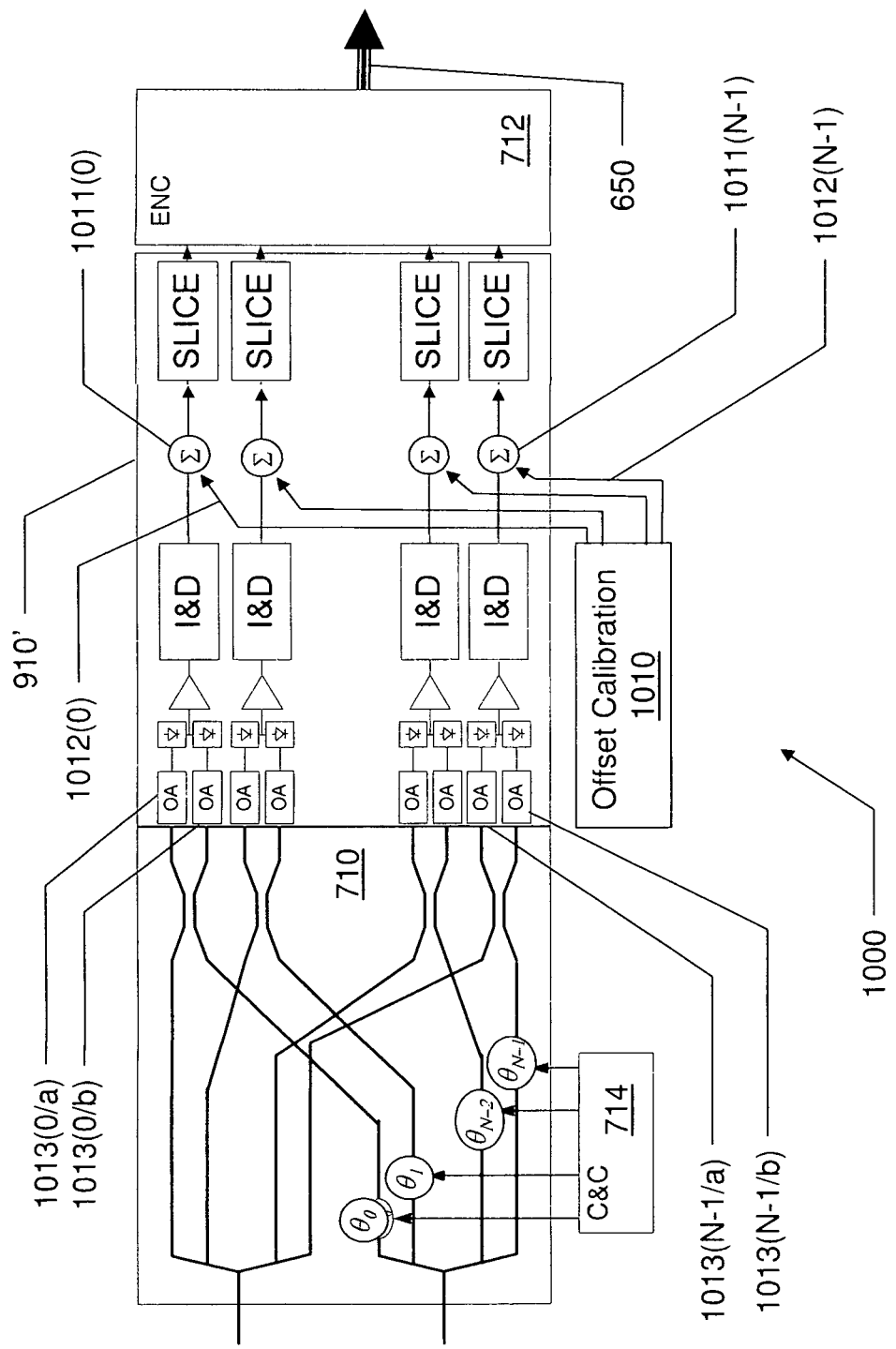
FIG. 10a describes additional elements of OESD according to an exemplary embodiment of the current invention.

FIG. 10a describes additional elements of OESD 910' according to an exemplary embodiment of the current invention.

For clarity, only four (0, 1, N-2 and N-1) of the N PADC levels are seen in this figure.

Optional Control and Calibration (C&C) unit 714 maintain accuracy of phase retardation elements retardation $\theta_0$ to $\theta_{N-1}$.

FIG. 10(a) also depicts an optional Offset Calibration unit 1010, providing offset calibration values to summing units Σ 1011(0) to 1011 (N-1) via lines 1012(0) to 1012(N-1) respectively. This optional offset calibration may be used for offsetting manufacturing inaccuracies or drifts of the system, for example electronic offsets (e.g. offsets of the I&Ds, SLICEs, amplifiers, imbalance of the photo-diodes), or optical imbalances (e.g. in the couplers or differences in the optical losses or gain of various components).

Additionally, FIG. 10(a) shows optional optical amplifiers OA 1013(0/a), 1013(0/b) to 1013(N−1/b). These optical amplifiers may be placed in the optical path between outputs of the couplers and the photodiodes, amplifying the optical signals before it converted to current).

For future use, we will refer to the combination of IEF 710, OESD 910, ENC 712, C&C 714 and 1010 as electro-optic unit 1000.

Figure 10B:
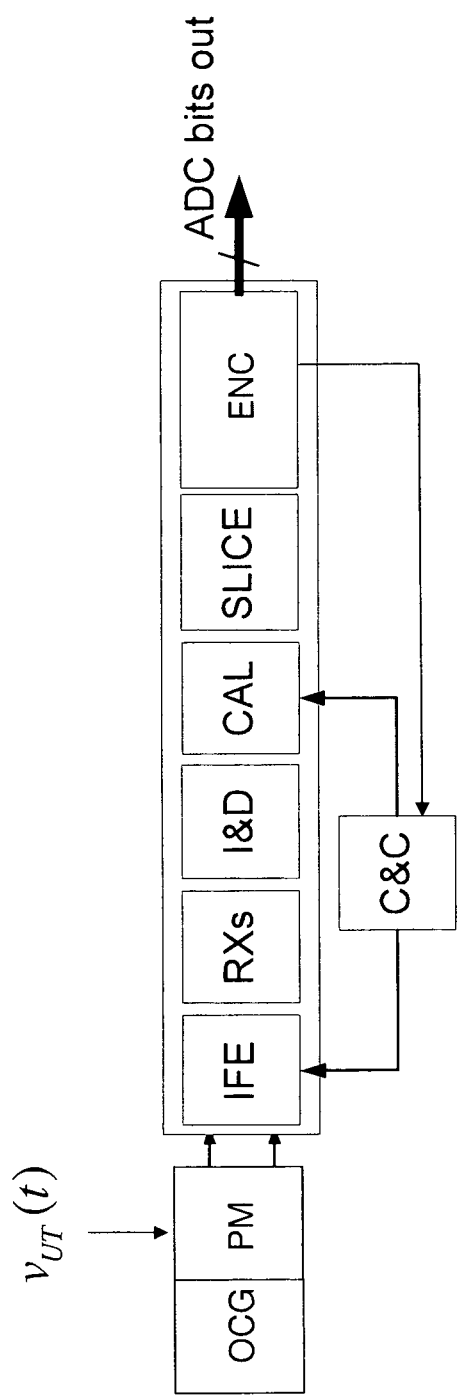
FIG. 10b schematically depicts a general block diagram of a flash PDAC according to an exemplary embodiment of the current invention.

FIG. 10b schematically depicts a general block diagram of a flash PDAC according to an exemplary embodiment of the current invention showing the functional blocks of: OCG, PM, IFE, and the array of channels, each with differential light receiver RXs (with optional OAs 1013), I&D, optional calibration CAL (Σ 1011) and SLICE, and the ENC and the C&C unit (which combines in the figure the function of offset calibration unit 1010).

Figure 11:
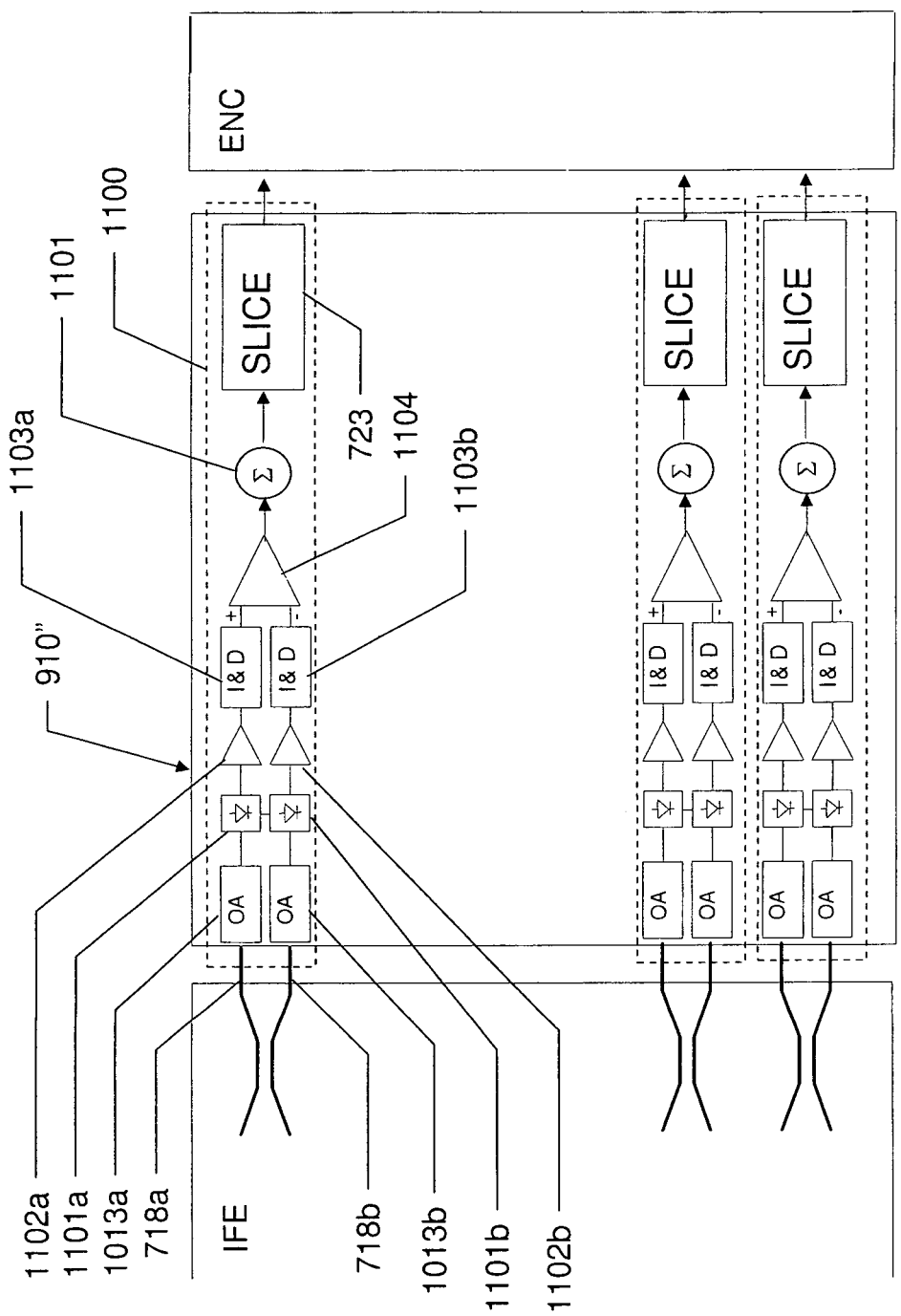
FIG. 11 schematically depicts a variation of the arrangements of the electronic components within a channel according to an exemplary embodiment of the current invention.

FIG. 11 schematically depicts a variation of the arrangements of the electronic components within a channel CH 1100 according to an exemplary embodiment of the current invention, For clarity, only relevant elements in one of the identical channels is marked and discussed.

In this variation, light from the two branches 718a and 718b are each amplified by the corresponding optical amplifies OA 1013a and 1013b and detected by separate photo-diode 1101a and 1101b respectively. Electrical signal from each photodiode 1101a and 101b are amplified 1102a and 1102b, and integrated in I&D 1103a and 1103b respectively. Amplified signals are subtracted at subtracting unit such as subtracting amplifier 1104. Optional offset calibration 1101 and SLICE 723 follows the as already seen. It is clear to see that mathematically this arrangement is equivalent to that seen in FIG. 10a.

The IFE block diagram for the push-pull system is shown in FIGS. 6D and 6E and further detailed in FIGS. 9, 10 and 11. The two modulated optical combs emerging out of the push-pull PMs 600', are input into the two optical input ports of the IFE, then each input port is split 1:N, feeding N PCs, each comparing the phase of its upper input with that of its lower reference input. The phase difference between the two arms of each PC is quasi-statically calibrated by equipping the split waveguides of the lower branch of the IFE (those providing the reference signals for each PC) with slow optical phase modulators, e.g. quasi-statically adjusting the phases either thermo-optically or electro-optically. These slow phase modulators in the lower branch of the IFE are set at equi-spaced angular threshold values corresponding to the lower half $[0,\pi]$ of the Full Scale (FS) range (the angular FS is $[0,2\pi]$): $\theta_Q^{(n)} = \theta^{(n)} + \pi/2$ with $\theta^{(n)} = n\Delta = 2\pi n/M$, $n=0, 2, \ldots$, N−1, in the case of an ADC with equi-spaced transition levels, where N=M/2 denotes half the number of levels $M=2^b$, b is the number of bits of resolution, and $\Delta = FS/M = 2\pi/2^b$ is the LSB size (Commanding ADCs with unevenly spaced levels transition levels $0^{(n)} \neq n\Delta$ are also possible). Remarkably, we only require N=M/2 threshold comparisons (with reference phases uniformly distributed over the interval $[0,\pi]$, rather than over the full angular range $[-\pi,\pi]$, as might have been expected. This factor-of-two saving in the number of comparisons stems from the fact that the second half of the ADC thresholds (angular transition levels) are automatically generated due to the phase wraparound, as discussed further below. The IFE then comprises N PHDs, each consisting of an ODC with the pair of ports originating from the ODC, being terminated in a BPD pair. The N BPDs feed N opto-electronic linear front-ends, e.g. based on the conventional Trans-Impedance Amplifier (TIA) (e.g. amplifier 720 of FIG. 7b) optical receiver design, or alternatively based on the high-impedance design (using equalization after the amplification to compensate for the front-end roll-off due to the high impedance). Assuming for definiteness a TIA-based design, the TIA output is applied to an Integrate & Dump (I&D) module (e.g. 721 of FIG. 7b). The integrated output of the I&D is applied to a sign-detector module (e.g. the 1-bit ADC or slicer 723 of FIG. 7b), essentially sampled and quantized to one bit, determining the sign of the sampled voltage at the I&D output, in each sampling interval of duration T, where $f_s = T^{-1}$ is the sampling rate.

This 1-bit ADC or slicer, performing the sign-detection, typically consists of a Track & Hold (T&H) module terminated in a limiting amplifier or latch structure, acting as a comparator, with the reference port of the comparator set to zero, such that the comparator effects the sign decision. The combination of the optical RX front-end, I&D and slicer (i.e. T&H and Comparator) is referred to as Opto-Electronic Sign Detector (OESD). Notice that some of the modules may be missing in the OESD, e.g. the T&H may be discarded if the output of the I&D rapidly settles to a steady-state value in the beginning of each sampling interval, providing steady voltage to the comparator stage towards the end of each sampling interval. It is also possible to design a more compact circuit for the OESD, e.g. combine the photo-diode, TIA, I&D and T&H stages in a single integrated design. To summarize, the top level block diagram of our preferred flash PADC system (FIG. 7a) consists of a battery of PHDs each terminated in an OESD, i.e. forming a PC, whereby all the PCs are fed in parallel by optical signals carrying the phase under test, further phase shifted by a multitude of reference signals uniformly spaced in phase over $[0,\pi]$. Each PC is used to perform one decision, comparing the phase under test against one specific value of the reference phase (one ADC transition level). As all threshold comparisons are performed in parallel, we attain flash-ADC operation.

A simple flash PADC with just two bits is exemplified in FIG. 9, amounting to I&Q detection akin to that in QPSK coherent detection.

Additional OESD elements are described in FIGS. 10,11. We may incorporate optical pre-amplification in the optical receivers, e.g. inserting waveguide SOAs or equivalent optical amplifiers ahead of each of the photo-diodes. It is desired to closely match the two paths associated with each PC, however if the pairs of paths remain unmatched it is possible to additively (or subtractively) offset the residual mismatch in the electronic domain by inserting a calibration (CAL) stage, somewhere in the electronic path, after the subtraction of the electrical signals in each pair of paths, to compensate for any imbalance of the two subtracted signals. The two FIGS. 10,11 differ in the order of some of the elements and in the possibility of interchanging I&D (integration) and subtraction, as shown.

Control & Calibration

The proposed scheme performs multiple phase comparisons in parallel, against prescribed reference phases, which nominally should be equally spaced over $[0,\pi]$. A potential issue might be the required phase stability of the quasi-static differential phase reference settings established between the two input ports of each PC. It is readily seen that the accuracy of these reference phases should be of the order of +/−a quarter of an LSB, i.e. of the order of $\lambda/2^{b+2}$ where b is the ADC number of bits, e.g. for b=5 bits we require the relative optical path difference for each PC to be maintained to less than 1% of a wavelength. This is well within the state of the art of active thermo-optic or electro-optic slow PM control. The "knobs" to set up the reference phases to this accuracy are then available, however the issue is supplying the correct signals to control these knobs. The quasi-static phase control signals are driven by a Control and Calibration (C&C) module, closed-loop-adjusting the quasi-static electrical control signals which set the relative phases of the upper and lower ports of each ODC. Closed-loop dithering schemes may be further used to actively monitor the phase differences between the two inputs of each ODC, by tapping off one or both of the ODC outputs, and using lock-in detection. Adaptive C&C procedures may be applied for tuning the quasi-static phases, critical for maintaining the system specs, distributing the angular thresholds, establishing the Differential and Integral Nonlinearities (DNL/INL) specifications for the ADC. To this end, calibration signals might be applied during "dead" periods, in typical applications involving the acquisition of pulsed analog waveforms. E.g. such calibration techniques in the context of non-photonic ADC were pursued in [17-25].

Notice that in the various figures of the disclosure we sometimes skip explicit indication of the C&C module but we always imply its existence, as small drifts of the optical characteristics over time and temperature are always present, hence there is a need to calibrate all phases. More generally the C&C module is also used to calibrate not only the quasi-static phase shifts in the IFE, but also the electrical offsets in the OESD (this is an additional role of the CAL stages in FIGS. 7*a*, 7*c*, 9, 10*a*, 10*b*, and 11).

Impairments

The deviations of the reference phases from their nominal positions provide an example of the multiple types of impairments which might affect the flash PADC system. It turns out that these impairments are either negligible, or are tolerable in terms of their impact on performance, or are amenable to calibration (e.g. deterministic offset and gain errors may be corrected by subtraction or amplitude scaling—gain or attenuation). Moreover, since the system operates in the optical phase domain, rather than in the optical amplitude domain, our flash PADC scheme is impervious to many of the amplitude-related impairments afflicting other photonic ADC quantization schemes. In particular, the precise splitting ratios and optical waveguide losses and their possible imbalances throughout the photonic circuit turn out to be either inconsequential or may be precisely calibrated out.

Another class of opto-electronic circuit parameters consists of those which do not automatically cancel out, under the "self-healing" principle, yet may be tuned to maximize the system specs. Usually, there are drifts and disturbances taking these parameters away from their optimal settings; the simultaneous handling of dozens of degrees of freedom poses a significant challenge.

We already stated that the proposed PADC schemes are inherently linear, our PADC linearity is not limited by the sinusoidal interferometric transfer characteristic, but is essentially set by the ability to adjust and stabilize multiple quasi-static phase-shifts (the quadrature settings of the effective MZMs) by means of slowly-varying control and calibration (C&C) procedures, adaptively actuated by either training sequences or by blind (decision-directed) equalization techniques. The C&C also ensures calibration (tuning out) of most residual impairments (those which are not automatically cancelled by the phase-based amplitude-insensitive operation in balanced mode), achieved by having the C&C module apply quasi-static controlled offsets in the electrical domain. The other C&C function is adjustment of the slowly varying control phase-shifts to ensure the system linearity. The success of the proposed PADC endeavor critically depends on providing means to simultaneously adjust the multiple quasi-static parameters of the system, mitigating environmental time-varying low-bandwidth disturbances, which tend to veer these parameters away from their optimal settings. Among the "knobs" to be adapted are the quasi-static phases determining the PADC thresholds, as well as various offsets and gains in the system, which may potentially correct for various first-order imbalances and in certain cases higher-order impairments, altogether setting the ultimate system specs: ENOB, linearity and bandwidth.

At the system level, our architectures will take advantage of modern adaptive signal processing and control techniques in order to adjust and control the slowly fluctuating parameters and minimize the residual impairments. The key enabler here is the smart application of slowly varying adaptive digital signal processing algorithms to assist the optimal high-frequency mixed-signal and opto-electronic operation. The proposed research will port to photonics a recent trend whereby digital control techniques are currently being introduced to improve the dynamic performance of electronic ADC (setting up electronic biases and gains by means of slow multi-bit DACs). In our case we shall also control the phase domain placing of thresholds, along with other specific observable and controllable opto-electronic parameters. We shall develop calibration (adaptation to training sequences) as well as blind adaptation techniques (decision-directed by the ADC output) in order to optimize the set of slowly-varying system parameters, using adaptive filtering and control algorithms to be conceived, investigated and refined under the program.

IFE Operation Modeling—from Phase to Photocurrent

The IFE operation boils down to working out the time-dependent operation of each PHD with a phase-modulated signal input and a properly set reference input Building on the PC analysis above, we model PHD operation when fed by phase-modulated optical pulse trains, while detailing the build-up of phase differences between the PHD inputs.

We denote by $\psi_S, \psi_R$ respectively the total quasi-static optical path lengths from the OCG output (the input to the 2-way splitter feeding the push-pull modulator), all the way to the pair of inputs of the n-th ODC, noting that these two phases are given by $$\psi_S = \psi_n^{+PM} + \psi_n^{+SPLT} + \psi_n^{+WG}; \quad \psi_R = \psi_n^{-PM} + \psi_n^{-SPLT} + \psi_n^{-WG} + \psi_n^{C\&C} + \pi/2; \quad (4)$$

where we introduced an extra 90° phase shift built into the R path, which must be provided either geometrically, by lengthening the R path by $\lambda/4$, or alternatively by means of the C&C quasi-static phase modulation control, adjusting $\psi_n^{C\&C}$ by an extra $\pi/2$ phase bias.

The quadrature shifted R path phase is then $$\psi_R^Q = \psi_R - \pi/2 = \psi_n^{-PM} + \psi_n^{-SPLT} + \psi_n^{-WG} + \psi_n^{C\&C} \quad (5)$$

where +/− designates the upper/lower paths, PM designate the broadband phase-modulators, SPLT is the N-way splitter, C&C is the quasi-static phase modulation applied in the lower path for calibration and control, (in excess of 90°) and WG designates the waveguides interconnecting the splitter with each of the PC arms. The controlled quasi-static phase difference between the two optical paths of the n-th PC is then $$\theta^{(n)} = \psi_R^Q - \psi_S = (\psi_n^{-PM} - \psi_n^{+PM}) + (\psi_n^{-SPLT} - \psi_n^{+SPLT}) + (\psi_n^{-WG} - \psi_n^{+WG}) + \psi_n^{C\&C} \quad (6)$$

The $\theta^{(n)}$ the phase differences accrued along the two paths from two outputs of the 2-way splitter following the OCG, then through the two PMs, then through the two N-way splitters, and through the connecting waveguides (including the quasi-static phase modulations applied by the C&C module in the lower paths). By means of electrical C&C control signals, any desired value in the range $[-\pi,\pi]$ may be set up for $\theta^{(n)}$, which is typically set to $\theta^{(n)}=2\pi n/M=n\Delta$, with $\Delta$ the LSB in the angular domain. E.g. if all paths are ideally matched (apart for the 90° quadrature bias which should always be maintained), then we simply set up $\psi_n^{C\&C}=n\Delta$, (then also $\theta^{(n)}=n\Delta$). As relative phase differences develop between the upper and lower paths, say due to differential thermal variations in the photonic circuit, then $\psi_n^{C\&C}$ must be adjusted to deviate from $n\Delta$, such as to cancel these variations, still maintaining the prescribed overall quasi-static phase difference at $\theta^{(n)}=n\Delta$. A treatment of the calibration and adaptive control procedures required to sense and control the values $\theta^{(n)}$, setting them to the desired levels, is outside the scope of the current description, however techniques similar to those used for parameters adjustment in conventional ADCs [17-25] may be applied.

The output photocurrent of the BPD is given by (3) (assuming the two paths to the two PDs are perfectly matched in length). Distinguishing between the two cases of single-ended phase modulation (un-modulated reference, i.e. CW LO, FIG. 6A) vs. push-pull modulation of the two inputs into the IFE (FIG. 6D), in the first mentioned case (constant IL)) we have $$\phi(t)=(\pi/V_\pi)v_{UT}(t)\equiv\phi(t)/2;\ \phi_R(t)=\theta^{(n)}+\pi/2;\ \phi_R^Q=\theta^{(n)}$$
$$\phi_S(t)-\phi_R(t)=\phi(t)/2-\theta^{(n)} \quad (7)$$

where we found it convenient to express the overall quasi-static phase difference between the two arms as $\theta^{(n)}+\pi/2$, singling out a 90° phase, which simplifies the description by converting the cosine function in Eq. (2) into a sine function, a condition referred to here as quadrature bias (this is similar to introducing a 90° bias between the two input phases into the phase detector of a PLL). In the second case (push-pull), which is our preferred embodiment, we have $$\phi_S(t)=(\pi/V_\pi)v_{UT}(t)\equiv\phi(t)/2;\ \phi_R(t)=-(\pi/V_\pi)v_{UT}(t)+\theta_n+\pi/2;\ \phi_R^Q=-(\pi/V_\pi)v_{UT}(t)+\theta^{(n)}\ \phi_S(t)-\phi_R^Q=\phi(t)-\theta^{(n)};$$
$$\phi(t)\equiv 2(\pi/V_\pi)v_{UT}(t) \quad (8)$$

where $\phi(t)\equiv 2(\pi/V_\pi)v_{UT}(t)$ is the "phase-under-test". Inspecting Eqs. (7), (8), it is apparent that the overall phase difference between the two arms of the n-th PC is given in the two respective single-ended (un-modulated LO) and push-pull modulation cases, by $$\phi_S(t)-\phi_R^Q(t)|_{single-ended}=\phi(t)/2-\theta^{(n)};\ \phi_S(t)-\phi_R^Q(t)|_{push-pull}=\phi(t)-\theta^{(n)}, \quad (9)$$

The only difference between the two cases is that the phase-under test is double in the push-pull case, relative to the single-ended case. Substituting into (3) the phase difference $\phi_S(t)-\phi_R^Q$ obtained above in the single-ended and push-pull cases, labeling the output photocurrent by n to indicate the n-th PC output (which is used for a comparison against the n-th ADC transition level), yields:

$$i^{(n)}(t)|_{single-ended}=4\rho|E_S(t)||E_R(t)|\sin(\phi(t)/2-\theta^{(n)}) \quad (10)$$

Similarly, substituting (8) into (3) yields the following expression for the photo-current of the n-th PC:

$$i^{(n)}(t)|_{push-pull}=4\rho|E_S(t)||E_R(t)|\sin(\phi(t)/2-\theta^{(n)})$$

where $E_S(t),E_R(t)$ are the complex amplitudes of the optical field at the PC input ports (coinciding with the ODC ports), and we recall that $\phi(t)$ is the "phase-under-test" (proportional to the voltage-under-test).

Notice that these expressions assume that we have infinite bandwidth ideal photo-detectors. The bandwidth limitation of practical detectors may still be treated, provided it is absorbed in the impulse response of the following TIA stage, as treated further below.

We also remark that the phase under test, $\phi(t)\equiv 2(\pi/V_\pi)v_{UT}(t)$, should be maintained in the range $[-\pi,\pi]$, i.e. using a push-pull configuration we must maintain, e.g. by means of an AGC, the condition, $v_{UT}(t)|_{push-pull}\in[-V_\pi/2,V_\pi/2]$, preventing phase wrap-around, but on the other hand, the voltage under test must be stretched to occupy the full angular domain, in order to maximize SNR. In the case of a one-sided (un-modulated LO) system, we must maintain $v_{UT}(t)|_{one-sided}\in[-V_\pi,V_\pi]$.

Assuming that the two paths leading to the two ODC inputs are matched up in delay (but not necessarily in optical loss) then the field magnitudes at the two input ports of the n-th PC are synchronized and discarding the delay, are both proportional to the OCG output field magnitude $|E_p(t)|$ (the OCG output coincides with the input of the 2-way splitter located ahead of the push-pull phase modulator):

$$|E_S(t)|=\sqrt{a_S}|E_p(t)|,\ |E_R(t)|=\sqrt{a_R}|E_p(t)| \quad (12)$$

where $a_S,a_R$ are the power attenuation factors from the OCG output to the two ports of the n-th PC (indexing by n is implied in these attenuation factors, as the attenuations to different PCs may differ, although in a well-designed photonic circuit we would make $a_S$, $a_R$ nearly equal to each other and nearly the same for all PCs). Substituting (12) into (11) and introducing, the optical power waveform of the OCG, $P(t)\equiv|E_p(t)|^2$, yields $$i^{(n)}(t)=4\rho\sqrt{a_S a_R}P(t)\sin[\phi(t)-\theta_n(t)]=4\ \bar{\rho}aP(t)\sin[\phi(t)-\theta_n(t)];\ \bar{a}\equiv\sqrt{a_S a_R} \quad (13)$$

where $\bar{a}$ is the geometric mean of the power attenuations $a_S$, $a_R$ in the two R and S paths.

Notice that $\phi(t)$ (the "phase under test") is essentially the waveform to be sampled and quantized, whereas the power waveform $P(t)>0$ describes an optical sampling comb. It is apparent that $i_n(t)$ bears all the information required to perform both quantization and sampling. Indeed, expressing the periodic optical power comb as $P(t)\equiv\Sigma_k p(t-kT)$, with $p(t)$ the optical pulse shape i.e. the waveform describing the instantaneous power over one period of the comb, (13) is expressed as $$i^{(n)}(t) = 4\rho\bar{a}\sum_k \sin[\phi(t)-\theta^{(n)}]p(t-kT) \quad (14)$$
$$\approx 4\rho\bar{a}\sum_k \sin[\phi(kT)-\theta^{(n)}]p(t-kT)$$
$$= \sum_k i_k^{(n)}(t)$$

where in the last expression we introduced a notation for the photo-current waveform of the n-th PC restricted over the k-th sampling interval:

$$i_k^{(n)}(t)=4\rho\bar{a}\sin[\phi(t)-\theta^{(n)}]p(t-kT)=\bar{i}\sin[\phi(t)-\theta^{(n)}]p(t-kT) \quad (15)$$

where we introduced the peak time-averaged photocurrent $\bar{i}\equiv 4\rho\bar{a}\bar{p}$, with $$\bar{p}\equiv\frac{1}{T}\int_0^T p(t)dt$$

the time-averaged optical pulse, such that the time-averaged photocurrent is expressed as $\overline{i_k^{(n)}(t)} = \bar{i} \sin(\phi(kT) - \theta^{(n)})$, which peaks up to the value $\bar{i}$ when the sine peaks up to unity.

We next set $\phi(t) \approx \phi(kT)$ in (15), assuming that the phase under test $\phi(t)$ is essentially constant over the ultra-short duration of the k-th optical sampling pulse $p(t-kT)$, which is in turn much smaller than the sampling interval, T. This amounts to the phase under test having a much narrower spectrum than that of the pulse-shape $p(t)$ of the optical sampling comb, indicative of ultra-fast optical sampling:

$$i_k^{(n)}(t) = \bar{i}\pi(t-kT)\sin(\phi(kT)-\theta^{(n)}) = s_k^{(n)}\bar{i}\pi(t-kT); \; s_k^{(n)} = \sin(\phi(kT)-\theta^{(n)}) \quad (16)$$

where we introduced a normalized version of the optical pulse shape $p(t)$, $\pi(t) \equiv p(t)/\bar{p}$, such that $\bar{\pi} = 1$, In an alternative derivation of the key results (14)-(16), the photocurrent difference at the PHD (BPD) output is worked out as follows:

$$\begin{aligned}
i_k^{(n)}(t) &= \rho|E_S(t)+E_R(t)|^2 - \rho|E_S(t)-E_R(t)|^2 \quad (17)\\
&= 4\rho\text{Re}\{E_S(t)E_R^*(t)\}\\
&= 4\rho\text{Re}\left\{\left[\sqrt{a_S}\,E_p(t)e^{j[\phi(t)/2+\psi_S]}\right]\left[\sqrt{a_R}\,E_p(t)e^{j[-\phi(t)/2+\psi_R^Q+\pi/2]}\right]^*\right\}\\
&= 4\rho\sqrt{a_S a_R}\,\text{Re}\{|E_p(t)|^2(-j)e^{j[\phi(t)+\psi_S-\psi_R^Q]}\}\\
&= 4\rho\bar{a}\,\text{Im}\{P(t)e^{j[\phi(t)-\theta^{(n)}]}\}\\
&= 4\rho\bar{a}P(t)\sin(\phi(t)-\theta^{(n)})\\
&= 4\rho\bar{a}P(t)\sin(\phi(t)-\theta^{(n)})\\
&= \sum_k 4\rho\bar{a}p(t-kT)\sin(\phi(kT)-\theta_n)\\
&= \sum_k \bar{i}\pi(t-kT)\sin(\phi(kT)-\theta^{(n)})\\
&= \sum_k i_k^{(n)}(t)
\end{aligned}$$

Modeling the Post-Detection Processing

The photocurrent received during the k-th interval (Eq. (15)) is essentially the delayed optical power pulse $p(t-kT)$, further modulated by the interferometric scaling factor $s_k^{(n)}$, the sign of which sets the outcome of the n-th comparison against the transition level $\theta^{(n)}$. The received photocurrent pulse $i_k^{(n)}(t)$ is further convolved with the post-detection trans-impedance impulse response $z_{TIA}(t)$ (impulse response from the photocurrent to the voltage at the receiver front-end. Using (16), the following voltage waveform is generated at the receiver front-end output:

$$\begin{aligned}
v_k^{(n)TIA}(t) &= i_k^{(n)}(t) \otimes z_{TIA}(t) \quad (18)\\
&= \bar{i}\pi(t-kT) \otimes z_{TIA}(t)\sin[\phi(kT)-\theta^{(n)}]\\
&= g_{TIA}(t-kT)\sin[\phi(kT)-\theta^{(n)}]\\
&= s_k^{(n)}g_{TIA}(t-kT)
\end{aligned}$$

where we introduced the voltage response at the optical receiver output due to a single OCG pulse:

$$g_{TIA}(t) = \bar{i}\pi(t) \otimes z_{TIA}(t) = 4\rho\bar{a}p(t) \otimes z_{TIA}(t) \quad (19)$$

The total voltage signal is obtained by summing (18) over all sampling intervals (indexed k):

$$\begin{aligned}
v^{(n)TIA}(t) &= \Sigma_k v_k^{(n)TIA}(t) = \Sigma_k s_k^{(n)}\\
&\bar{i}\pi(t-kT) \otimes z_{TIA}(t) = \Sigma_k s_k^{(n)} g_{TIA}(t-kT) \quad (20)
\end{aligned}$$

This is a Pulse Amplitude Modulated (PAM) waveform, with pulse-shape $g_{TIA}(t)$, and coefficients $s_k^{(n)}$, which are sufficient statistics for the comparison decisions. To recover these coefficients with highest SNR, one should ideally (assuming an input with additive white noise) process $v^{(n)}(t)$ by means of a matched filter $f(t) = g_{TIA}(T-t)$ (matched to the pulse-shape $g_{TIA}(t)$) to be ideally sampled at $t = kT$. Moreover, in addition the need for mitigation of Inter-Symbol Interference (ISI) may arise, impacting the design of the processing filter $f(t)$.

Due to the difficulty in either shaping an arbitrary analog matched filter, or realizing discrete-time analog filtering, it does not seem practical to realize a matched filter to good precision. A suboptimal, yet simpler engineering alternative, is to replace the matched filter $f(t)$ by an I&D module, performing the integration $\int_{kT}^{t}v_k^{(n)TIA}(t')dt'$ with $t \in [kT, kT+\tau_I]$, $\tau_I < T$. At the time $kT+\tau_I$ the integral is dumped (by discharging the integrating capacitor) in anticipation of resuming the integration in the next T-interval. The I&D may be modeled as a linear time-invariant filter with impulse response $h_{I\&D}(t) = 1_{[0,\tau_I]}(t)$ equal to unity over the interval $_{[0,\tau_I]}$ (zero otherwise), modeling the integration occurring in the I&D module. The I&D filter may then be viewed as a mismatched receive filter for the detection of PAM with pulse-shape $g_{TIA}(t)$. As a result of the mismatch between $g_{TIA}(t)$ and $h_{I\&D}(t)$, the SNR is somewhat degraded relative to the case wherein the receive filter would be precisely matched, i.e. given by $g_{TIA}(T-t)$. A key property of the I&D is that for wideband short pulses the output settles towards a steady state value, facilitating sampling at the end of the I&D interval.

The output of the I&D filter (integrator) is to be sampled at the instant $kT+\tau_s$ (with $\tau_s < \tau_I < T$) in order to extract the sufficient statistic $s_k^{(n)}$. Electronically, the sampling implies holding constant the voltage attained at $kT+\tau_s$, over the interval $[kT+\tau_s, kT+\tau_I]$ during which the sign-detector (limiting amplifier or latch) must settle to its sign-decision. The effective freezing of the voltage sample over the interval $[kT+\tau_s, kT+\tau_I]$ may be attained by two alternative methods:

(i) A T&H circuit may be used to track the I&D output voltage over the interval $[kT, kT+\tau_s]$, then freeze the voltage at instant $kT+\tau_s$, and hold it until $kT+\tau_I$, to allow sign decision over the interval $[kT+\tau_s, kT+\tau_I]$. Detailing the T&H, this is essentially an electrical two-port with its input voltage applied to a switch (e.g. a FET) terminated in a capacitor. The voltage on the capacitor is taken as the two-port output. When the switch is closed, its small internal resistance is in series with the capacitor, hence the T&H is essentially a voltage divider consisting of the series connection of small resistor and a capacitor with the voltage input applied at the resistor and the voltage output taken at the junction between the resistor and the capacitor. The T&H output voltage over the tracking window may be obtained by convolving the I&D output voltage with the T&H impulse response $h_{T\&H}(t) = e^{-t/R_{T\&H}C_{T\&H}}$, to describe the evolution of the T&H output signal over the tracking interval $[kT, kT+\tau_s]$. At the end of the tracking interval, at time $kT+\tau_s$, the switch opens up, disconnecting the capacitor from the source, freezing the voltage sample at that instant (holding it in the capacitor), over the interval $[kT+\tau_s, kT+\tau_I]$ such that the sign decision may be made. In actual realizations, the T&H and I&D functionalities may be unified, integrating the TIA output over $[kT, kT+\tau_s]$ then disconnecting the input, such that the integration ceases and the voltage is held. In terms of modeling, the impulse responses of the TIA, I&D and T&H should be cascaded. We define an overall trans-impedance impulse response from the photocurrent signal to the sign-detector (comparator to zero) input:

$$z(t) = z_{TIA}(t) \otimes h_{I\&D}(t) \otimes h_{T\&H}(t) \tag{21}$$

Notice that $z(t), z_{TIA}(t)$ are in $\Omega$ units (trans-impedances) whereas $h_{I\&D}(t), h_{T\&H}(t)$ are dimension-less voltage gains. Again, here $h_{I\&D}(t) = 1_{[0,\tau_I]}(t)$ is a unity pulse over the interval $_{[0,\tau_s]}$ (zero otherwise), modeling the integration occurring in the I&D module, and $h_{T\&H}(t)$ is the T&H effective impulse response over its "track" aperture $[0,\tau_s]$.

We may then express the tracked voltage signal falling on the T&H capacitor as follows:

$$v_k^{(n)}(t) = v_k^{(n)TIA}(t) \otimes h_{I\&D}(t) \otimes h_{T\&H}(t) = s_k^{(n)} \bar{i}\pi(t-kT) \otimes z_{TIA}(t) \otimes h_{I\&D}(t) \otimes h_{T\&H}(t) \tag{22}$$

or $$v_k^{(n)}(t) = s_k^{(n)} \bar{i}\pi(t-kT) \otimes z(t) = s_k^{(n)} g(t-kT); \\ g(t) = \bar{i}\pi(t) \otimes z(t) \tag{23}$$

(ii) If the I&D output has settled to a relatively constant value over the interval $[kT+\tau_s, kT+\tau_I]$ (which is the case when the voltage pulse at the I&D input is short-enough, essentially time limited over the interval $[kT, kT+\tau_s]$) then the relatively constant value to which the voltage settles over this interval may be viewed as the effective "frozen sample" to be used to feed the next sign-detector stage. The T&H is then redundant and may be discarded. In this case photocurrent then passes through the total impulse-response $z(t) \equiv z_{TIA}(t) \otimes h_{I\&D}(t)$ (with the T&H discarded), now replacing (22) by $$\begin{aligned} v_k^{(n)}(t) &= v_k^{(n)TIA}(t) \otimes h_{I\&D}(t) \\ &= s_k^{(n)} \bar{i}\pi(t-kT) \otimes z_{TIA}(t) \otimes h_{I\&D}(t) \\ &= s_k^{(n)} \bar{i}\pi(t-kT) \otimes z(t) \\ &= s_k^{(n)} g(t-kT) \end{aligned} \tag{24}$$

In both cases the total voltage at the input of the sampler of the n-th PC is expressed as $$v^{(n)}(t) = \Sigma_k v_k^{(n)}(t) = \Sigma_k s_k^{(n)} g(t-kT) \tag{25}$$

Sampling

It remains to model the electronic sampling process, applied the "hold" action of the T&H (or via the I&D settling to constant value, in case a T&H is not used). Point-sampling the tracked voltage signal (25) at the instant $\tau_s + kT$ yields the sequence of samples $$\begin{aligned} q_k^{(n)} &= v^{(n)}(kT+\tau_s) \\ &= \sum_{k'} s_{k'}^{(n)} g(t-k'T) \bigg|_{t \to kT+\tau_s} \\ &= \sum_{k'} s_{k'}^{(n)} g[(k-k')T+\tau_s] \\ &= \sum_{k'} s_{k'}^{(n)} g_{k-k'} \\ &= s_k^{(n)} \otimes g_k \end{aligned} \tag{26}$$

where $g_k \equiv g(kT+\tau_s)$ are the samples of the function $g(t+\tau_s)$. In our system the response $g(t) = \bar{i}\pi(t) \otimes z(t)$ (see (23)) is practically time-limited to the interval $[0, \tau_s]$ (typically $T/2 < \tau_s < T$) when both $\pi(t), z(t)$ are time-limited by design to supports summing up to less than $\tau_s$. Having $g(t)$ be time-limited as indicated, is enabled assuming ultra-fast pulses, i.e. very narrow support $\tau_p$ for $p(t)$, in which case the support of $z(t)$ should not exceed $\tau_s - \tau_p$ but may be close to $\tau_s < T$. This implies that the receiver bandwidth should well exceed the sampling rate $1/T$, i.e. high-speed optical receivers are required, in addition to the fast optical pulses. When the time limitation to one sampling interval is satisfied, we obtain $g_k \equiv g[kT+\tau_s] = g_0 \delta_k$, i.e. the inter-symbol interference (ISI) is eliminated, as in this case we obtain $$q_k^{(n)} = s_k^{(n)} \otimes g_k = s_k^{(n)} \otimes g_0 \delta_k = g_0 s_k^{(n)} \tag{27}$$

or $$q_k^{(n)} = g_0 \sin[\phi(kT) - \theta^{(n)}]; \ g_0 \equiv g[\tau_s] = \bar{i}(\pi \otimes z)[\tau_s] \tag{28}$$

Notice that when a T&H circuit is used, its tracking impulse response is absorbed into the impulse response $z(t)$, hence also into that of $g(t)$, as well as into the constant $g_0$ in (28).

ISI Mitigation

The bandwidth of the optical receiver front-end and the optical sampling comb pulses must be sufficiently high, such that the receiver response to each of the optical pulses is relegated to a single T-interval and does not spill to adjacent T-intervals. In the wake of insufficient bandwidth, ISI would be generated. ISI may be mitigated by applying electronic discrete-time equalization, just as in communication receivers, e.g. by means of analog discrete-time circuits, essentially transversal filters, typically FIR, with just a few taps. Either feed-forward or decision-feedback equalization or both may be utilized to mitigate the ISI reducing it well beyond a single LSB. The challenge in decision-feedback equalization is to keep the feedback delay low, under one T-interval. Notice that unlike the case of communication, here we have broadband transmitted pulses, and a well-defined "channel" consisting of the impulse response $z(t)$. The best way to mitigate ISI is to provide sufficient bandwidth for the transfer function associated with $z(t)$.

Evidently, our main focus here is photonic-assisted ADC conversion, facilitated by phase modulation, a photonic circuit and electronic 1-bit ADCs. Nevertheless, the proposed usage of equalization techniques may also be extended to all-electronic ADCs.

One-Bit Quantization (Sign-Detection)

The sampling and quantizing information is encapsulated in the samples $q_k^{(n)} = g_0 \sin[\phi(kT) - \theta^{(n)}]$(28), with k the sampling (temporal) index and n the quantization (ADC bin) index.

Comparison-against-zero (sign decision) applied onto these samples in the final comparator stage of the sampler, yielding the Boolean±1 decisions $$\begin{aligned} d_k^{(n)} &= \text{sign}\{q_k^{(n)}\} \\ &= \text{sign}\{g_0 \sin[\phi(kT) - \theta^{(n)}]\} \\ &= \text{sign}\{g_0\} \text{sign}\{g_0 \sin[\phi(kT) - \theta^{(n)}]\} \\ &= \text{sign}\{g_0\} \text{sign}\{\phi(kT) - \theta^{(n)}\} \end{aligned} \tag{29}$$

If $g_0 > 0$ (which is typically the case, since the short optical pulse positive power profile $p(t)$ is essentially integrated by the receiver response h(t) which is essentially that of a leaky integrator), then (29) reduces to $$d_k^{(n)} = \text{sign}\{\phi(kT) - \theta^{(n)}\}. \quad (30)$$

If the constant $g_0$ were negative, the comparator logic could be simply reversed. Therefore, assuming $g_0 > 0$ without loss of generality, $d_n[k] = \pm 1$ (in actual digital logic 1/0) indicates whether $\phi(kT) < \theta^{(n)} + \pi$ or $\phi(kT) > \theta^{(n)} + \pi$, the first condition meaning that the desired sample has been located to fall in the half circle $[\theta^{(n)}, \theta^{(n)} + \pi]$, whereas the second condition means that the sample falls in the complementary half circle $[\theta^{(n)}, \theta^{(n)} + \pi]$. Since the Boolean decisions $\{d_n[k]\}_{n=0}^{N-1}$ are generated in parallel by the multiple PCs (with their electronic post-detection stages), it is evident that we have attained flash ADC action, as we simultaneously perform N comparisons of the time-sample $\phi(kT)$ under test, against the set of thresholds $\{\theta^{(n)}\}_{n=0}^{N-1}$. In particular, if the thresholds are set to $\theta_n = n\Delta$, then we have the photonic equivalent of a conventional flash ADC with equi-spaced transitions, with the caveat that here the decision at the output of the n-th PC locates $\phi(kT)$ in one of two complementary half-circles. We show further below that the totality of $N = M/2$ decisions serves to uniquely locate $\phi(kT)$ in one of the segments $\{[n\Delta, (n+1)\Delta]\}_{n=0}^{M-1}$, with $\Delta \equiv 2\pi/M$.

ADC Encoding Logic—Cyclic Thermometer Codes

There is some peculiarity here, relative to a conventional flash ADC, due to the phase wrap-around (the optical phase domain is cyclic modulo $2\pi$, and so is the sine function, which gets applied onto $\phi(t) - \theta^{(n)}(t)$). To demonstrate this effect let us consider the case that $\phi(t)$ (which is arbitrary) happens to attain either of the two values $\phi(kT) = \theta^{(n)} \pm \epsilon$ where $0 < \epsilon < \Delta = 2\pi/M < \pi$. Then it is readily seen that the sufficient statistic sign $\{\sin[\phi(kT) - \theta^{(n)}]\} = \text{sign}\{\sin[\pm\epsilon]\}$ respectively equals $\pm 1$. Now consider the case that $\phi(kT) = \theta^{(n)} + \pi \pm \epsilon$. We now obtain, sign $\{\sin[\pi \pm \epsilon]\} = \mp 1$, exactly the opposite than in the first case. In fact each PC effectively sets up a pair of thresholds, $\theta^{(n)}$ and $\pi + \theta^{(n)}$, and the decision is between two complementary half circles, both with common diameter uniquely defined by the angular value $\theta^{(n)}$ (which uniquely sets the antipodal point $\pi + \theta^{(n)}$).

Figure 12:
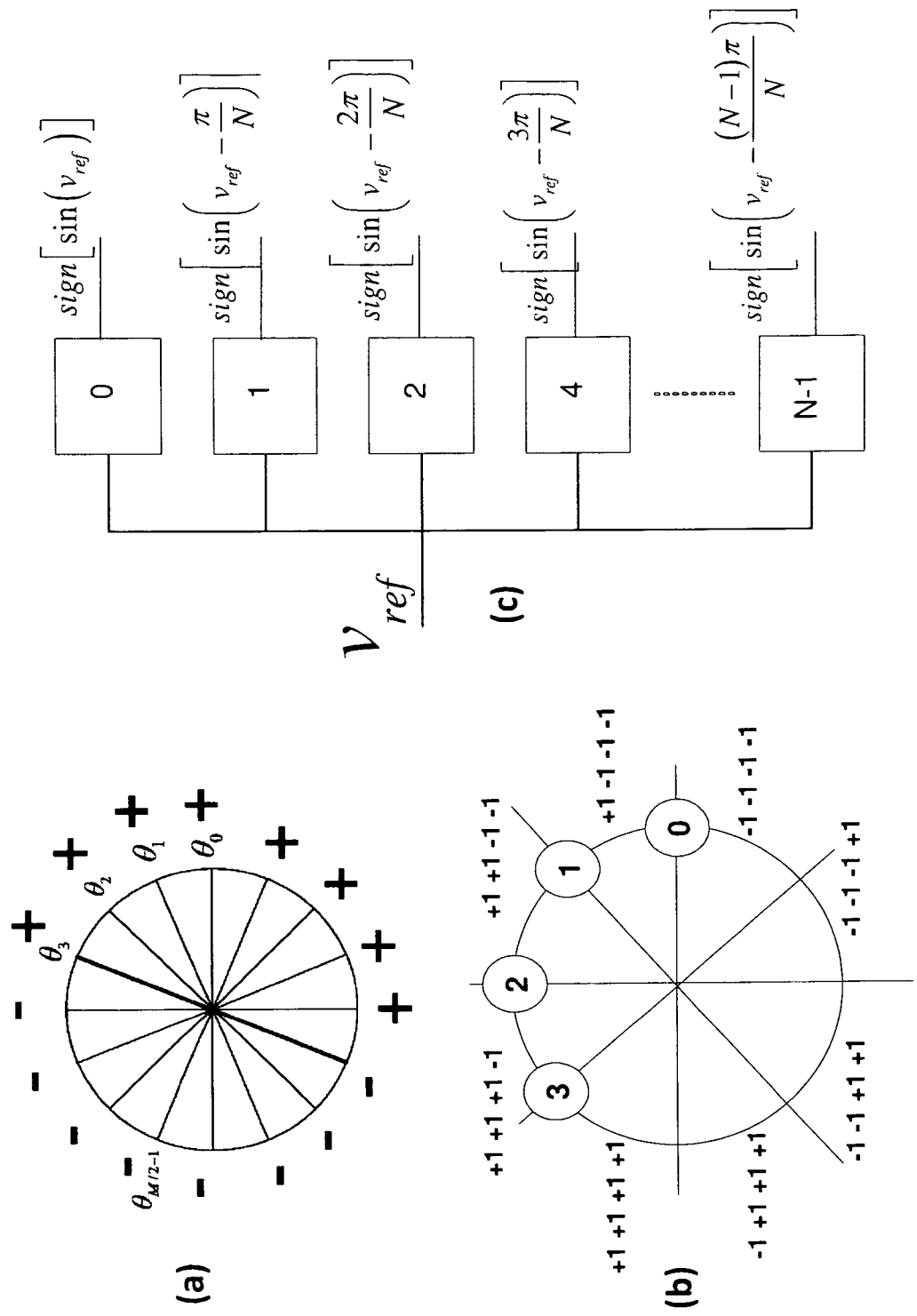
FIGS. 12(a-c) is an illustrate Cyclic Thermometer Code and Gray code according to an embodiment of the current invention.

FIG. 12($a$) is an illustrate Cyclic Thermometer Code according to an embodiment of the current invention.

FIG. 12($b$) is an illustrate Gray code for four detector case according to an embodiment of the current invention.

FIG. 12($c$) is a possible representation of the system according to an embodiment of the current invention.

For those familiar with the thermometer codes of flash-ADC, the situation is as described in the upper right quarter of FIG. 12($a$), indicating that the encoding logic of the quantizer, following the bank of comparators (1-bit ADCs), must be modified to implement a "cyclic thermometer" code as shown in the figure, since the n-th comparator indicates onto which of the two half-circles making the angle $\theta^{(n)} = n\Delta$, does the phase under test fall into. This also implies that it suffices to test the phase against $N = M/2$ angular thresholds, in order to uniquely classify the phase under test as falling into precisely one of the arcs $\{[n\Delta, (n+1)\Delta]\}_{n=0}^{M-1}$, and there is no need to generate all M comparisons, as in a conventional (unwrapped) flash-quantizer which requires $M = 2^b$ levels. It follows that a "cyclic ADC" offers a factor-of-two savings in the number of comparators relative to a "linear ADC". Hence the required encoding logic is somewhat different from the conventional "thermometer" encoding logic encountered in conventional flash-ADCs. We model our system as an array of N detectors, where the output of i-th PC is $$d_k^{(n)} = \text{sign}[\sin(\phi(kT) - \theta_n)]$$

where $\phi(kT)$ is the phase under test and $$\theta_n = \frac{\pi}{N}n,$$

$0 \leq n \leq N-1$ (N is the number of PHDs in the system). The system could be represented in FIG. 12$c$. A useful way to describe the system is by dividing the unit circle into 2N quantization regions—"slices" (FIG. 12$a,b$). Each PC corresponding the point on the circle, dividing the angle $\pi$ into $N = 2^n$ angles. Passing a line through each angular threshold point and through the circle center, the line crosses the circle on the other side and we obtain 2N slices.

The case of four detectors is presented in FIG. 12$b$. A Gray code is obtained when the value of 0 bit is changed to −1. With N PC we then achieve the quantization of $\log_2(2N) = \log_2(2 \cdot 2^n) = \log_2(2^{n+1}) = n+1$ bits. For 32 detectors we obtain 6 bits quantization.

Notice the sine non-linearity $\sin[\phi(kT) - n\Delta]$, generated by the lightwave interference process. Such sine non-linearity significantly limited previous photonic ADC schemes based on lightwave amplitude (or power) modulation. However, in our case, as our novel structure compares the phase under test against multiple angular thresholds $\{n\Delta\}$, the polarity of the sine nonlinearity is exploited to advantage, in order to indicate whether or not the n-th threshold, $n\Delta$, has been crossed. This is simply achieved by monitoring the polarity of the nonlinear sine function, which has odd parity around zero, as well as around $\pm\pi$ (however around zero the sine is monotonic increasing whereas around $\pi$ it is decreasing). Hence, the polarity of $\sin[\phi(kT) - n\Delta]$ directly provides information allowing to discriminate which of the two half-cycle intervals, of the form $[n\Delta, n\Delta + \pi]$ or $[n\Delta + \pi, n\Delta]$, $\phi(kT)$ falls into. In contrast, in conventional ADCs, the sine nonlinearity manifests itself in detrimental ways, causing ADC distortion. The essential difference is that in a conventional photonic ADC, the sine is applied onto the full dynamic range of the signal, whereas in our system the sine is applied (in parallel) onto the signal after offsetting the signal in parallel by each of the transition levels, such that each PC must deal with a single offset signal.

Noise Performance Analysis

The noise sources potentially affecting our system are:
1. Optical comb timing jitter
2. Optical source phase noise
3. Shot-noise
4. Dark-current noise
5. Relative Intensity Noise (RIN) and optical pulse amplitude fluctuations
6. Thermal noise
7. Amplified Spontaneous Emission (ASE)—when optical amplification is used.
8. Avalanche Photodiode (APD) multiplicative noise (when an APD is used).

The first two noise sources, namely optical comb time jitter noise and phase noise are well mitigated in our system. In fact the usage of optical combs for photonic sampling [1-3] is motivated by the low-jitter (~5-50 fsec) incurred with OCGs such as MLLs, which jitter is about 1-2 orders of magnitude better than that attainable with high speed electronic components.

As for the optical source phase noise, qualitatively, the fact that the pulse jitter is low indicates that the phase noise may also be low. In any case, the balanced push-pull operation and the coherent detection ensure effective phase noise cancellation. Indeed, as the optical source is split to two paths, each carrying the original source Phase Noise (PN), $\phi_{PN}(t)$ each further modulated by the voltage under test which adds up±$\phi(t)$, the phases accumulated along the two paths, at the PC inputs are $\psi_R+\phi_{PN}(t)+\phi(t)/2$ and $\psi_R+\phi_{PN}(t)-\phi(t)/2$, respectively, The PC then subtracts these two phases, yielding $\psi_R-\psi_S+\phi(t)$, cancelling out the $\phi_{PN}(t)$ terms. It is seen that the laser PN, which is common-mode to both sides has been cancelled out, whereas the phase-under-test, which is difference-mode gets doubled (the static phase difference $\psi_R-\psi_S$ is used to set up the comparison threshold in each PC, as described above). Moreover, the cancellation of laser PN is seen to be insensitive to the precise power splitting ratios and optical losses throughout the IFE photonic circuit. The remaining noise sources, such as Shot-noise, Dark-current noise and Thermal noise are treated in Appendix A.

Generally, the performance would be limited by thermal noise, however, by using optical amplification (as further discussed below), we may approach shot-noise limited performance within a few dB.

As per Appendix A the shot-noise and dark-current impairment are well controllable, with these noise contributions attaining the level the quantization noise for low optical transmitted powers and practically achievable dark currents of a few nA. In fact the performance of our system in the wake of shot-noise is substantially better than that of a conventional PADC system, about a factor of $M=2^b$ more favorable than the performance of a conventional intensity-modulation based photonically sampled electronically quantized system, as shown in the next paragraph.

As for the RIN and OCG pulse amplitude fluctuations, in our system the comparison against ADC transition levels are effectively generated in the optical phase domain. Inspecting (28) repeated here, $q_k^{(n)}=g_0 \sin[\phi(kT)-\theta^{(n)}]$ it is seen that the argument of the sine is solely dependent on the phases. The effect of optical power variations, such as RIN and other OCG pulse amplitude fluctuations (which may reach a fraction of a percent in typical MLL OCG sources) is solely to modify the gain factor $g_0 \equiv g[\tau_s] = \bar{i}(\pi \bar{x} z)[\tau_s]$, by virtue of random variations in the optical power pulses $p(t-kT)=\bar{p}\pi(t-kT)$ which are manifested as fluctuations in $\bar{p}$, hence in $\bar{i}$. However, the sign decision $d_k=\text{sign}\{q_k^{(n)}\}=\text{sign}[\phi(kT)-\theta^{(n)}]$ is unaffected by the scaling $g_0$ of the sine, only by its argument, the phase difference. Hence we conclude that our flash PADC system is impervious to RIN and OCG pulse power fluctuations.

With the shot-noise and most other noise sources out of the way, it turns out that it is thermal noise that becomes the limiting factor when attempting to realize at 6 bits of ADC resolution, hence we propose to approach the shot-noise limited performance by either optical amplification or avalanche photo-detection or both. We note that in a conventional PADC, optical amplification would not be helpful, since the conventional system is shot-noise limited, requiring a substantial optical power level to be supplied by the source to begin with. In contrast, our PADC system exhibits a 1-2 orders of magnitude lower shot-noise limit (i.e. may operate with this much lower optical power as far as shot-noise is concerned), hence the shot-noise "gets out of the way" and the thermal noise becomes the bottleneck in our system. It follows that applying optical amplification or APD gain may be effectively used to mitigate the thermal noise in our flash PADC system. The structures for applying optical amplification are discussed further below.

Optical Amplification and Avalanche Gain

Figure 13:
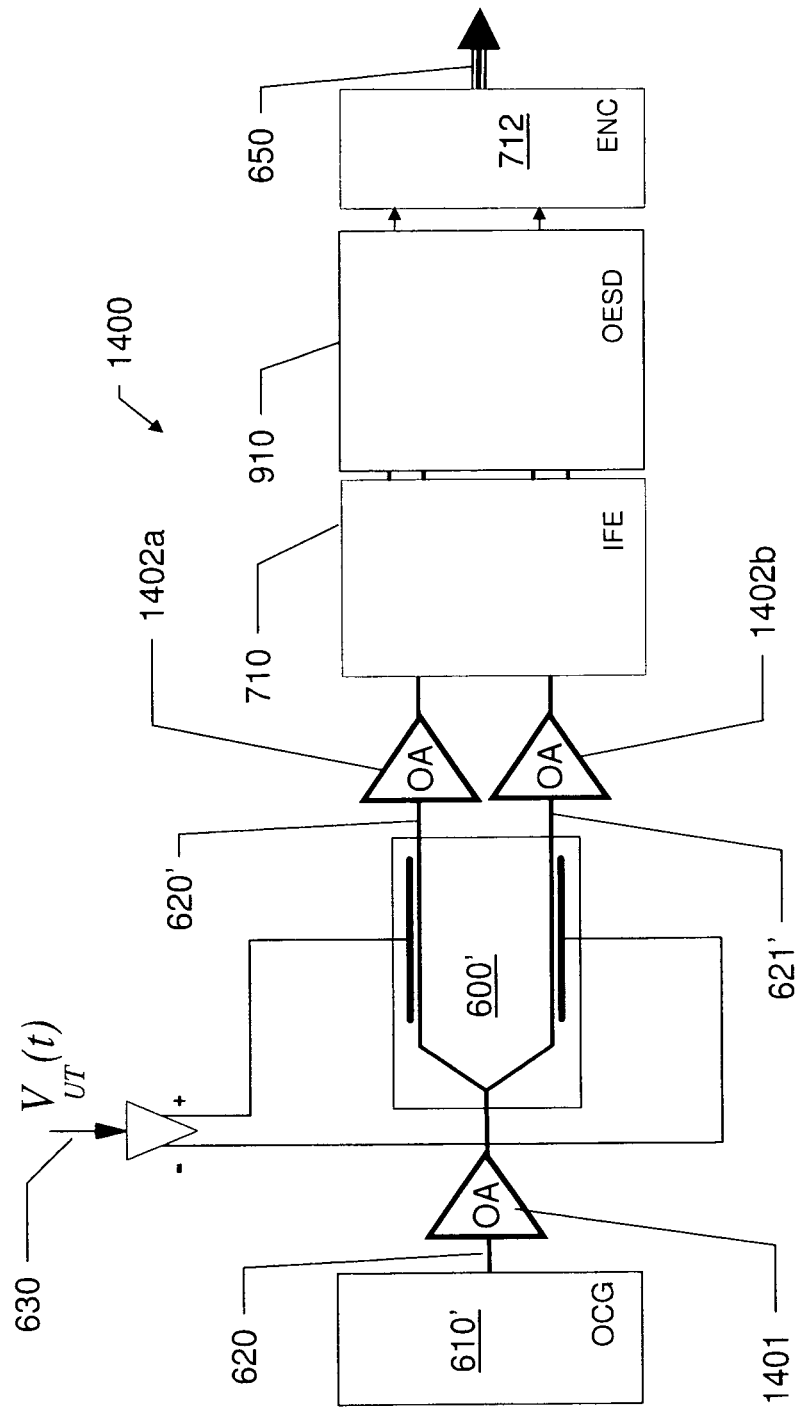
FIG. 13 illustrates a Flash photonic ADC system with optical amplification and/or avalanche photodiodes according to an exemplary embodiment of the current invention.

FIG. 13 illustrates a Flash photonic ADC system 1400 with optical amplification and/or avalanche photo-detection according to an embodiment of the current invention.

FIG. 13 differs from previous figures in the presence of optional Optical Amplifiers (OA). For example, OA 1401 may be used between OCG 610' and PM 600', for amplifying the signal (SIG) 620 before it enters PM 600'. It should be noted that LO signal may also be amplified.

Optionally, additionally or alternatively, OA 1402*a* and 1402*b* may be used for amplification of the modulated light 620' and 621' before they enter IFE 710.

It should be noted that OA 1401 and 1402 may be used in combination of other variations of OCG, PM, IFE and EOD. Specifically, an OESD 910' or 910" (FIGS. 10*a* and 11), having OAs 1102 may also be used.

Figure 14:
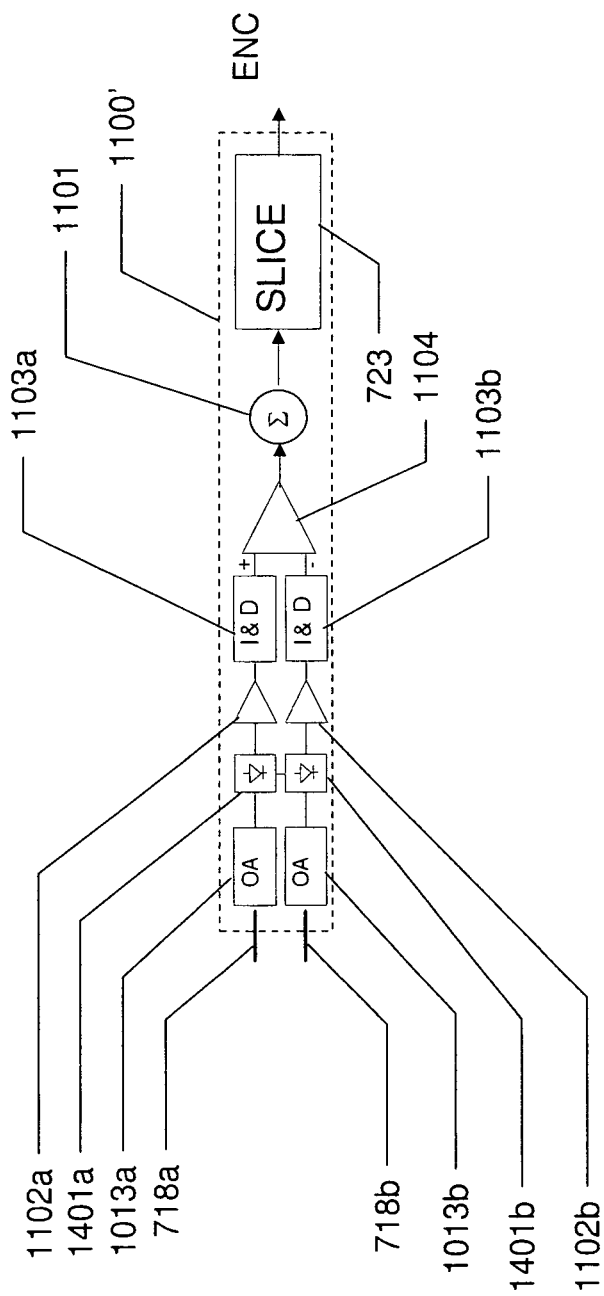
FIG. 14 illustrates a photonic channel with optical amplification and/or avalanche photodiodes according to an exemplary embodiment of the current invention.

FIG. 14 illustrates a Flash photonic channel 1100' having an avalanche photo-diodes 1401*a* and 1401*b* and optional optical amplifiers OA 1013*a* and 1013*b* according to an embodiment of the current invention.

To address the issue of insufficient receiver sensitivity due to the thermal noise, we must either supply optical amplification, or avalanche gain. Considering the last mentioned option, the photodiodes may be selected to be of the Avalanche Photo-Diode (APD) type, providing multiplication gain such that the thermal noise of the receiver is no longer dominant. As is well known APD multiplication gain is accompanied by multiplicative noise due to the random nature of the avalanche 1 to ionization process. An analysis of our PADC photonic link including the impact of APD amplification and noise will be considered in Appendix A.

Considering optical amplification (OA) followed by optical filtering (OF), there are three options: (i) Inserting an OA+OF between the OCG output and the dual E-O modulator input. (ii) Inserting two OAs+OFs between the dual E-O modulator outputs and the two IFE inputs. (iii) Inserting M=2N OAs+OFs between each port of each PC and its corresponding photo-diode (as shown in FIGS. 10,11).

In FIG. 14 all three optical amplification options are shown at once, although either one, two or all three of the options would be usable at a time (and either amplification option may be accompanied by the usage of APDs for photo-detection). The main advantage of these proposed optically amplified structures is enabling detection in the ASE noise (or beat noise) limited regime, which is substantially more sensitive than thermal-noise limited detection, with sensitivity just a few decibels worse than the quantum limit. Another significant advantage of the optically-amplified scheme is that the meta-stability of the photonic-enabled ADC is substantially improved.

The downside of (i) is that the sharp optical pulses may be broadened due to the optical amplification, and the fact that the subsequent attenuation of the E-O dual modulator paths, and the optical splitting losses in the IFE detract from the OA gain, and possibly the E-O modulator and the IFE may not withstand the high peak power of the optically amplified pulses. The advantage of (i) is that it is the simplest solution, as the other options entail more OAs+OFs. The advantage of (ii) is that the peak power limitation of (ii) may be partially alleviated, however the downside of (ii) is that the phase modulation imparted onto the optical pulses by the E-O modulator may be altered by amplitude-to-phase conversion. These disadvantages are eliminated in (iii), however the downside of (iii) is that in one embodiment double the number of optical receivers (M rather than M/2) is required, and also as M OAs+OFs are needed in any case, and the mismatch between the two electrically photo-detected paths associated with each PC may be more pronounced. However, optically pre-amplifying the signal prior to photo-detection is desirable (especially if option (i) or (ii) are used), as it provides the lowest overall noise figure. In all options the optical filters may be possibly integrated into the photonic circuit of the IFE, realized based on optical resonators (e.g. ring resonators). The OF role is to reject the out-of-band ASE noise. The bandwidth of each OF should at least match or slightly exceed that of the electrical signal under test, e.g. for a 20 GHz system, sampling at 40 Gsamp/sec, we require about 20-25 GHz BW for the OFs. The optimal solution may entail carefully distributing the optical gains under two or three of the options above.

Describing in detail option (iii), the light incident on each of the two PDs of the BPD pair is optically amplified, and the photo-diode currents are either subtracted in pairs, as in the un-amplified version, or each photocurrent is separately amplified by its own optical RX front-end, i.e. there are two parallel TIA stages associated with each PC, and the two amplified voltage outputs are either subtracted at the end (e.g. by means of a differential amplifier), to be input into a sign-detector (slicer) or the two generally different voltages are input into an optical comparator with two electrical inputs, to generate a bit which indicates which of the two inputs is larger.

Appendix A models the signal-noise analysis for optical amplification.

Optical Receiver and 1-Bit ADC Circuit (Slicer) Design Considerations

General OESD Structure:

At the block-diagram level, each OESD is an opto-electronic structure fed by a pair of optical inputs (output ports of the corresponding ODC), generating a 1-bit digital output. Each OESD comprises an optical receiver front-end (the BSD followed by a TIA or other receiver front-end linear stage) terminated in an electronic slicer (1-bit ADC_, serving as a sign detector (comparator with one of its ports set to ground), in turn comprising an optional Track & Hold (T&H) stage, terminated in a latch (comparator). We already explained and will reiterate why the T&H is optional, and may be spared if the bandwidth of the optical receiver and optical pulse is sufficiently high such that the I&D output settles to a constant.

Perspective on electronic requirements: An important perspective on the electronics required in photonic ADCs has been stated in Valley's survey [1]: It should be noted, however, that when photons are converted back to electrons in the photonic sampled and/or quantized ADCs, some degree of comparator or sampling 1 to circuitry is often required. In the same spirit, more than 20 years ago Becker et al. [27] noted that the utility of a photonic ADC device depends on whether it resolves more issues for the electronic ADC than the conversion back and forth to the optical domain creates. It follows that in order for a PADC scheme to be useful, it must substantially relieve the burden of its final-stage electronics.

In the flash PADC system according to the current invention, the onus of the parallel comparisons against a set of transition levels $\{\theta_n\}_{n=0}^{N-1}$ is taken by the photonic circuit, which is terminated in N optical receiver front-ends and 1-bit ADCs (each operating independently of each other) in order to generate the final Boolean decisions. A vast portion of a conventional electrical flash ADC has been eliminated, however, we still have some stringent requirements on the 1-bit ADC electronics, e.g. precise T&H and low metastability comparators are required.

Nevertheless, the electronics of our proposed photonic-based ADC is much simpler than that of an electronic ADC at the same rate (which is not even realizable at our targeted high speeds).

The rationale is that the 1-bit ADC electronic module, replicated N times, with the individual 1-bit modules operating independently, is substantially easier to electronically realize at very high rates, relative to a conventional full N-bit ADC at the same rates. Anyone versed in electronic flash ADC circuit design would appreciate this point. In fact the state-of-the-art of electronic flash ADC is described in [7], and with our proposed technology we estimate that we should be able to exceed the state-of-the-art of electronic ADC.

The detailed design of the receiver front-end plus post-detection electronic circuits of the OESD combines known techniques of optical receiver design and slicers: the end-to-end requirement is to realize the combined O/E linear conversion (TIA), I&D (quasi-matched filtering) and sampling (T&H optionally used) followed by a sign-detector (latch or limiting amplifier performing the comparison-against-zero). This is the minimum of electronic processing that may be conceived, a single bit ADC, repeated N times, with the individual 1-bit ADCs decoupled to operate independently of each other. This is a major difference relative to electronic flash converters, wherein multiple comparators are also used but they are not simply separable, as they are all fed via a complex electrical network intended to generate multiple amplitude scaled versions of the voltage under test, to be compared against a reference signal which must be precisely duplicated to have the same amplitude in all comparators. There are then issues of clock skew and signal leakage between stages, which plague electronic flash ADCs.

In contrast, in our system there is no need to generate multiple amplitude-scaled versions of the signal under test. Rather, multiple replicas of the optical signal under test are generated (all bearing the same phase information, since splitting ratios do not affect the phase) and are compared in parallel in the optical domain against multiple thresholds.

The Option of not Using T&H, Revisited

Returning to consider the sampling process, in the case that a T&H is used, the sample $q_n[k]=g_0 \sin[\phi(kT)-\theta_n]$ is frozen (held) and fed into a comparator against the zero-value (sign-detector). The T&H circuit may be designed to dump the charge accumulated in the T&H output capacitor during the prior sampling period, prior to opening up another tracking window (resetting the charge is customary in conventional electronic ADC). Sampling (hold) should occur at time $\tau_s$ towards the end of the sampling interval, T, after most of the energy of the ultra-fast optical pulse has been accumulated, leaving time for the dump cycle.

It may be possible to do away with the T&H circuit, feeding the I&D stage output directly into a limiting amplifier or latch (comparator to zero, performing a sign decision). The reason is that when the receiver and optical pulse bandwidth is sufficiently high (which is necessary if ISI is to be avoided, unless heavy equalization is performed), then the voltage signal at the latch (comparator) input settles to an almost constant value during the second half of each T-interval. We may say that the comparator is fed during the k-th interval by the analog signal $s_n[k]g(t-kT)$, which resembles a step transition $u(t-kT)$, except that the ramp-up at kT is more gradual and has exponential shape. However, if the bandwidth is high enough this transient settles off in the first half of the T interval, i.e. over the $2^{nd}$ half, the voltage signal at the TIA output is fairly constant. The resemblance of $g(t-kT)$ to a step stems from the fact that the optical power pulse p(t) convolved 1 to with the photo-diodes impulse response is almost an analog impulse, and the trans-impedance or high-impedance RX front-end followed by the I&D stage essentially acts as a (leaky) integrator, Hence, the TIA excited by the near-impulse, then I&D integrated, approximates a step response, in fact, the step is asymptotically reached by following a decaying transient. Since $g(t-kT)$ approximates $u(t-kT)$, more so towards the end of the T-interval by which time the transient settled out, once the comparator (latch) is clocked at time $kT+\tau_s$ (with $\tau_s$ typically satisfying $T/2 \leq \tau_s < T$), then over the interval $[kT+\tau_s, kT+\tau_s]$ the latch sees at its input little amplitude variation, as the waveform $g(t-kT)$ resembles a step. Hence, in case wherein bandwidth is abundant, the latch operates as if a T&H was used to hold a fixed value, even though a T&H may not be used. If the bandwidth of the receiver front-end is marginal, it is advisable to precede the latch by a T&H, however in this case the ISI may be excessive anyway, hence this practice the system may not work unless electronic equalization is used. If an ultra-fast bandwidth receiver or an analog equalizer were not available, then the receiver impulse response, convolved with the optical pulse, would spill over into the next interval. It would then be necessary to mitigate ISI (i.e. restore the ability to make each decision solely on the basis of the sufficient statistic $s_n[k]$ generated during the corresponding period, cancelling out disturbances from neighboring values $s_n[k-1], s_n[k-2], \ldots$).

In case no T&H is used, the system is then designed to settle to a relatively constant value and the comparator timing phase is selected accordingly, activating the comparator at the time $\tau_s$. This may be attained by having ultra wide receiver bandwidth, and using ultra-fast optical samples, both with BW much greater than the sampling rate, $1/T$. An ultra-fast photo-current pulse received with ultra-wide bandwidth gets integrated in the I&D, generating a waveform with fast rise, rapidly settling to its steady-state value. In this case it may be possible to discard the ultra-fast T&H circuit following the I&D, and still attain insensitivity to the jitter of the comparator clock, and stable comparator operation despite the fact that no electrical T&H circuitry is used. If the receiver and/or OPG pulse-shape is not sufficiently wideband, then it is essential that the 1-bit ADC incorporate a T&H stage, in order to hold the electrical signal at the I&D output, prior to being passed to the latch (comparator). However, the system may not work well in this case due to the ISI between adjacent T-intervals.

Analogy with I&D Detection in Communication Receivers

There is an analogy between the post-detection electronics operation and an I&D module often used in a digital communication receiver. The receiver front-end input capacitance (in shunt with the input resistance, which is high, either by a high-impedance design, or by virtue of the feedback of the trans-impedance front-end), essentially integrates the received current over each sampling interval (typically accumulating current into the front-end capacitor), generating an analog signal roughly proportional to the total accumulated electrical charge $q_k^{(n)}$ during the sampling interval, the polarity of which, as determined by $s_k^{(n)}$, is indicative of whether or not the particular angular threshold has been crossed.

Comparison with BDPSK Receiver

Notice that from the BPD output to the digital output, the system resembles an optical receiver used in BDPSK optical transmission; however there are two key differences relative to a conventional optical communication receiver. (i): At the time instants when decisions are made, the eye is not necessarily open most of the time. We are especially interested in cases when the eye is almost closed, which may not be dismissed as "errors" but we also need to decide on the sign of such minute voltages, within +/−half-LSB away from zero, in order to discriminate between adjacent ADC bins. The slicer in a conventional optical receiver would then not be sufficiently accurate for the 1-bit ADC task at hand, as in our case we do not sample at the center of the eye (as in the communication application) but we may sample anywhere, including very close to the signal zero-crossings, where the difference signal $q_k^{(n)} = g_0 \sin[\phi(kT) - \theta^{(n)}]$ attains very low in absolute value, yet we must determine its sign. Hence we require 1-bit ADCs comprising high-quality electronic comparators of best metastability specifications (metastability refers to the small range around a transition level—in the 1-bit ADC case, the zero level—small range which gets mapped into an output logic level in an uncertain way, e.g. a "plus" decision may be made even though the voltage at the comparator input is slightly negative). To cope with the meta-stability impairment, comparators must provide very high amplification in a very short time (i.e. with high bandwidth), while retaining the sign of the input, unlike the design of a communication slicer, which may be much more lax (as a wrong decision when the signal falls in a small range around the point which is half way in the eye opening, would exact just small penalty in the overall BER, the bulk of which is due to the noisy signal falling in the wrong side of the threshold).

(ii): In our case we not require to recovery the clock from the received signal itself, since a synchronous clock is assumed available from the OCG, e.g. in case the OCG is realized as mode locked laser (MLL) with an active locking mechanism.

Clock Generation for the Post-Detection 1-Bit ADCs

In case the OCG does not have a clock available (e.g. if a passive MLL is used), and also to prevent clock feed-through and other clock related electronic impairments, then in the spirit of "photonic assisted AGC" [1] a precise clock for the 1-bit ADC(s) may be optically delivered with ultra-low jitter. This may be attained by diverting a fraction of the OCG light (e.g. as tapped at an extra splitting port on one of the multi-arm splitters of the IFE), photo-detecting the OCG tapped light onto the 1-bit ADC circuitry, in order to generate the ultra-low-jitter clock. To avoid transporting the clock to the multiple 1-bit ADCs, each such device may be equipped with a photo-diode and light may be split from the OCG to each of the devices.

Time and Wavelength Interleaved Flash Photonic ADC

Figure 15:
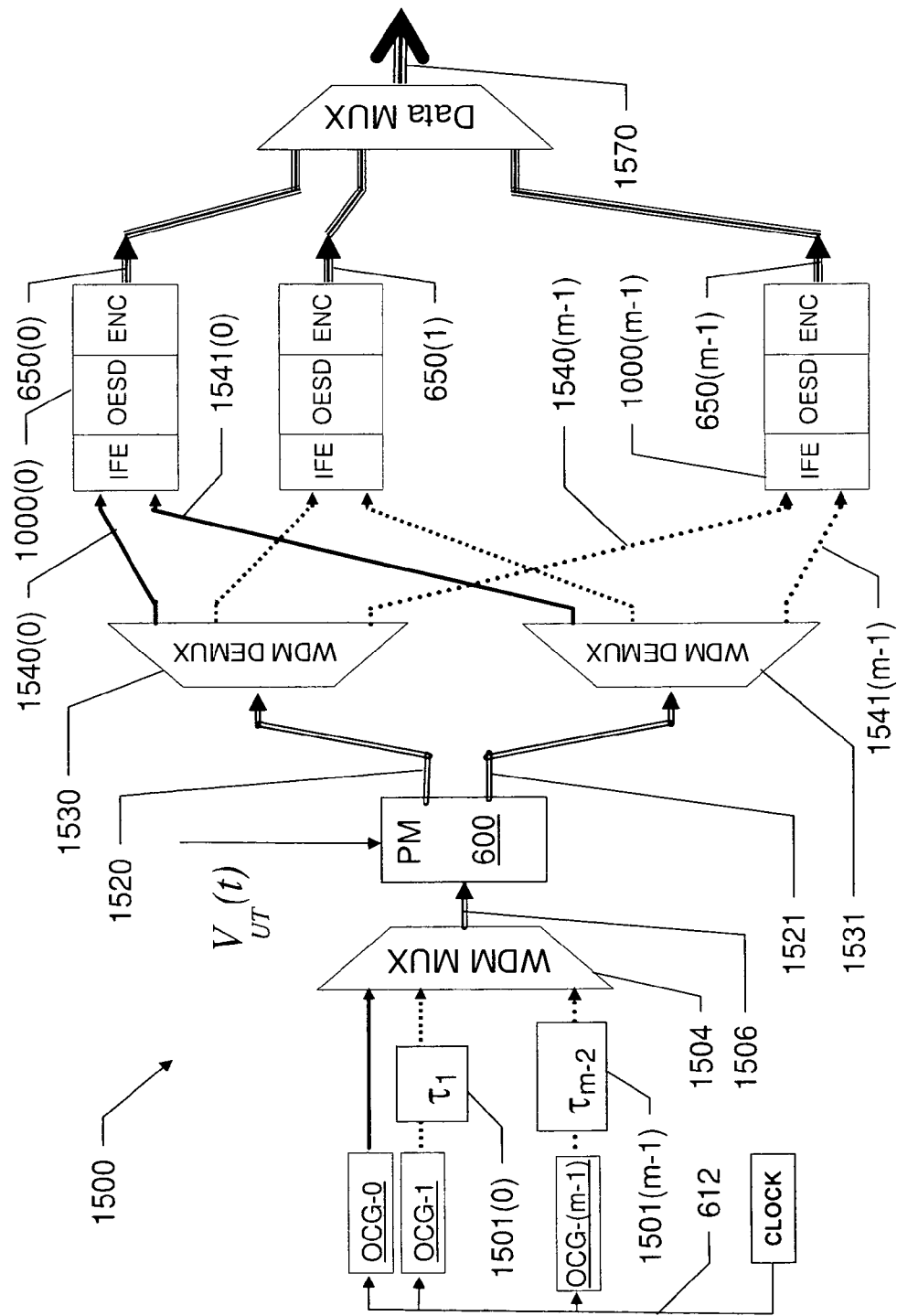
FIG. 15 schematically depicts multi wavelength time-interleaved PADC system according to a preferred embodiment of the current invention.

FIG. 15 schematically depicts multi wavelength time-interleaved PADC system 1500 according to a preferred embodiment of the current invention.

A plurality of m OCGs, OCG-0, OCG-1, ..., OCG-(m−1), each producing light at slightly different wavelengths $\lambda_0$, to $\lambda_{m-1}$, are all synchronized to one clock. Same clock is also used for synchronizing the rest of the time-interleaved PADC system.

Short pulse trains of different OCGs are time-interleaved, for example by introducing different delays using optical delay lines 1501(0) to 1501(m−1) having delays $\tau_1, \tau_2, \ldots \tau_{m-2}$ for the beams of OCG-1, OCG-2, ..., OCG-(m−1) respectively. Preferably, $\tau_1 = T/m$, $\tau_1 = 2T/m$, etc. Alternatively, electronic delays are inserted on the clock line synchronizing each of the COGs.

For clarity, different dashing was used for different wavelength.

The light from all the OCGs is combined in wavelength multiplexer WDM MUX 1504 to form a combined beam 1506 which is phase modulated at PM 600' (single sided PM may also be used). Each of the two deferentially-modulated multi-wavelength beams 1520 and 1521 are now split to their wavelengths in wavelength demodulators WDM DMUX 1530 and 1531 respectively.

Beams of same wavelength $\lambda_0$ 1540(0) and 1541(1) enters the electro-optic unit 1000(0) (FIG. 10a) which produces a b-bits result 650(0). Since short light pulses of the time-modulated beam at wavelength $\lambda_0$ passes through PM 600 at times kT, it probes the input voltage $v_{UT}(t)$ at times kT, (k+1)T, (k+2)T, etc.

Similarly, beams of same wavelength $\lambda_j$ 1540($j$) and 1541($j$) enters the electro-optic unit 1000($j$) which produces a b-bits result 650($j$). Since short light pulses of the time-modulated beam at wavelength $\lambda j$ passes through PM 600 at times $kT+\tau_j$, it probes the input voltage $v_{UT}(t)$ at times $kT+\tau_j$, $(k+1)T+\tau_j$, $(k+2)T+\tau_j$, etc.

Data multiplexer Data MUX 1570 combines the results 650(0) to 650($m-1$) to a high rate data stream 1577

The optical multiplexing concept is not new, but it is specifically applied to our novel quantizer structures, running multiple photonic ADCs in parallel, based on optically interleaving m flash-ADC IFEs, using a combination of TDM and WDM, generating m optical combs using m optical comb generators fed by m CW lasers selected on the ITU-T WDM grid. The m optical comb signals (each of distinct wavelength) are successively staggered in time by $kT_{slow}/m$, $k=0, 1, 2, \ldots, m-1$, possibly by slow-light techniques, and optically combined by means of a WDM multiplexer, to generate m interleaved combs, with the separation between successive (different color) teeth of the combs being $T_{fast}=T_{slow}/m$. This effectively generates a system with sampling rate $T_{fast}^{-1}=mT_{slow}^{-1}$. The wavelength and time interleaved comb is input into the pair of antipodal phase modulators which are electrically driven by the voltage under test, as in our disclosed stand-alone flash PADC systems. The optical outputs of the PM modulator(s) are WDM demultiplexed to m output ports, and the corresponding output ports are paired up with ports of the corresponding wavelength from the other signal. Each such pair of optical signals of a given wavelength, is input into an IFE digitizing a particular poly-phase of the fast sampling clock. The digital codes generated from the m interleaved poly-phases are combined into a single digital stream, presented to the output as a parallel word of aggregate width mM.

Projected Flash-ADC Speed-Resolution Performance Initially we direct our stand-alone designs towards bandwidths of 20 GHz, which correspond to 40 Gsamp/sec. This is the spectral width of the atmospheric window for RF transmission, useful for broadband military applications. As for the effective number of ENOBs, it is plausible that the complexity of an IFE circuit with N=32 PC (and 32 post-detection OESD modules, namely RX front-ends and 1-bit ADCs) may still be manageable. Depending on the C&C ability to adaptively tweak the quasi-static phase settings, and due to noises and other impairments, we project that ~1 ENOB of vertical resolution would be lost, yielding 5 ENOBs (due to the phase-wrap around effect, as seen in the PC discussion and further discussed next, our flash photonic ADC with N PCs attains the number of bits $1+\log_2 N$, i.e. for N=32 we may have 6 bits, and losing one effective bit, yields an ENOB of 5.

Notice that a proper speed (or sampling rate) comparison of the proposed photonic flash ADC against electronic flash ADCs must account for the fact that the "hero" electronic flash ADCs typically internally resort to heavy time-interleaving (TI). However, the TI strategy also be applied to our photonic ADC designs, at least to a certain degree, as detailed further below. Therefore the proper benchmark is to consider the speed performance of a stand-alone flash photonic ADC device. E.g. considering the 5 ENOBs 40 GSamp/soc stand-alone system mentioned above, and multiply by a comfortable interleaving factor which may be attained e.g. an interleaving factor of 4, yielding a sampling rate of 160 GSamp/sec.

We later show that by means of a pipelined architecture, aggregating say three 6 bit ADC stages, we may obtain a 6×3=18 bits ADC, and accounting for the loss of 1 ENOB in each stage, plus potentially another 2 ENOBs, we hope to attain a 13 ENOB ADC at 40 Gsamp/sec, and by time-interleaving by a factor of 4, and accounting for additional loss of vertical resolution due to the interleaving, we might attain a 10-11 ENOB 160 Gsamp/sec ADC. All these numbers are preliminary and performance may widely vary as it is dependent on many factors, however the proposed schemes have the potential for much improved performance relative to current PADC schemes, although the precise degree of performance improvement is yet to be quantified.

Impairments and Stability Requirements for the Flash PADC System

The modeling above for the photonic flash ADC system made some explicit and implicit idealized assumptions. A full characterization of the impact of impairments is important in order to determine the ultimate limits of performance.

Our investigation indicates that the following impairments are manageable:
  (i) ADC-nonlinearity
  (ii) Optical powers and losses variance
  (iii) Relative optical delay imbalances
  (iv) Limited BW of the optical sampling comb
  (v) Imbalanced photodiodes:
  (vi) Imbalanced electrical delays into the two push-pull modulators
  (vii) ADC gain err
  (viii) Various noise sources—already addressed above and further analyzed in Appendix A These impairments are now addressed in some detail:
(i) ADC-Nonlinearity:

To the extent the broadband phase modulation process is linear (which it typically is) then there is no built-in ADC non-linearity, unlike the case of amplitude-modulation based ADC quantizers, where the voltage-to-intensity modulation is inherently nonlinear, if a MZ modulator is used (the usage of linearized modulators has its additional problems). In fact, the linearity of our flash ADC is determined by the ability of the C&C system to set up and maintain the correct phase reference levels (ADC transition thresholds $\{\theta_n\}_{n=0}^{N-1}$) to equi-spaced values: $\theta_n=n\Delta$. It is the accuracy of determining these angular levels which affects the ADC non-linearity. By means of adaptive control and calibration techniques we may set the angular transition levels very close to their nominal positions, hence attaining high linearity of the ADC.

(ii) Optical Powers and Losses Variance:

Remarkably, our phase-domain flash ADC scheme is immune to variations of optical powers throughout the photonic circuit, which provides a key advantage of the proposed phase-domain flash PADC. Therefore, in our scheme, ADC performance is enhanced and the requirements on the photonic circuit realization are reduced. There is practically no impairment caused by reasonable variations in the optical losses and resulting optical powers in the various waveguides throughout the IFE photonic circuit; a spread of optical losses or splitting ratios may be tolerated. In particular, the splitting of the two push-pull modulated optical inputs into the IFE does not have to be perfectly balanced; similarly, having somewhat different excess losses in the waveguides connecting the two N-way splitters with the PCs, practically results in negligible degradation, nor does a somewhat uneven splitting ratio practically have an adverse effect. The only effect is a slight reduction in the signal to noise ratio in the PCs which receive less optical power.

(iii) Relative Optical Delay Imbalances

When the two optical combs feeding the two input ports of some or all of the PCs are not synchronized, then their pulses may just partially overlap, or not overlap at all (in the extreme case, of large relative delays pulses may overlaps with an earlier ones, but we shall exclude such case, assuming that the relative delay never exceeds the sampling interval, T). Our detailed analysis shows that that the relative optical delays impairment is in principle correctible, by applying an offset correction $n\Delta \to n\Delta + \eta$ to the commanded transition levels $\theta_n$. The decision rule is still $d_n[k] = \text{sign}\{q_n[k]\}$ Active Measure: Effective Narrowing of the Sampling Pulses:

An analysis of optical delay imbalances suggests the potential of effectively narrowing down the optical comb pulse-width, by means intentionally introducing a relative delay between the two paths, such that the overlap between the S and R pulses at each PC is partial, which makes for a narrower effective pulse. As the finite support optical pulses $p(t-\tau_S)$, $p(t-\tau_R)$ (both of support $\tau_P$) are slid relative to each other, their overlap is reduced by the factor $(\tau_S - \tau_R)/\tau_P$ hence any effective width of the sampling may be attained. The disadvantage of this techniques is that the overall energy of the optical pulse is reduced. However, when the SNR of the system is nominally adequate, it may be possible to trade-off some SNR for improved pulse-width. This opens up the possibility of working with OCGs having wider pulses, while still effectively preventing a frequency-domain roll-off of the sampled signal, which would occur due to the excessive width of the comb pulses. Of course, in addition to the SNR penalty (which may be tolerable), the analysis above also shows that the relative sliding between the optical pulses also introduces offsets into the nominal positions of the transition levels. We have seen that offsets may be corrected by commanding modified values in the slow phase modulators in the reference paths leading to each PC, indicating that if the SNR reduction may be tolerated, intentional sliding of the pulses may provide a way to enhance the effective system bandwidth, hence we should be able to relax the requirements on the OCG pulse-widths.

(iv) Limited BW of the Optical Sampling Comb:

Our derivation above assumed that that the phase $\phi(t)$ under test is essentially constant over the duration of the k-th optical sampling pulse, such that we set $\phi(t) = \phi(kT)$ over the $\tau_P$ duration of the pulse-shape $p(t)$ which is much shorter than the inverse bandwidth of $\phi(t)$ and $v_{UT}(t)$ (ideally $p(t) \propto \delta(t)$). In practice it suffices that optical comb pulse-shape have bandwidth higher than the bandwidth of the signal under test, a condition which is achievable even for very high bandwidth signals under test, assuming a "high-quality" OCG, namely ultra-short pulses satisfying $\tau_P \ll T$ (since this amounts for Nyquist sampling of the signal under test, to having the pulse BW satisfy $B_p \approx \tau_p^{-1} \gg T^{-1} = 2_{v_{UT}}$).

(v) Imbalanced Photodiodes:

Notice that the derivation of Eq. (11) assumed that the optical couplings of the coupler arms to the PDs and the PD responsivities are identical. Deviations from this ideal condition will contribute a term proportional to a linear combination of $|E_S(t)|^2, |E_R(t)|^2$ generating a deterministic offset in the value to be compared (sign-detected), i.e. effectively moving the threshold of sign decision.

(vi) Imbalanced Electrical Delays into the Two Push-Pull Modulators:

Let us assume the push-pull dual-drive phase modulator structure, e.g. as in FIG. 7(a). The broadband phase modulation is a linear process described by a convolution of the modulating voltage with a certain impulse response (depending on the velocity mismatch between the optical and electrical signal along the modulator's length):

$$\phi_\pm(t) = v_{UT}(t - \tau_\pm) \otimes h_\phi^\pm(t), \quad (31)$$

where we have allowed for possibly different modulator voltage-to-phase responses and imbalanced delays in injecting the electrical signal into the two electrical transmission lines, and also imbalanced optical delays which also affect the arrival times of the phase modulations.

It may be seen that only effect of imbalanced phase-modulation responses (as described in (31)) relative to the ideal case of identical phase modulation responses, is some effective additional low-pass filtering of the voltage under test. Generally it is required to use phase modulators of large bandwidth in order not to roll-off the overall photonic ADC response. However, it appears that an imbalance between the two phase modulators delays and responses is of negligible consequence, unless it is very large.

A similar analysis should be performed considering the simultaneous PDs and PM imbalances, or more generally considering all imperfections in unison.

(vi) ADC Gain Error:

Our signal flow analysis above indicates that there is no ADC gain variation per se due to the optical circuit and post-detection electronics. In fact, under the assumptions so far, the ADC gain (average slope of its transfer characteristic) is solely determined by the ratio of the peak voltage and the $V_\pi$ parameter, setting the phase modulation depth, i.e. remarkably it is only a change in the gain of the input electronic stage driving the phase modulator, that can generate an ADC gain change.

Additional ADC Architectures

In addition to the flash PADC architecture, we also have developed PADC structures of the following types: (i) Successive Approximations Register (SAR) PADCs (ii) Pipelined PADCs (iii) OverSampling Sigma-Delta PADCs.

The SAR and Sigma-Delta architectures are based on similar IFE structures, albeit with lower number of directional couplers, trading off speed vs. complexity and resolution. Specifically, the SAR and Sigma-Delta ADCs may take advantage of the ultra-high rate of optical sampling, trading it off for an effective lower rate, while adding a few bits of resolution, yet requiring less complex IFE (with fewer ODCs) relative to that of the flash ADC detailed above. The pipelined ADC presents the opportunity to roughly double or triple the number of effective bits, relative to a single flash ADC, by combining two or three IFEs, by means of a more complex phase modulation photonic circuit.

SAR PADC

Figure 16:
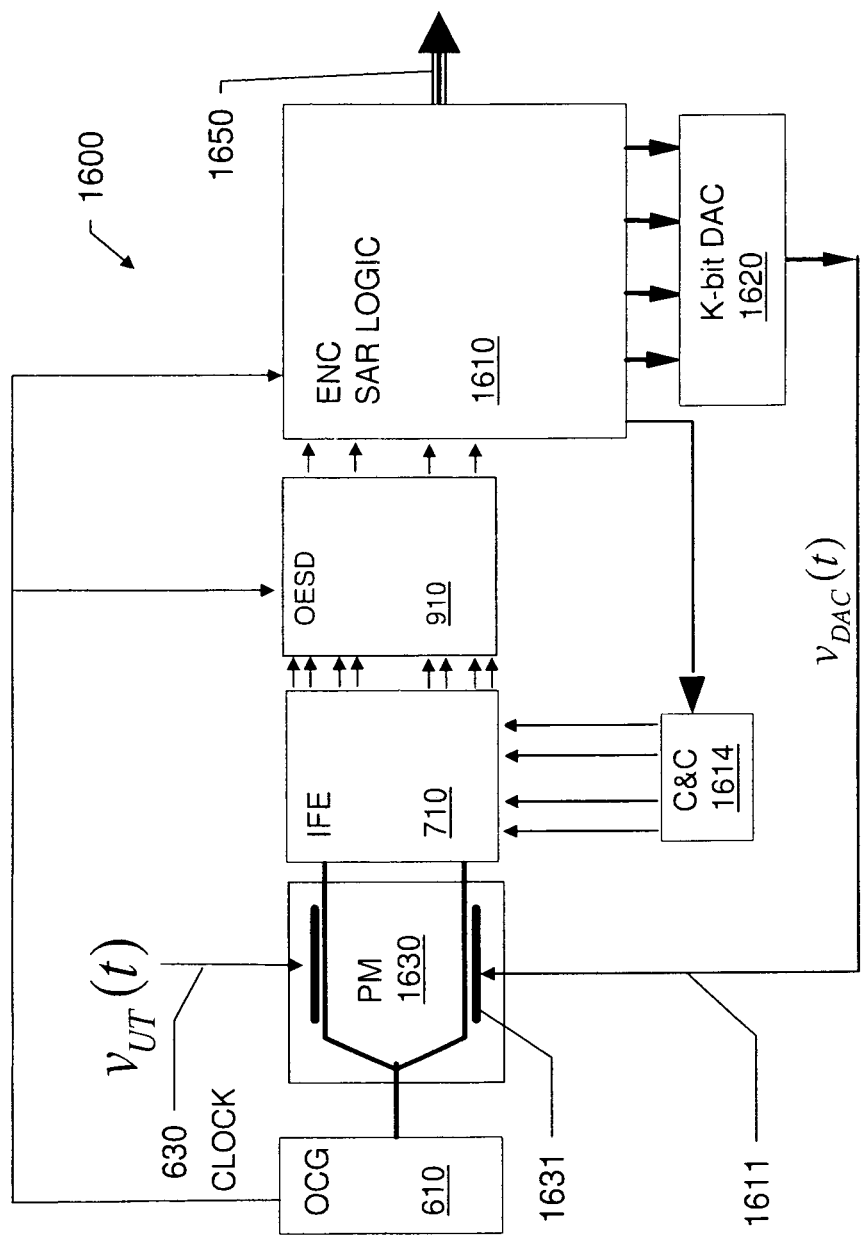
FIG. 16 schematically depicts a SAR PADC system according to an exemplary embodiment of the current invention.

A first embodiment of our SAR PADC is shown in FIG. 16.

FIG. 16 schematically depicts a SAR PADC system 1600 according to an exemplary embodiment of the current invention.

The voltage under test 630 is applied to the upper electrode of the push-pull phase modulator 1630 (having the same structure as used in the Flash PADC seen for example in FIG. 6(b).

The feedback voltage $V_{DAC}(t)$ 1611 from the K-bit DAC 1620 is applied to the lower electrode 1631 of PM 1630. In effect the DAC phase is subtracted from the phase under test, corresponding to the subtractor block 121 in the generic SAR ADC block diagram of FIG. 2a(i). The K-bit DAC is driven by the SAR logic unit 1610, which also drives the C&C module 1614 which adaptively changes the thresholds of the flash ADC (changing the reference voltages controlling the bias phases in the IFE). Final b-bits digitalization results are produced by SAR logic unit 1610 at output 1650.

Note that variety of configurations may replace IFE 710 or OCESD 910 in system 1600. For example ESD 910 may be replaced with 910' or 910". Optionally, offset calibration is also performed as seen in FIG. 10a.

Figure 17:
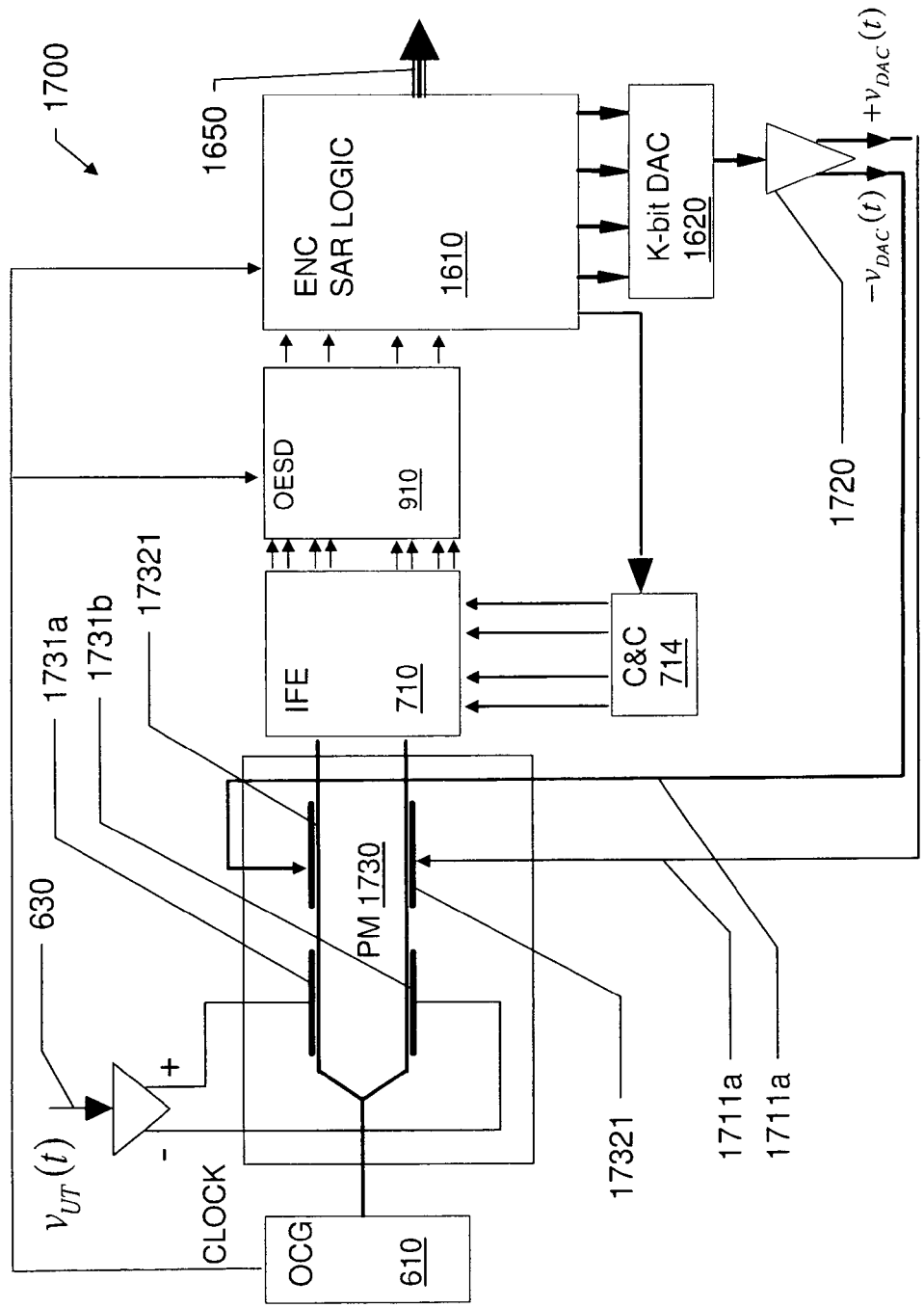
FIG. 17 schematically depicts a SAR PADC system according to an exemplary embodiment of the current invention.

In FIG. 17 we show an additional embodiment of a SAR PADC, with twice-as-sensitive phase modulation due to the usage of push-pull electrodes for both the voltage under test, as well as the voltage generated by the K-bit DAC.

FIG. 17 schematically depicts a SAR PADC system 1700 according to an exemplary embodiment of the current invention.

The first pair of push-pull electrodes 1731a and 1731b is differentially driven by the voltage under test 630, e.g. by means of a differential amplifier with electrical outputs 180 deg out-of-phase, just like in the flash PADC system which we previously introduced. An additional pair of phase modulating electrodes 1732a and 1732b is provided along the same two waveguides. Notice that the upper electrode is driven by $-v_{DAC}(t)$ while the lower electrode is driven by $+v_{DAC}(t)$ created by a dual output amplifier 1720 driven by DAC 1620. The phase accumulated along the upper waveguide by a particular OCG pulse is $$\frac{\pi}{V_\pi}[v_{UT}(t) - v_{DAC}(t)]$$

whereas the phase accumulated along the lower waveguide is $$\frac{\pi}{V_\pi}[-v_{UT}(t) + v_{DAC}(t)].$$

The phase difference at the IFE input is the difference of these two accrued phases:

$$\frac{\pi}{V_\pi}[v_{UT}(t) - v_{DAC}(t)] - \frac{\pi}{V_\pi}[-v_{UT}(t) + v_{DAC}(t)] = \quad (32)$$

$$2\frac{\pi}{V_\pi}[v_{UT}(t) - v_{DAC}(t)]$$

Notice the "push-pull" factor of 2 gain in phase modulation efficiency, relative to the embodiment of FIG. 16, wherein the phase difference at the IFE input is just $$\frac{\pi}{V_\pi}[v_{UT}(t) + v_{DAC}(t)].$$

One issue with the SAR schemes disclosed in FIGS. 16 and 17 is the difficulty of realizing good K-bit DACs 1620 at ultra-high speeds.

This deficiency is addressed in the embodiments of FIGS. 18 to 22, in effect realizing a very efficient photonic DAC (to be internally used within the SAR PADC architecture).

Figure 18:
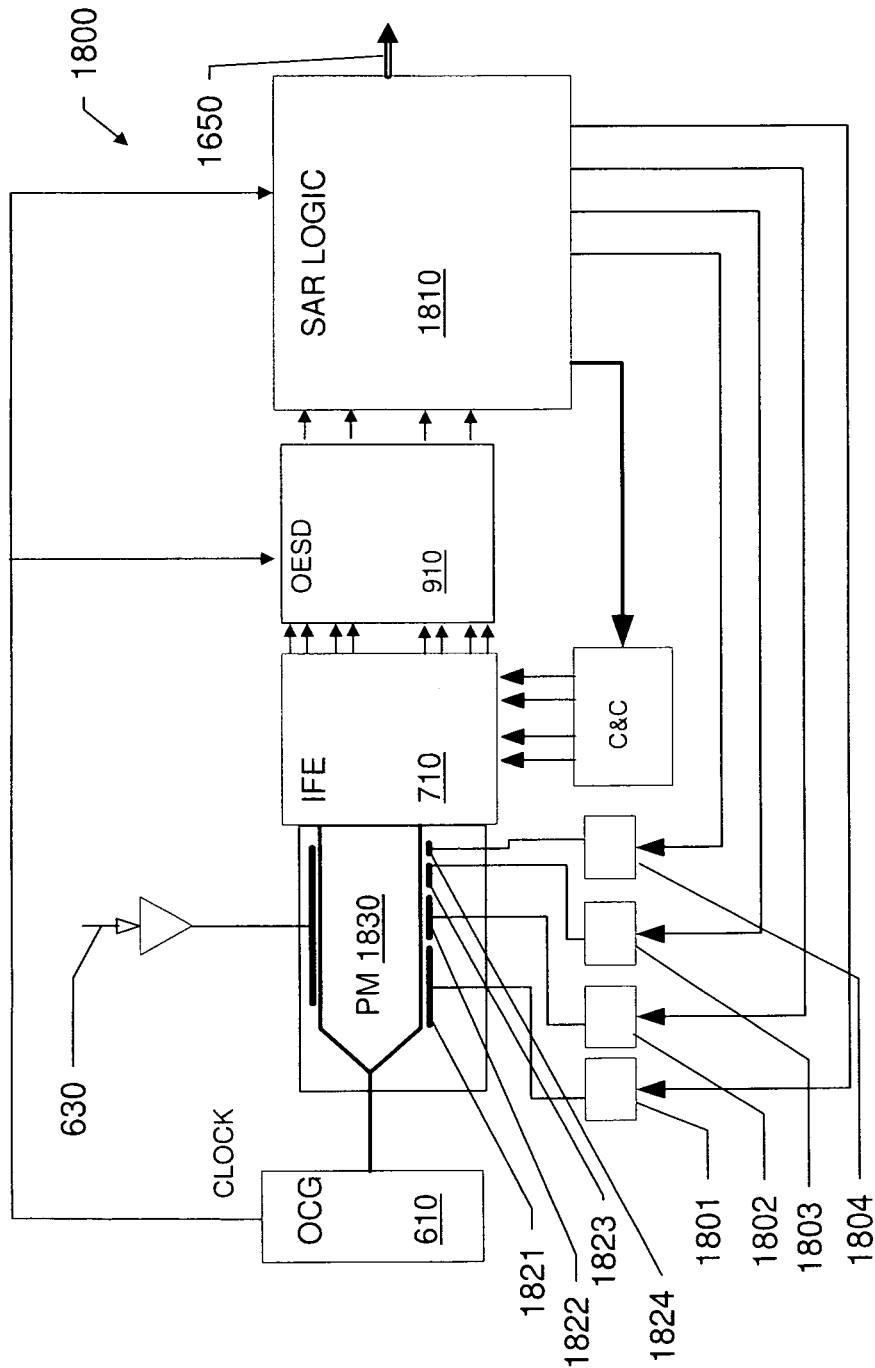
FIG. 18 schematically depicts a SAR PADC system using a multi-1-bit DAC, feedback electrodes with a power-of-two-sequence of lengths, single-ended modulation and an IFE with N phase comparisons according to an exemplary embodiment of the current invention.

FIG. 18 schematically depicts a SAR PADC system 1800 using a multi-1-bit DAC, feedback electrodes with a power-of-two-sequence of lengths, single-ended modulation and an IFE with N phase comparisons according to an exemplary embodiment of the current invention.

Figure 19:
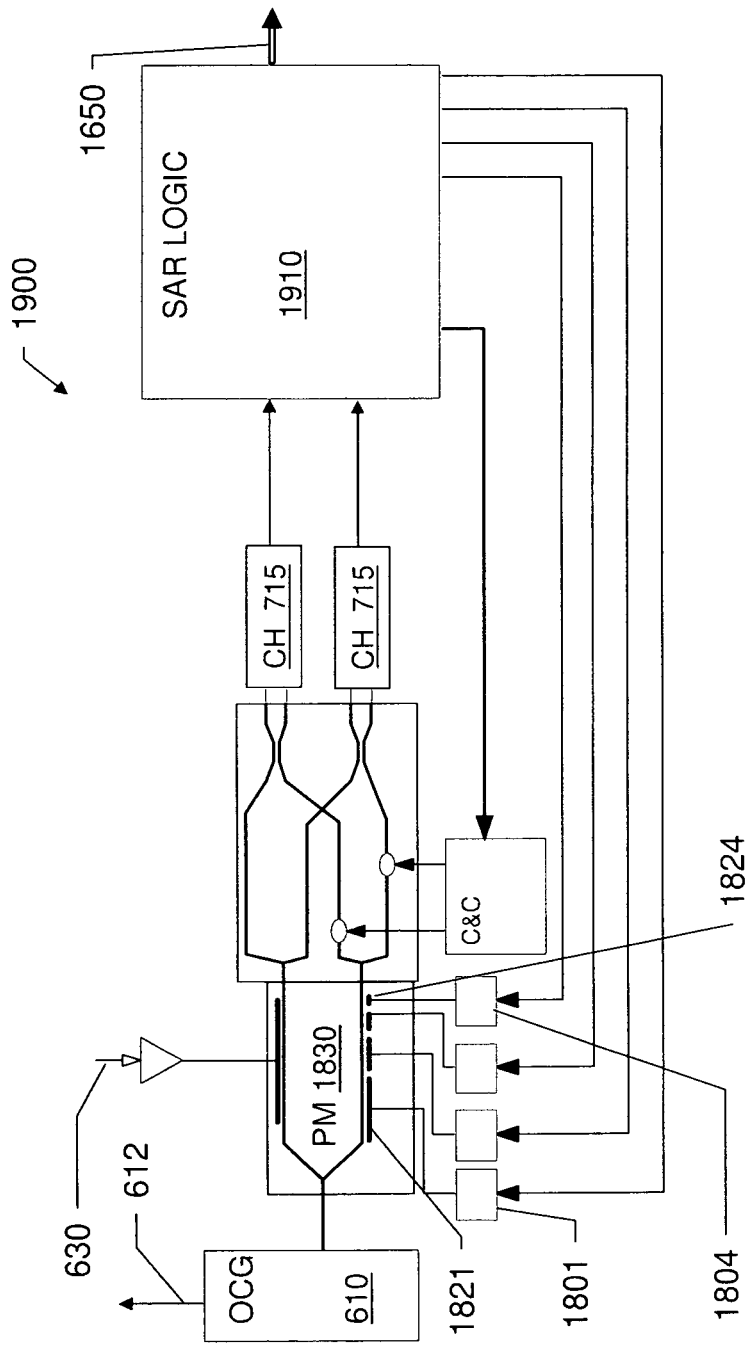
FIG. 19 schematically depicts a SAR PADC system using a multi-1-bit DAC, feedback electrodes with a power-of-two-sequence of lengths, single-ended modulation and an IFE with two phase comparisons according to an exemplary embodiment of the current invention.

FIG. 19 schematically depicts a SAR PADC system 1900 using a multi-1-bit DAC, feedback electrodes with a power-of-two-sequence of lengths, single-ended modulation and an IFE with two phase comparisons according to an exemplary embodiment of the current invention.

Figure 20:
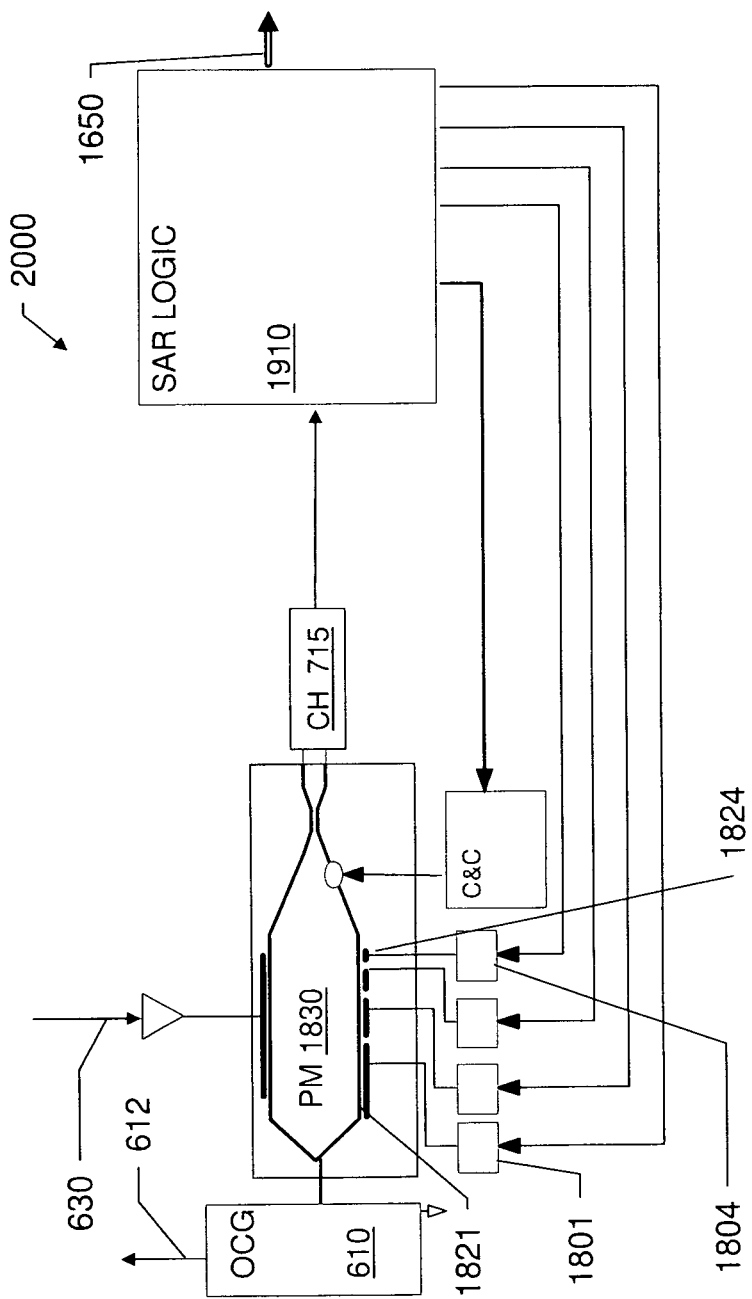
FIG. 20 schematically depicts a SAR PADC system using a multi-1-bit DAC, feedback electrodes with a power-of-two-sequence of lengths, single-ended modulation and an IFE with a single-phase comparison according to an exemplary embodiment of the current invention.

FIG. 20 schematically depicts a SAR PADC system 2000 using a multi-1-bit DAC, feedback electrodes with a power-of-two-sequence of lengths, single-ended modulation and an IFE with a single-phase comparison according to an exemplary embodiment of the current invention.

Figure 21:
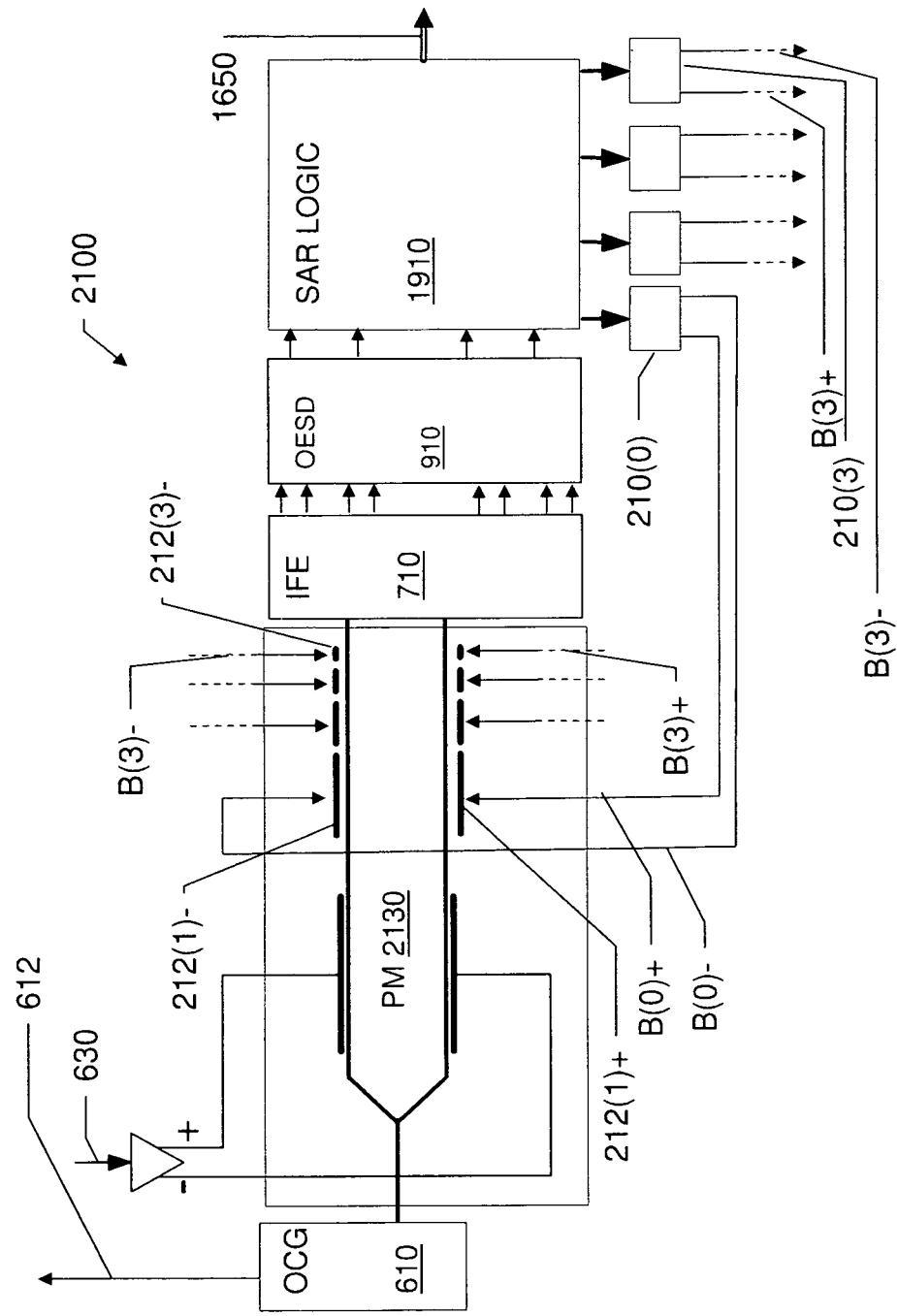
FIG. 21 schematically depicts a SAR PADC system using a multi-1-bit DAC, feedback electrodes with a power-of-two-sequence of lengths, push-pull modulation and an IFE with N phase comparisons according to an exemplary embodiment of the current invention.

FIG. 21 schematically depicts a SAR PADC system 2100 using a multi-1-bit DAC, feedback electrodes with a power-of-two-sequence of lengths, push-pull modulation and an IFE with N phase comparisons according to an exemplary embodiment of the current invention.

The idea is to partition the DAC-driven electrode(s) into multiple "sub-electrodes" 1821 to 1824 of lengths forming a dyadic (powers-of-two) sequence i.e. $\{L, L/2, \ldots, L/2^b\}$.

As shown in FIGS. 18 to 20 single end modulation is used in PM 1830. In contrast, push-pull electrodes configuration is used in PM 2130 and 2230 of FIGS. 21 and 22 respectively.

Each of the "sub-electrodes" 1821 to 1824 is driven by a 1-bit DAC 1801 to 1804 respectively, which simply consists of an on-off voltage (with the on level properly calibrated) as commanded by one control bit supplied by SAR LOGIC 1810.

Although four sub electrodes are seen, more or less sub electrodes may be used.

The 1-bit DAC 1821 to 1824 are then synonymous to a linear electronic amplifier, driven by a well-calibrated unipolar (zero/high) logic signal. The drivers of these sub-electrodes amount to independent 1-bit DACs in turn driven by a string of 0/1 bits as commanded by the SAR logic section. The phase-shifts generated by these electrodes are $\{\pi, \pi/2, \ldots, \pi/2^b\}$. In detail, the n-th sub-electrode (n=0, 1, 2, \ldots, K-1, with 0 the most significant bit) is driven by the n-th bit of the K-bit word that we wish to DAC. As the n-th sub-electrode has length $L/2^n$, hence switching voltage $V_\pi[n] \propto (L/2^n)^{-1} \propto 2_n$ (with, it is seen that the phase accrual due to the n-th electrode is $\propto 2^n$, hence upon summing up all the phase modulation contributions due to all the electrodes, we generate a phase proportional to the analog representation $$\sum_n b_n 2^n$$

of the binary word, i.e. we have DAC-ed (D/A converted) the digital string $b_0 b_1 \ldots b_{k-1}$ into a DAC phase $$\theta_{DAC} \propto \sum_n b_n 2^n.$$

The binary-sequence of phase modulating electrodes, driven by the 1-bit DAC drivers, then provides an efficient photonic implementation of an ultra-high-speed K-bit DAC (e.g. 137 in FIG. 2b), with its analog output generated in the optical phase domain. Notice that similar electrode structures were used for previously proposed ADC with amplitude modulation [28, 29], however in those systems nonlinear distortion is generated, whereas our proposed scheme is distortion-free. The Photonic DAC (PDAC) in [28], is highly non-linear as the dyadic electrodes structure is used within an amplitude modulating Mach-Zehnder (MZ) interferometer, which has a non-linear (sine-like) transfer characteristic and complex schemes are applied in [29] to attempt to overcome the non-linearity. As a result the structures disclosed in [28,29] requires complicated electronic calibration of voltages to pre-distort the modulator non-linearity. In contrast, our invention is based on linear phase modulation (rather than non-linear amplitude modulation), hence there is no need for non-linear compensation of the sub-electrode voltages, and in fact all the 1-bit DACs driving the sub-electrodes should nominally have the same on-voltage (and zero off-voltage). An off-line or periodic calibration procedure may be run to fine-tune all these voltages to equal nominal level. In summary, what is novel here re PDAC is not the dyadic-sub-electrodes structure itself, but its usage in conjunction with linear phase modulation within our phase-domain PADC.

The SAR PADC system disclosed in FIG. 18 corresponds to that of FIG. 16 (upper electrode driven by the voltage under test, while lower electrode driven by the DAC) except that the implementation of the K-hit DAC is more precise by means of the 1-bit DACs and the dyadic-lengths sequence of sub-electrodes.

FIG. 19 discloses a scheme which is a special case of FIG. 18, whereby the IFE consists of a two PCs (HC 715) structure amounting to I&Q detection. In the first cycle, all DACs are set to zero, and the system detects the quadrant in the complex plane in which the voltage under test falls in (amounting to 2-bit quantization in the phase domain). Let the quadrant index be denoted by q$\epsilon$(0, 1, 2, 3). In the 2nd cycle the DACs are set to such a value as to generate the reference phase $\theta[2]=2\pi(q/4+1/8)$ which bisects the quadrant that the actual phase-under-test is in. Now we may determine which half-quadrant the phase-under-test is in (indexed by $h_2\epsilon(0,1)$. Next we set up a reference phase $\theta[2]=2\pi(q/4+1/8+h_2/16)$ bisecting the half-quadrant into two quarter-quadrants, and so on, terminating the process when we run out of 1-bit DACs. This description may be generalized to apply to the operation of all our SAR ADC variants.

FIG. 20 discloses a scheme which is a special case of FIG. 18, whereby the IFE comprises a single PC structure CH 715 amounting to photonic sign detection.

The SAR PADC system disclosed in FIG. 21 corresponds to that of FIG. 16, except for the usage of dyadic-lengths sub-electrodes and 1-bit DACs. In this exemplary embodiments, a push-pull structure which is twice as efficient in its phase modulation is used in PM 2130 for both input signal 630 and the differential outputs of the 1-bit ADCs 210(0) to 210(3). As can be seen, positive output b(0)+ of 1-bit differential ADC 210(0) is connected to electrode 212(0)+. Similarly, negative output b(0)− of 1-bit differential ADC 210(0) is connected to electrode 212(0)−. The rest of electrodes 212(1)+ to 212(3)− are similarly connected to positive and negative output of 1-bit ADCs 210(1) to 210(3)

Figure 22:
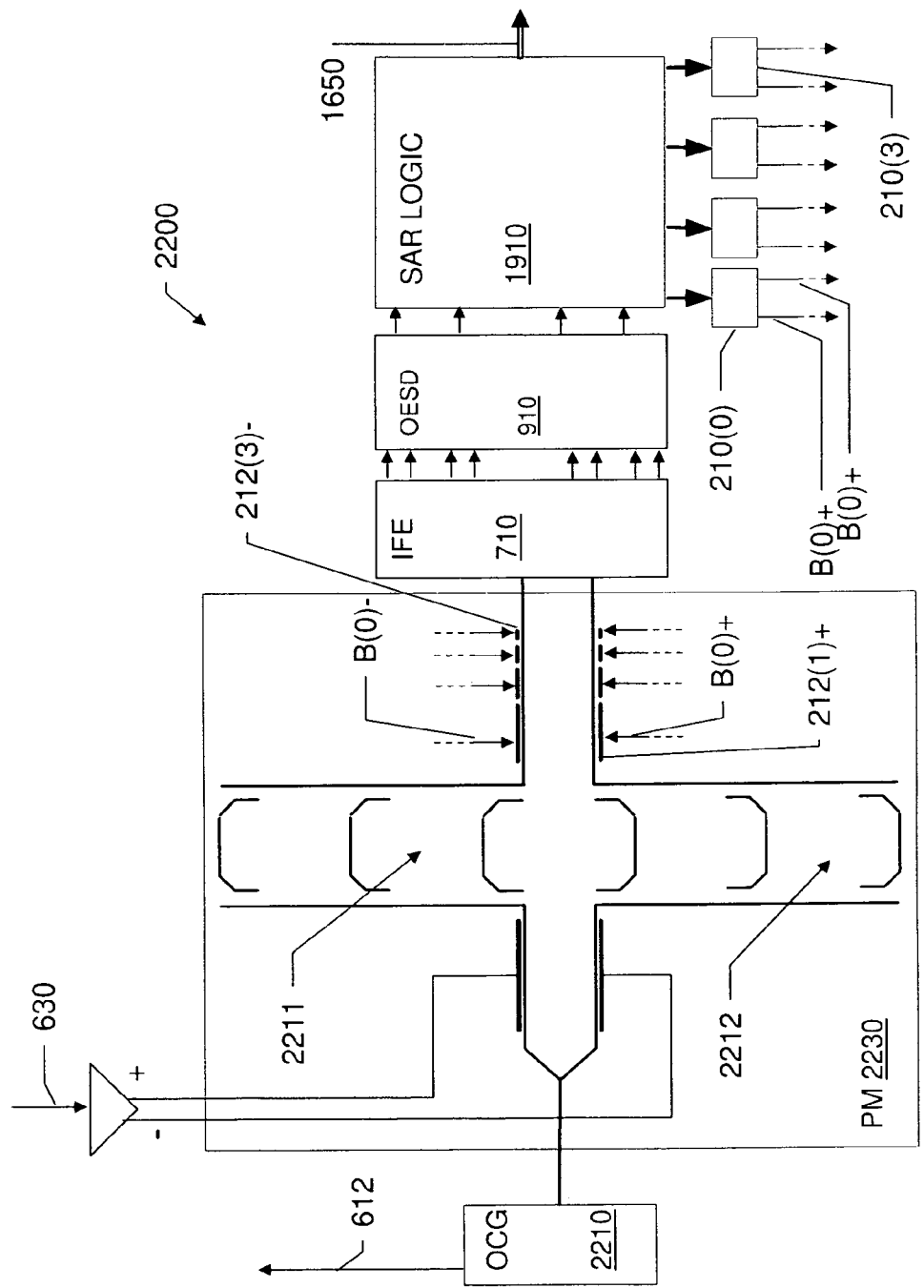
FIG. 22 schematically depicts a Successive Approximation Register (SAR) architecture 2200 using multi-1-bit DAC, feedback electrodes with a power-of-two-sequence of lengths, push-pull modulation, IFE with N phase comparisons, with photonic sample&hold by means of optical tapped delay lines according to preferred embodiment of the current invention.

FIG. 22 schematically depicts another Successive Approximation Register (SAR) architecture 2200 using multi-1-bit DAC, feedback electrodes with a power-of-two-sequence of lengths, push-pull modulation, IFE with N phase comparisons, with photonic sample&hold by means of optical tapped delay lines according to a another embodiment of the current invention.

The system 2200 disclosed in FIG. 22 addresses a deficiency of our previous SAR systems:

It takes several cycles to quantize the voltage under test and we made the assumption is that the voltage under test changes little during the several cycles it takes to complete the SAR PADC action. Hence there may be an impairment due to the potential variation of the voltage under test over the SAR PADC cycles, To address this impairment, may introduce a photonic sample-and-hold, presenting our SAR PADC with replicas of the phase modulated pulse. To this end we introduce in FIG. 22 a SAR PADC system with two tapped delay lines 2211 and 2212 (optical transversal filters) inserted between the input-driven phase modulators and the DAC-driven phase modulators. Then, as a pulse from the OCG 2210 passes under the first pair of push-pull electrodes and is imparted a phase modulation corresponding to a sample of the voltage under test 620, the same pulse propagates through the two tapped delay lines 2211 and 2212, generating several replicas of itself. The first replica pulse is then used in the first cycle of the SAR, the $2^{nd}$ replica pulse is then used in the $2^{nd}$ cycle of the SAR, etc. Note that while OCGs 610 of FIGS. 16 to 20 produces one optical pulse per SAR ADC cycle, OCG 2210 of FIG. 21 produces one pulse per SAR ADC conversion.

Preferred Embodiment of Successive Approximation Register PADC

A conventional Successive Approximation Register (SAR) ADC [17] implements a binary search in b steps, rather than a parallel search in 2b steps, zooming in onto the signal-under-test, by a factor of two in each step. Our preferred SAR-PADC realization will utilize multiple phase re-modulations by quantized values and a sequence of successive phase measurements, doubling the precision of each approximation stage relative to the previous one. This is the first time to the best of our knowledge that such an approach has been introduced to photonic ADC. Our SAR-PADC differs from its conventional electronic counterpart in that the successive approximations are performed sequentially in time and distributed in space in a feed-forward spatial arrangement. This incurs a latency of bT, which is inconsequential for most applications.

Figure 34:
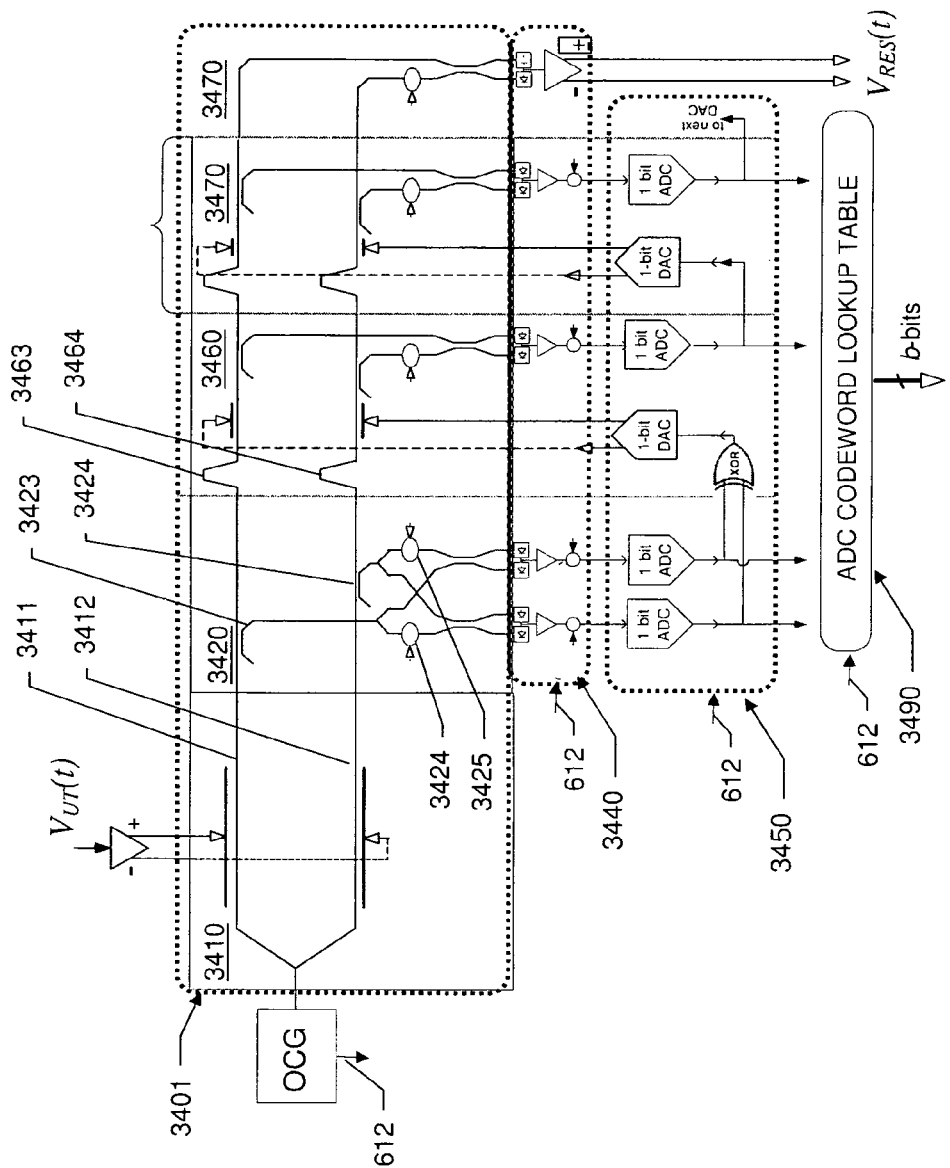
FIG. 34 schematically depicts a SAR PADC system according to an exemplary embodiment of the current invention.

FIG. 34 schematically depicts a SAR PADC system 3400 according to an exemplary embodiment of the current invention.

System 3400 follows identical optical sampling as the flash PADC, cascaded interferometric measurement stages converge on the phase value by successively remodulating the sampled phase values with quantized phases leading to the ADC codeword. Photonic delay between stages is required in this feed-forward solution. The SAR PADC is terminated at the back end with a residual phase measurement with electrical (analog) output in support of pipelining.

The scheme disclosed in FIG. 34 first determines the phase under test to an accuracy of $\pi/2$(quadrant determination), followed by a refined assessment improving the accuracy to $\pi/4$, i.e. determining which one of the two octant halves of the quadrant the phase under test belongs to, then followed by a refined assessment improving the accuracy to $\pi/8$, which determines one of the two halves of the previously determined octant, and so forth. The SAR-PADC scheme indeed performs a binary search, zooming in onto the unknown phase under test to an angular precision of $2\pi/2^b$.

Trains of coherent light pulses is generated by the source OCG which also generates the clock 612.

Light then enters the photonic integrated circuit (PIC) 3401. Preferably, PIC 3401 is an integrated electro-optical structure.

In phase modulator 3410, the light is split to first and second branches 3411 and 3412 respectively, which are oppositely phase modulated by test voltage $V_{UT}(t)$.

In quadrant PHD stage 3420, a portion of the first and second branches 3411 and 3412 are sampled by corresponding splitters 3423 and 3424. From the sampled light, two bits approximation of the test signal is obtained by following for example the method seen in FIG. 9. In a variation to FIG. 9, phase shifts 3424, 3425 are applied slightly differently. These phase shifter may also be used for trimming and calibrating the relative phases.

In the depicted embodiment, optical detection, amplification and optional drift compensation is performed by an integrated InP receiver array 3440. Preferably, receiver array 3440 integrate all the optical receiver channels and is optically directly interfaced with PIC 3401.

A Data Conversion Array 3450 is preferably a high speed InP Application Specific Integrated Circuit (ASIC). It may be integrated with array 3440, or separated. The two bits regenerated by the two 1-bit ADCs are XORed and drive a 1-bit differential DAC that drives the phase modulators in the third bit extractor section 3460.

Third bit extractor section 3460 comprises an optical delays 3463 and 3464, delaying the light in branches 3411 and 3412 such that light pulse arrival to modulator in section 3460 coincides with stabilization of voltage, generated by the 1-bit DAC of the previous section on the phase modulator in that section. The light is then again sampled by beam splitters, and a single third bit is extracted.

An identical forth bit extraction section 3470 may follow. More bit extraction sections may optionally be used.

Optionally, the PIC may be terminated by residual voltage extractor 3480 which transforms the residual phase difference between branches 3411 and 3412, after influence of the phase modulators in sections 3460, 3470 etc., into residual analog voltage $V_{RES}(t)$ which may be used for driving a similar photonic ADC, in accordance to pipelining concept.

A post processing circuit, such as ADC codeword lookup table 3490, realized for example in an ASIC combines the results from all the 1-bit ADCs to a multi-bit result. Preferably ADC codeword lookup table 3490 is implemented as Si ASIC.

Figure 35:
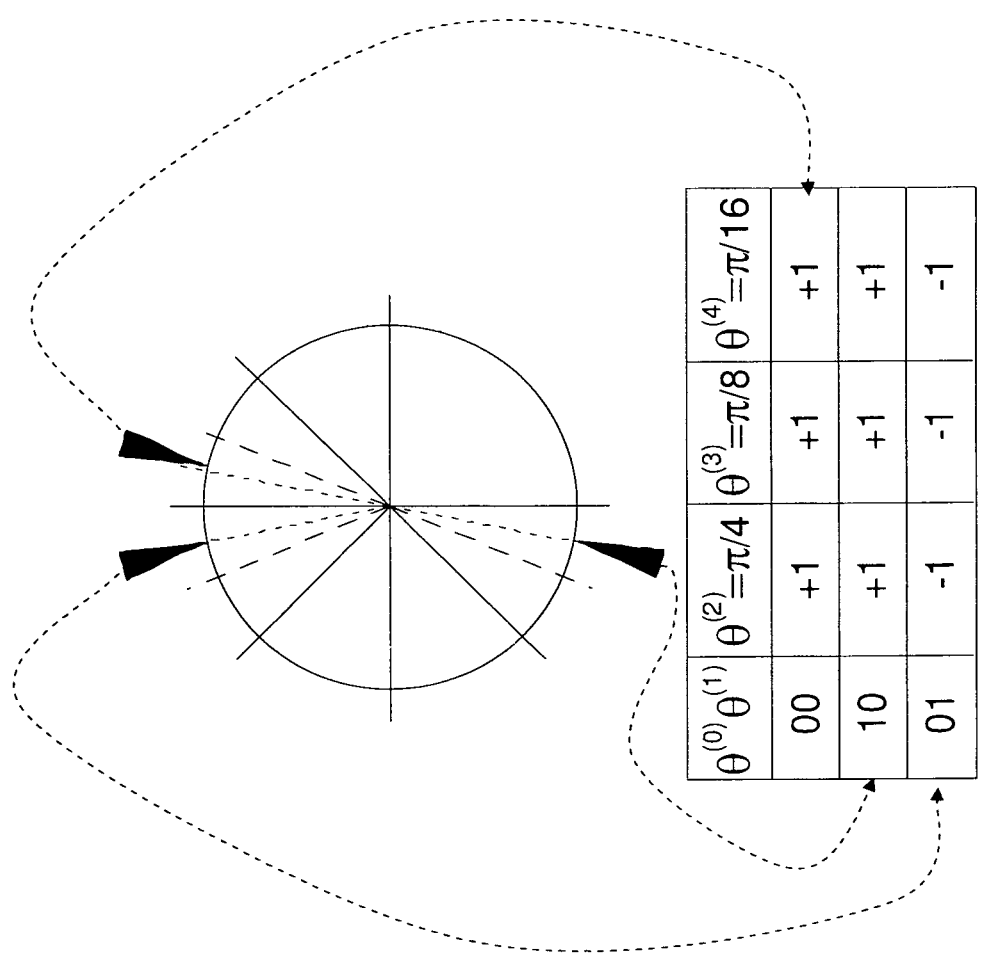
FIG. 35 depicts a phase state demonstration of principle for three exemplary phase values for a SAR PADC according to exemplary embodiment of the current invention.

FIG. 35 is a phase state demonstration of principle for three exemplary phase values (Measurement table demonstrates successively smaller phase rotations leading to convergence to phase under test across the full $2\pi$ dynamic range.

Dashed arrows associate the angles to the corresponding row in the table).

An exemplary sequence of phase approximations is shown in FIG. 35.

The SAR structure incorporate new elements, not present in the flash-PADC: b-2 phase modulators, 1-bit DACs driving these modulators, and optical delays. These extra elements are grouped in stages, referred to as bit extractors, as each such stage extracts one extra bit. Note that the initial stage is not a bit extractor but rather a 2-bit flash ADC to determine the quadrant, realized with just two P-CMPs, as in Quadrature Phase Shift Keying (QPSK) detection. This stage is referred to as QPSK Phase Detector (PHD). Notice that the quasi-static phase-shifts $\theta_I$ 3424 and $\theta_Q$ 3425 in its two phase detector arms are such as to set the two angular thresholds for this stage to equal 0 and 90 degrees, i.e. indeed separate the angular full-scale into four quadrants. Each of the subsequent bit extractor stages consists of a push-pull phase modulator, referred to as phase rotator, driven by a 1-bit DAC, followed by our now-standard Phase Comparator (P-CMP), realized as a directional coupler, balanced detection, and 1-bit ADC, such that the sign of the optical phase difference at the corresponding pair of taps is generated and is sign-quantized.

The QPSK PHD determines the quadrant in which the phase under test resides, zooming in to an accuracy of $\pi/2$. The two bits provided by the QPSK PHD form the Grey code 10,11,01,00 corresponding to quadrants I, II, III, IV, respectively. The XOR of these two bits generates 1 for quadrants I, III and 0 for quadrants II, IV. The phase rotator modulator in the fist bit extractor is driven by the XOR signal, applying the rotation $\theta_+^{(1)}=+\pi/4$ for quadrants I and III, or $\theta_-^{(1)}=-\pi/4$ for quadrants II and IV, to serve as angular bisector thresholds for the selected quadrant for the phase comparison occurring in the P-CMP of the first bit extractor. The following P-CMP stage now measures the sign of phase difference $\phi^{(1)}=\phi-\theta^{(1)}$ between the two waveguides at the first phase rotator output. The P-CMP determines $\phi^{(1)}>0\widehat{(x)} \Leftrightarrow >\theta^{(1)}$, or $\phi^{(1)}<0 \Leftrightarrow <\theta^{(1)}$.

Having bisected the quadrant within which the phase-under-test falls in, the P-CMP essentially determines in which of these two half-quadrant sectors the phase-under-test actually falls into. Hence, at this point we have zoomed in onto a particular half-quadrant sector ($\pi/4$ uncertainty), i.e. we have extracted our third bit. The next bit extractor stage's role is to slice the half-quadrant sector into two quarter quadrant sectors ($\pi/8$), and phase compare in which half the phase-under-test resides. This is done by the phase rotator of the next (second) bit-extractor adding or subtracting an angle of $\pi/8$ to/from the current $\pm\pi/4$ angle of the angular threshold (as set in the former bit extractor stage), effectively bisecting the target half-quadrant, performing the P-CMP function and slicing the result (deciding on our fourth bit). This process continues with the fifth bit ($\pi/16$ uncertainty) and so forth to the desired accuracy, by propagating the light through bit-extractor stages, with their phase rotations driven by the 1-bit ADC decisions of the preceding stages. In practice the angular zoom-in process should stop when the accuracy of setting the angular threshold becomes of the order of the size of the angular sector that we are trying to zoom into.

Notice that all the phase errors in the successive setting of the angular thresholds in each of the bit-extractors are accumulated. Fortunately, the angular accuracy in each step is not absolute, but is relative to the size of the target sector at that stage. To see why this is the case, recall that in each successive bit-extractor we use a phase modulator which is twice as insensitive (in its voltage to phase conversion) as compared to the previous bit-extractor stage, since its length is halved and its $V_\pi$ is doubled. Hence electrical set-up bias errors or noise, which are generated at a certain level by the 1-bit DACs, tend to be of the order of a fixed fraction of the sector angle, and since the sector angles form a geometric sequence with ratio ½, the errors and noise, which are typically independent, add up on an RMS basis with successive contributions rapidly converging to zero. Essentially, DAC degradations, if any, are dominated by the first DAC stage. This point is quantified in the SNR analysis to follow.

The 1-bit DAC, driving the phase modulator of the successive stage is essentially a precision bipolar pulse generator, producing the fast electrical pulse $\pm v_{DAC}(t)$ (with support less than the sampling interval T), with polarity controlled by a single input bit, the Boolean value of which depends on the digital output of the previous stage (XOR operation for the first stage). The pulse-shape, $v_{DAC}(t)$, its amplitude, and relative delay are adjusted (once) such that the relative phase-shift imparted on each pair of optical pulses propagating in the two push-pull branches of the modulator, equals $\pi/4$ in the first bit extractor, and forms the geometric sequence $\pi/8$, $\pi/16$, $\pi/32$, etc. for the additional bit extractors.

The light propagating on the optical bus is tapped to the b P-CMPs by means of directional couplers. For optimal operation, the tapping ratios of these couplers should be adjusted to provide equal light power to each of the P-CMP, while accounting for the optical losses. Small deviations from the equal power condition will merely cause a minor degradation in SNR (a small ENOB penalty).

Comparison of Our Flash and SAR PADCs

It is instrumental at this point to compares the Flash and SAR PADC implementations and their distinguishing features, shown in Table I. The key advantages of the proposed SAR PADC architecture over the Flash PADC are the reduction in P-CMP (phase comparisons) leading to lower optical power requirements (linear scaling with the number of bits b as opposed to exponential); moreover, the architecture is amenable to ADC pipelining using two or more SAR devices (FIG. 36), such that the number of bits can be increased to 10 or more. E.g. it is possible to realize a 12-bit PADC (leading to about 10 ENOB) by pipelining SAR stages, e.g. 3 SAR stages of 4 bits each or 2 SAR stages of 6 bits each.

Pipeline ADC

Here the electrical signal under test phase-modulates the OCG train in two separate branches. In the 2nd branch the DAC-ed signal is subtracted off it.

The block diagram of a generic pipeline ADC of the art was shown in FIG. 3. As reviewed further above, the concept is to subtract a coarse quantization from the signal under test, amplify the residual signal and re-quantize it, and so forth.

FIGS. 23 to 26 schematically depict a photonic pipeline ADCs systems according to an exemplary embodiments of the current invention.

Figure 23:
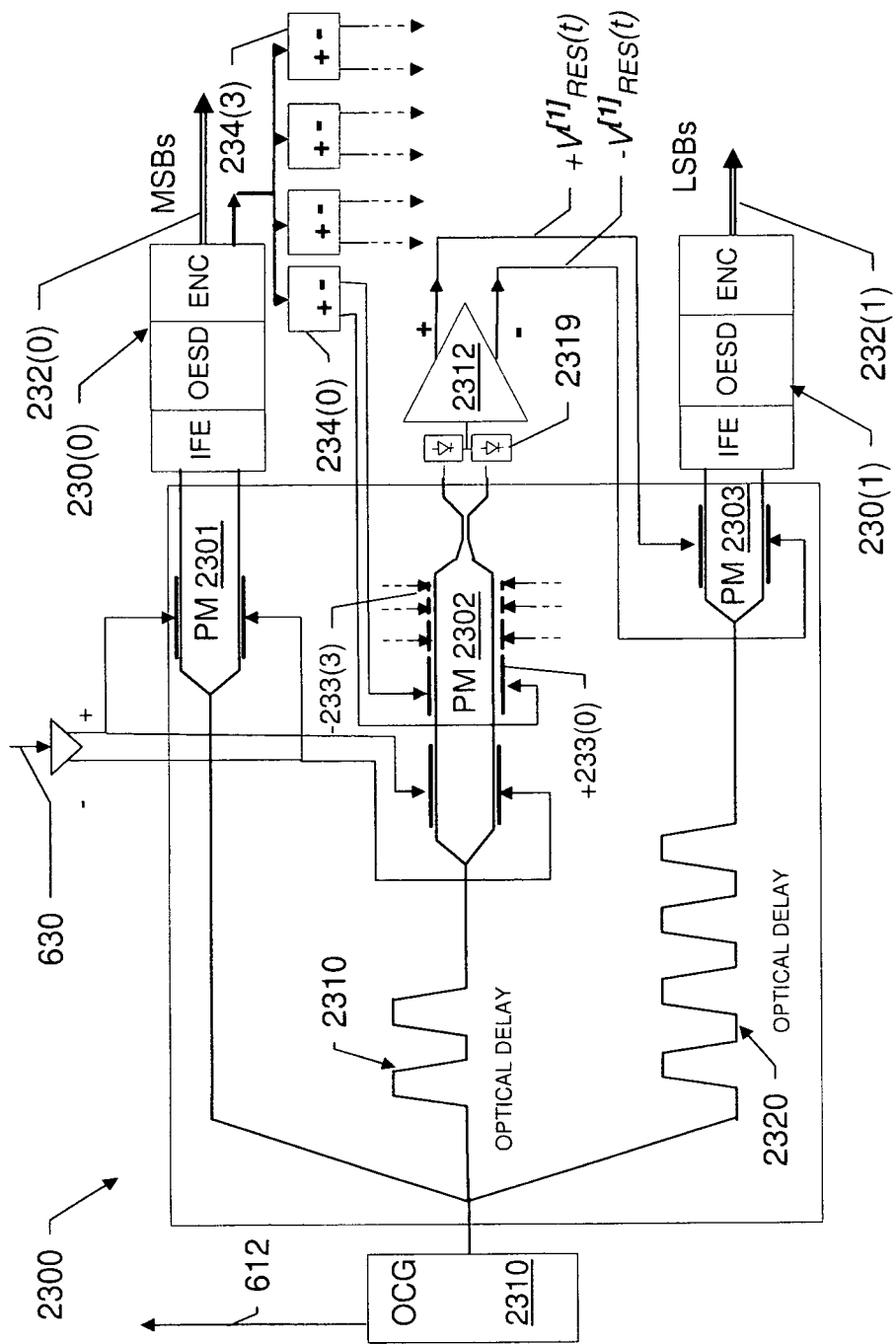
FIG. 23 schematically depicts a photonic two-stage pipeline ADC system according to a first exemplary embodiments of the current invention.

FIG. 23 schematically depicts a photonic two-stages pipeline ADC system 2300 according to a first exemplary embodiments of the current invention.

In a first embodiment of our pipeline PADC (FIG. 23), there are three sections of the system.

The first flash-ADC 230(0) receives light which was deferentially phase modulated in PM 2301 by input signal 630. Flash ADC 230(0) generating the coarse quantization 232(0) (the MSBs of the ADC output). It also drives an electrical-to-optical phase DAC consisting in our preferred embodiment of multiple 1-bit push-pull electronic DACs 233(0) to 233(3) driving electrodes +234(0) to −234(3) having lengths ratios 1:½:¼, etc., in section PM 2302 of the mid described next. The mid section, similar to the modulation section in the SAR PADC of FIG. 21, acts as an optical phase subtractor. The voltage under test 630 is applied again onto a pair of push-pull modulating electrodes. From its induced phase we subtract off the quantized DAC-ed signal (by means of the segmented electrodes +233(0) to −232(3) in ratios 1:½:¼ which are driven by the 1-bit DACs 234(0) to m234(3) respectively. After photo-detection by balanced photodiode pair 2319 and push-pull linear electrical amplification 231(0), an analog voltage $\pm v_{RES}^{(1)}$ (the first residual) is generated.

This voltage is quantized in the bottom section, which is just our flash-PADC (e.g. as in FIG. 7), comprising PM 2303 and flash ADC 230(1) providing the finer resolution bits 232(1), the LSBs.

Notice the optical delays 2310 and 2320 which are provided to synchronize the arrival of the optical pulse and the RF signals in each phase modulator. Successively larger optical delays must be provided, as the generation of the residual requires that the coarse quantization be accomplished first, and the $2^{nd}$ quantization presumes that the residual has already been generated.

Figure 24:
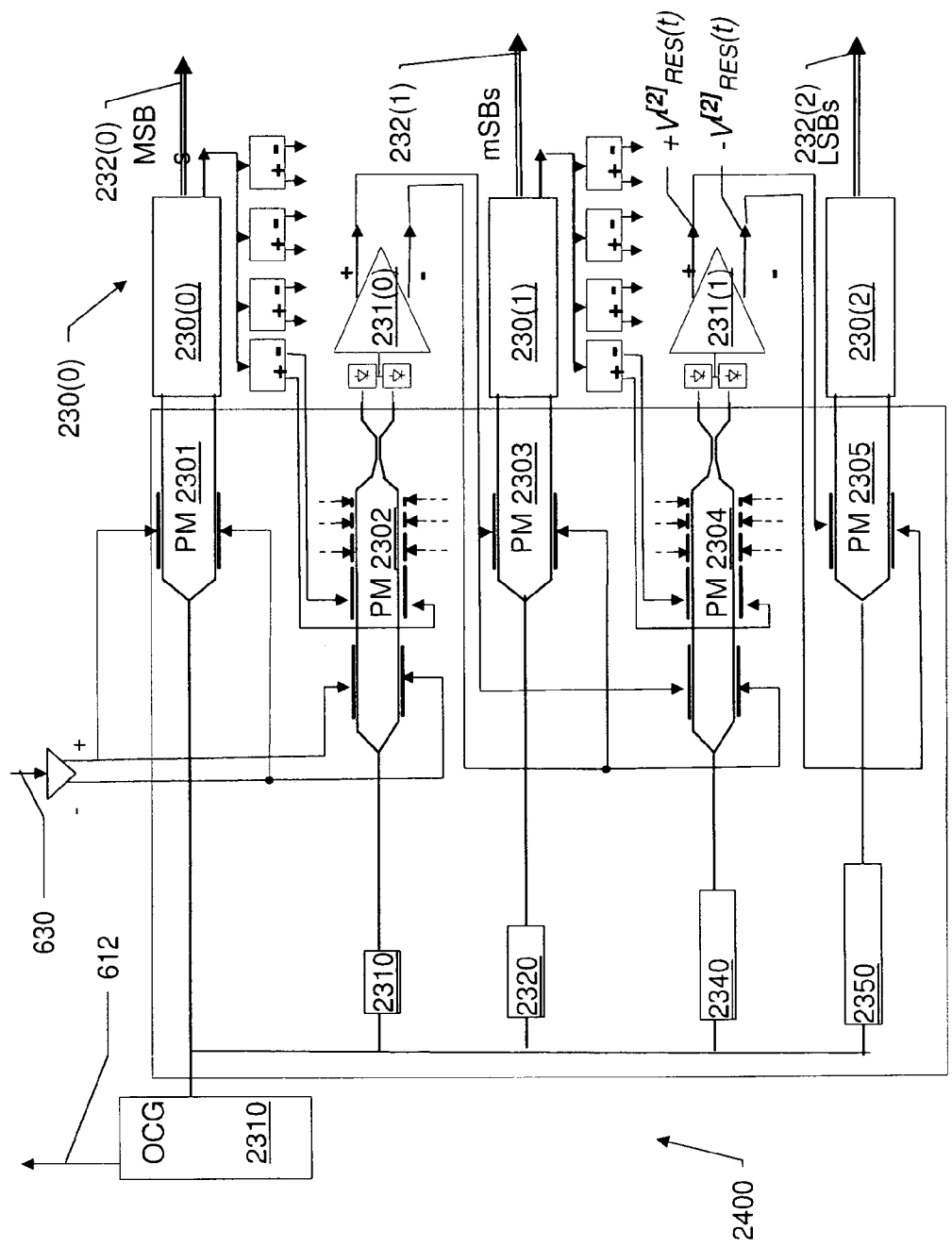
FIG. 24 schematically depicts a photonic three-stage pipeline ADC system according to another exemplary embodiments of the current invention.

FIG. 24 schematically depicts a photonic three-stages pipeline ADC system 2400 according to another exemplary embodiments of the current invention.

It is easy to see that the pipeline concept may be repeated by duplication of the mid and bottom sections of FIG. 23. FIG. 24 depicts an example of three-stages pipeline, however it is clear to see the modular construction.

In FIG. 24, the two-stage concept of FIG. 23 is extended from two to three pipeline sections. The top three sections are as in the two-stage system, except that the output of the quantized first residual is now quantized providing the "middle Resolution Bits" 232(1) (mSBs). This quantization is subtracted from the output of amplifier 231(0) in the phase domain off the analog version of the first residual in the fourth stage PM 2304. This light generates, after photo-detection and linear electrical amplification 231(1), an analog voltage $\pm v_{RES}^{(2)}$ (the 2nd residual), which is finally quantized in the bottom section which comprising PM 2305 and flash PADC section 230(2) generating the List Significant Bits (LSBs) 232(2).

Note the additions of optical delay lines 2340 and 2350 having larger and larger delays.

Figure 25:
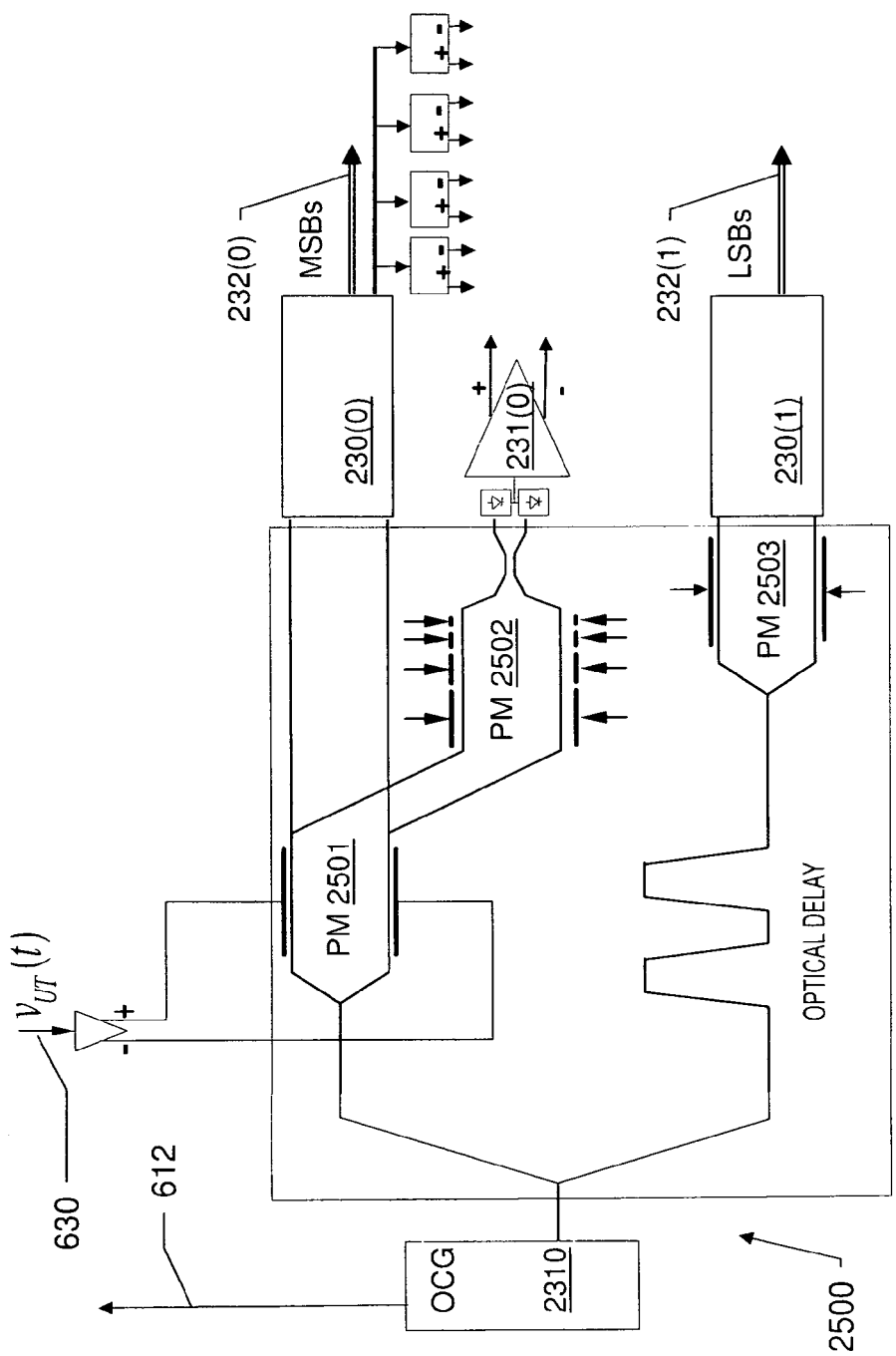
FIG. 25 schematically depicts a photonic two-stage pipeline ADC system according to a preferred embodiments of the current invention.

FIG. 25 schematically depicts a photonic two-stages pipeline ADC system 2500 according to a preferred embodiments of the current invention.

Figure 26:
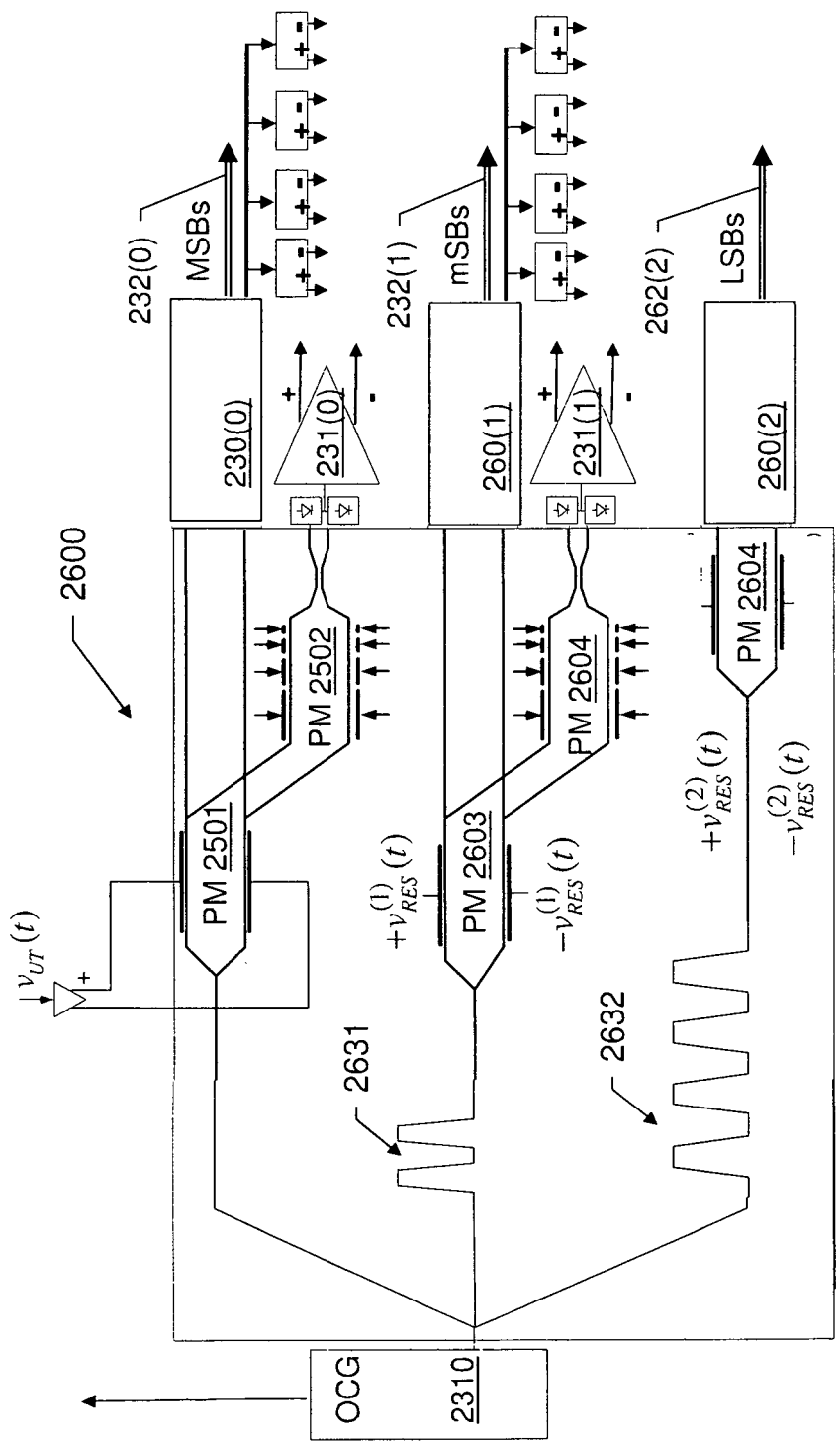
FIG. 26 schematically depicts a photonic three-stage pipeline ADC system according to a preferred embodiments of the current invention.

FIG. 26 schematically depicts a photonic three-stages pipeline ADC system 2600 according to a preferred embodiments of the current invention.

One disadvantage of the embodiments of FIGS. 23 and 24 is that the phase modulations by $\pm v_{UT}(t)$ in both figures and by $\pm v_{RES}^{(1)}$ in FIG. 24 must be duplicated. This is remedied in the systems disclosed in FIG. 25 (two-stage pipeline) and FIG. 26 (three-stage pipeline) wherein each phase modulation is applied only once, while the respective phase modulated signal is optically split, to be shared in two different sections. This eliminates the need for duplicating the RF signal but increases the optical loss by about 3 dB as the optical signal must be split.

Detailing FIG. 25, there are three sections.

The top section push-pull PM 2501 modulates by $\pm v_{UT}(t)$. Its output is fed into an PADC 230(0) and quantized to generate the MSBs 232(0), which are then DAC-ed by four 1-bit ADC fed to PM 2502. However, the two optical waveguides exiting PM 2501 are split to feed the mid section which comprises a PM 2502 with push-pull electrodes in lengths ratios 1:1/2:1/4, driven by the 1-bit DACs from the output of the top section 230(01). The mid section then generates (after photo-detection and electrical amplification 231(0)) the residual $\pm v_{RES}^{(1)}$ which is electrically applied to PM 2503 of the bottom section, which comprises is a flash PADC 230(1) just as in FIG. 7, used to generate the LSBs 232(1).

Finally, in FIG. 26 a two more sections are added to generate the third pipeline stage.

The first two sections of the embodiment 2600 are identical to that of FIG. 25.

Third section comprises a PM 2603 fed with outputs of amplifier 23(0): $+V^{(1)}_{RES}(t)$ and $-V^{(1)}_{RES}(t)$. PM 2603 receives light delayed by delay line 2631. After modulation, the light is detected in and digitized PADC 260(1) yielding the mSBs 232(1). PADC 260(1) drives four 1-bit ADCs that drives the forth section PM 2604.

In the fourth section from the top, the two optical signals which were push-pull modulated by $\pm v_{RES}^{(1)}$ are tapped and the quantized version of $\pm v_{RES}^{(1)}$ is optically subtracted off them in PM 2064. Light from PM 2604, after interference, is detected and amplified 231(1) to generate push-pull voltages $+V^{(2)}_{RES}(t)$ and $-V^{(1)}_{RES}(t)$.

Output voltage of amplifier 231(1), $\pm v_{RES}^{(2)}$ drives PM 2604, fed with light delayed by longer delay line 2632 which is in turn quantized in the bottom section by means of a flash PADC 260(2) to produce the LSBs 262(2).

Considering now in detail the generation of the residuals, e.g. the $2^{nd}$ section in FIG. 23, the phase generated in the upper arm is $\phi_{UT}/2 - \phi_{DAC}^{(1)}/2$ and the phase generated in the lower arm is $-\phi_{UT}/2 + \phi_{DAC}^{(1)}/2 + \pi/2$ (the pi/2 is additional static quadrature bias that needs to be maintained). After combining the two arms with the directional coupler and performing balanced photodetection, the cosine of the difference between the two phases mentioned above gets generated, yielding $$\cos[(\phi_{UT}(kT)/2 - \phi_{DAC}^{(1)}/2) - (-\phi_{UT}(kT)/2 + \phi_{DAC}^{(1)}/2 + \pi/2)] = \sin[\phi_{UT}(kT) - \phi_{DAC}^{(1)}] \approx \phi_{UT}(kT) - \phi_{DAC}^{(1)}$$

where the last approximation is due to the fact that $\phi_{DAC}^{(1)}$ is the quantization of $\phi_{UT}(kT)$ hence $\phi_{UT}(kT)-\phi_{DAC}^{(1)}$ is a small quantity, and the distortion generated by the sine characteristic is small. Now this electrical analog quantity is amplified with the amplification selected so as to stretch it full scale from $[-V_\pi, V_\pi]$ in preparation of applying it to the next flash-ADC stage. Moreover, the bandwidth of the linear amplifier generating the residual voltage (e.g. $\pm v_{RES}^{(1)}$) must be adequate to deal with pulses of photocurrent generated by the mid stage that can change every T seconds where $T^{-1}$ is the sampling rate. This amplifier must settle to its final output amplitude analog level (relative to the level of the previous T-seconds sampling interval), before the next interval comes along and with it a new analog difference signal is generated. The pipelining systems just introduce resort to the same building blocks as our disclosed flash-ADC we have, generating the analog residual signal (residual=analog input−DAC (ADC(analog input))), which is amplified and digitized again. Notice that the nonlinearity introduced in the mid-stages of residual generation stems from the Sin(.) characteristic of the phase-to-photocurrent, but also from possible non-linear compression of the amplifier.

Evidently the speed (sampling rate) of this pipeline is that of a single photonic flash ADC, and the delay is at least s T, where T is the sampling interval for a single stage and s is the number of stages. In case the DAC decision takes time to settle, say it becomes available not at the end of the first T interval, but rather, say, after a few T intervals, we may accommodate the extra delay by incorporating this much optical delay in the tapped signals of the first flash-ADC which lead to the middle subtraction unit, such that the optical comb pulses phase-modulated by $\pm V(t)$ in the first flash ADC, arrive at the right time under the 1:½:¼ "DAC electrodes", right when the DAC electrodes have settled with voltages from the DAC. So we have the delay of the first ADC decision+the DAC reaching steady state, which may be accommodated by optical delay. E.g., a 30 Gsamp/sec rate means 1 cm delay in vacuum, corresponding to the sampling interval T, or 7 mm physical path in the material (index of refraction 1.5 assumed), so if we say need up to 3T delay then the extra path is ~2 cm, which may be reasonably realized.

Notice that as long as the nonlinearities of the mid stages generating the residual can be approximated as memoriless, then these nonlinearities may be calibrated out by modifying the positions of the quasi-static phase levels of the following photonic-flash-ADC used to calibrate the residuals. It is apparent that we have an accurate phase-domain DAC, based on the generation of phase contributions weighted by 1, ½, ¼, ⅛, . . . , by means of 1-bit DACs and phase modulating electrodes of dyadic lengths, all decoupled from each other, and we are able to perform the phase subtraction very accurately based on the interferometric technique in each PC (barring the sin(.) distortion, and possibly the electrical amplifier nonlinearity, which may be at least partially corrected in the following flash ADC stage). We may then extract the analog residual after each ADC stage quite accurately, which is critical to good overall ADC performance. E.g. if we "do a good job" with say with our 6 bits flash-ADC modules (32 directional couplers) then we may in principle pipeline the system to 18 nominal bits in three stages. Due nonlinearities and imperfect calibrations in each stage as well as upon compounding, we expect to lose, say five ENOBs, ending up in a 13 bit ADC, which is broadband, say up to 20 GHz. Evidently, the major interim milestone is the realization of the 6 bit flash ADC module by itself, then we can pipeline it.

Figure 36:
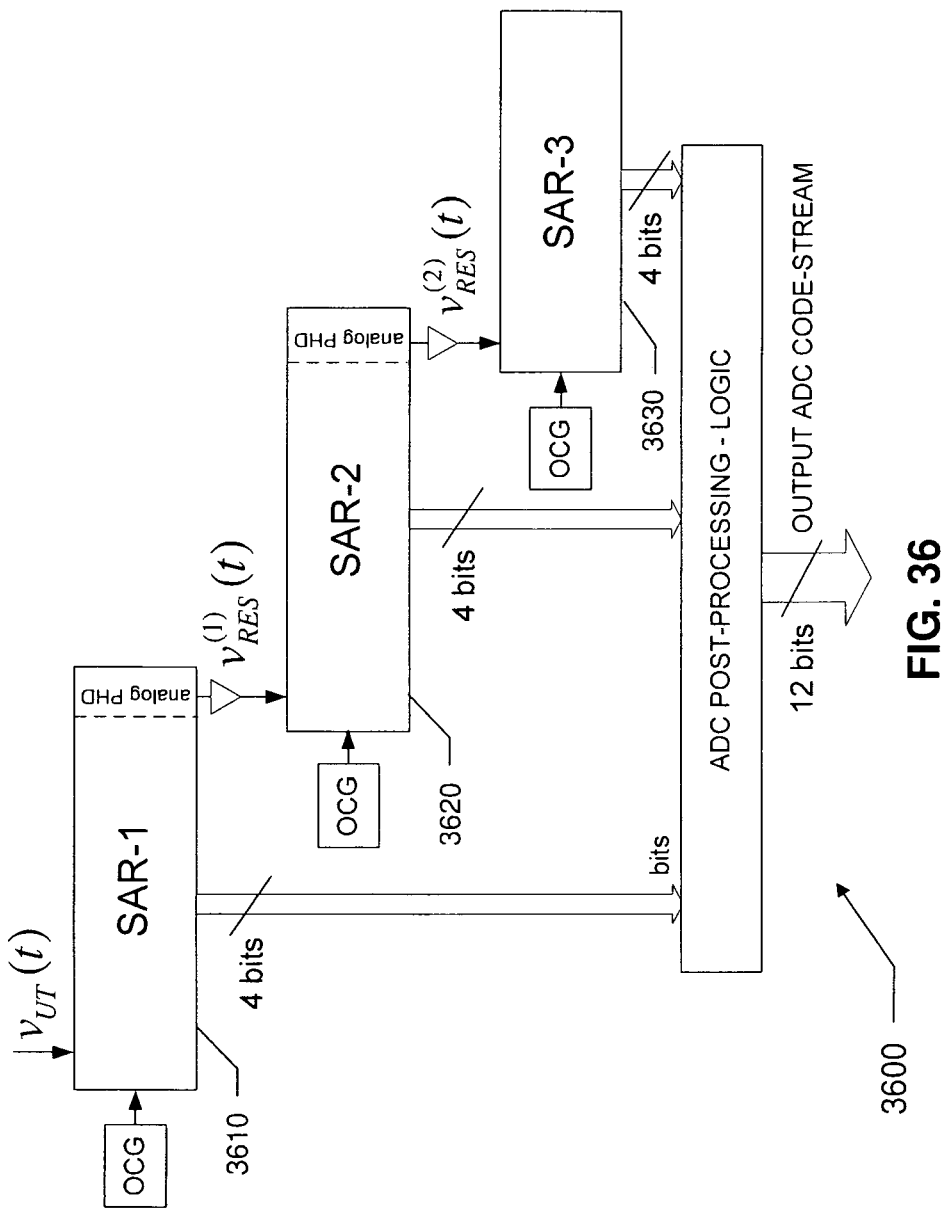
FIG. 36 schematically depicts a Pipelined SAR (P-SAR) system according to an exemplary embodiment of the current invention.

FIG. 36 schematically depicts a Pipelined SAR (P-SAR) system 360 (exemplified for a 12 bit system consisting of three pipelined stages) according to an exemplary embodiment of the current invention.

The voltage under test $V_{UT}(t)$ is applied to the first stage 3610. The residual optical phase of each of the first two SAR-PADC stages (each realized as in FIG. 34) is electrically measured in a balanced detector, yielding in the last analog PHD stage of the SAR-PADC (3470 in FIG. 34), a voltage $v_{RES}^{(i)}(t)$, i=1,2, (here i=1 for SAR stage 3610) electrically amplified to be stretched to full scale and fed to the next SAR-PADC stage 3620, as a new analog voltage to be measured. The analog PHD in the last SAR stage 3630 may be discarded or be unused, as this stage need not generate a residual signal. The OCG source is split to feed each pipeline stage. Alternatively, a single OCG source may be split to feed the multiple stages (which requires higher optical power and balancing the delays). The raw bits from the individual SAR PADCs are combined and processed by the logic circuitry of the ADC codeword lookup table 34990.

It is important to note that the SAR-PADC has an additional advantage of supporting the pipelining architecture of FIG. 36, which is a scaling technique enabling high ENOB count, by means of concatenation of several SAR-PADCs with the residual analog electrical output of one stage feeding in the following stage. This amounts to a sub-ranging technique where the first SAR performs a coarse quantization, with the second SAR zooming into the LSB interval in which the signal resides, and so forth. The generated residual analog signal is amplified and is used as the signal to be quantized in the successive stage. Pipelining is the required venue enabling to attain the SignWave target of 10 ENOB, by cascading multiple SAR-PADCs to reach 12 bit digital representation, out of which a true 10 ENOB may be secured. Pipelining is a well-known important architecture in the electronic ADC world, but to be best of our knowledge, this is the first application to photonic ADCs.

One specific point to be addressed in the photonic implementation is that the analog electrical measurement of the residual phase, generated by the SAR PADC termination, is not a linear function of the residual phase, but is the sine of the residual phase. The associated linear distortion of the interferometric sin(•) transfer characteristic must and can be counteracted by modifying the positions of the angular thresholds in the following SAR PADC which is electrically fed by the former SAR stage, in such a way that the sine characteristic is post-distorted and linearized. This technique falls into the realm of the control & calibration procedures to be discussed next. In the P-SAR architecture, we contend with the sin(*) nonlinearity of the analog output of the former SAR PADC by our control of the threshold phases of the successive PADC. Thus, a high linearity may be maintained in our pipelined architecture as well.

The inherently high linearity attainable in the flash and SAR structures has already been mentioned. In a nutshell, the interferometric sine distortion, which is a major limiter in amplitude-based PADC schemes, is not a factor in our novel flash and SAR architectures, as they merely measure the zero-crossing of the sine characteristic (the angular thresholds), provided the zero-crossings are statically set at the desired nominal positions required for linear ADC quantization (on an angular grid consisting of equal phase increments along the unit circle).

An even a more fundamental concern is the ability to maintain the angular levels of the ADC (e.g. 10 ENOBs would imply a third of a degree of arc precision):

There are two factors determining the smallest angle we can resolve:

(i): The ability to quasi-statically set the angle and maintain it to high precision in the vicinity of a specified angular location.

(ii): The magnitude random noise level jittering the angular location around its nominal position.

As for (i), we should mention that unlike in a DPSK delay interferometer, the two paths of our interferometers are nominally balanced, designed to have equal optical lengths, e.g. with the fabrication tolerances of lithographic techniques, the paths may have equal lengths up to one part in 10^3 or 10^4. Recalling that the temperature coefficient of Silicon refractive index fractional change is $10^{-4}$ per deg C, whereas the length change is 10^-5 per deg C., we conclude that relatively mild uniform temperature control of the PIC suffices to maintain the phase balance. One may then insert a thermo-optic controller in one of the arms of the balanced interferometer in order to effect a desired phase change, over a $2\pi$ range, but with a precision even as high or higher as one part in 10^4 (corresponding to 13 bits or more), by differentially heating or cooling a waveguide region in one arm, of a few mm in length by a couple of deg C. Alternatively an electro-optic or plasma effect may be used to effect the phase change, also necessitating a length of a few mm. Such phase controllers are shown in FIG. 34 as little ellipses 3424, 3425, etc., placed in one of the arms of each directional coupler. The challenge is then not to actuate the phase changes but to know where to maintain the phase positions, by means of closed loop calibration techniques, as discussed in the next section. We have the knob, but we should have the knowledge where to set it, and to turn it around so as to counteract environmental changes. Notice that if the static positions of the levels are shifted from their nominal positions, that is manifested as non-linearity of the ADC—the "staircase" of levels is not uniformly sloping up. The degradation would show up once one or more harmonic tones were applied to the ADC, generating new spurious frequencies, i.e. affecting the total harmonic distortion (TDH) spec, but would not have a noise-like character.

Point (ii) above can be addressed in an SNR analysis which would work out all random noise sources—both from light and from the electronics, and it may be shown that random noise jittering the nominal angles is quite low (provided we supply sufficient light).

Another issue is the impairment due to the shot-noise and electronic noise of the analog PHD extracting the residual signal in all the SAR stages but the last one (which does not have a PHD). The accurate SNR model to follow clearly accounts for this impairment, indicating that the target ENOB can be achieved at an average optical power of the order of 100 mW, attainable by our MLL OCG. The SNR analysis evidently also addresses the performance of each of P-CMPs, terminated in the 1-bit ADCs.

Yet another concern is the performance required of the photo-detectors, which are critical link in the detection chain. In order to avoid interference between adjacent sampling intervals, it is important to use detectors which are a several times faster than the sampling rate. E.g. for our 12.5 GS/s system we shall use 40G-grade detectors, suitable for operating with our planned current-mode integrate-hold-dump circuitry, in the receiver front-end and 1-bit ADC. We mention that detectors with bandwidths exceeding 100 GHz have been demonstrated and 70 GHz receivers are commercially available. Also notice that since we use balanced photo-detection, the nonlinearities of the detector will not matter, as the detector illuminated with more light will generate more photocurrent, and we are essentially determining which of the two photo-diodes is illuminated stronger. Moreover, if the detectors are uneven in responsivities, optical coupling, it is possible to calibrate the balance point by a single electrical offset bias, under the control & calibration procedure.

Yet another question is whether the interferometric techniques with multiple phase evaluation are in principle slower in comparison with direct intensity evaluation. We should mention that even intensity modulation based PADC are also internally using phase interference (e.g. to generate the Mach-Zehnder intensity modulation mechanism), here we just use two photo-detectors rather than one, and subtract their photocurrent in each ADC cycle, and do the electronic processing in each ADC cycle as well, although in the SAR and P-SAR scheme to obtain the full result we must wait a number of cycles equal to the number of bits. For a high-speed communication application, waiting 12 cycles of 12.5 GS/s, i.e. passing the full 12-bit ADC codeword to the ADC post-processor 1 nsec later, amounts to having the communication link lengthened by 20 or 30 cm (in glass or air), which typically has no impact.

The system level integration of these technologies is detailed FIG. 34. We should mention that an electrical master clock for all electronic circuits (in addition to the "optical clock" used for electro-optic sampling) may be derived from the Mode-Locked-Laser OCG itself, e.g. by tapping a fraction of the light onto a simple analog photo-receiver filtering the first harmonic of the time-comb. Other options (e.g. locking to atomic lines) are also available, in case the system is to be used for ultra-high-precision timing application, but this will not be pursued under the program.

Evidently, any A/D conversion process, PADC operation in particular, is typically afflicted by a multitude of analog impairments, chipping away at the system specs. Remarkably, our phase-based proposed architectures are self-healing, in the sense that several key impairments are essentially nulled-out to first order, by virtue of the system structure itself, rendering the specs insensitive to reasonable variations in many of these parameters and fluctuations, hence yielding inherent immunity to impairments. In particular, since the system encodes information in phase rather than in intensity, the system is insensitive (to first order) to the pulse-to-pulse amplitude fluctuations of the optical source, to the exact intensities incident on the optical comparators (which operate in the phase domain), to the precise coupling ratio of the integrated optic directional couplers and to the splitting ratios to the multiple comparators. The tolerances on the PIC fabrication are then much relaxed compared to conventional intensity modulation based PADC schemes.

We note that our scheme operates in differential (balanced) push-pull mode with antipodal phase modulations and balanced photo-detector pairs), hence gaining 3 dB in shot-noise SNR, and further reducing certain common-mode impairments as follows: A key resulting benefit is relaxed optical comb generator (OCG) requirements: tolerance to pulse-to-pulse intensity fluctuations, to laser RIN, which show up as common mode and are cancelled out by the differential detection, imparting a "self-healing" nature to our scheme. It turns out that many of the remaining impairments, which are not automatically mitigated by our "self-healing" architecture, may still be tuned out by proper adaptive calibration.

Sigma-Delta PADCs

The $\epsilon\delta$ ADC generic block diagram was introduced in FIG. 4.

Novel photonic realizations of $\Sigma\Delta$ PADCs are disclosed in FIGS. 27-33.

The required components in a ΣΔ ADC are: (i) subtractor; (ii) integrator(s); (iii) quantizer; and (iv) feedback DAC.

In accordance to our invention we may make use of at least three of the four ingredient components above, porting those from the other types of PADC which we disclosed heretofore.

In particular the subtractor and quantizer may be provided by our flash PADC, or more specifically by the IFE (including one or more PCs) and the post-detection slicer(s). As for the feedback DAC, we have introduced for SAR and Pipeline PADCs a very efficient and precise structure consisting of multiple 1-bit DACs and modulating electrodes in powers-of-two length ratios.

The missing element for a complete ΣΔ PADC, which has not been directly addressed in the other PADC structures, is the integrator. For this component we have two choices:
(a) since our principle of operation is to perform the ADC action in the phase-domain, we require an integrator with output in the phase domain. We propose to use an optical Voltage-Controlled-Oscillator (VCO), namely a Voltage Controlled tunable Laser (VCL), in order to obtain effective integration from an input electrical signal to the optical phase. Essentially the instantaneous frequency of the VCL is proportional to the control electrical current, hence the optical phase, which is the integral of the instantaneous frequency comes out as proportional to the integral of the control electrical current. We mention that the usage of such tunable or chirped lasers optical VCO has been advanced in the recent years for different purposes, in the field of optical phase-locked-loops PLL [30], but not heretofore applied for PADC.
(b): Alternatively, we may incorporate electronic integrators (e.g. realized as an operational amplifier) within the drivers of the phase modulators, directly attaining this way integration from the optical domain into the phase domain. The various embodiments below will reflect the various alternatives outlined above for the required building blocks of ΣΔ PADC, differing in their interconnections, but invariably realizing one of the schemes of FIG. 4. We mention that often the Σδ ADCs are realized with a 1-bit ADC (single sign-detector) and with a 1-bit DAC (just an electronic linear amplifier with appropriate gain driven by a unipolar zero-or-high voltage—the sign detector output). It is possible, however, to realize ΣΔ ADCs using ADCs and DACs in the feedback loop with more than one bit, in which case the ENOBs may be raised (however there are calibration and accuracy issues working against the ENOB increase, hence the components must be carefully engineered). In our photonic realization, since our IFE-based flash-ADC structure is relatively fast, and since our feedback DAC may also be realized at high speed, we may take this route of working with multi-bit ADCs and DACs in the feedback loop.

All the proposed schemes assume that the overall dimensions may be made low enough such that the round-trip time around the loop is a fraction of the (over)-sampling interval.

FIG. 27(a) schematically depicts a block diagram of an optical delta-sigma ADC system 2700 according to an exemplary embodiment of the current invention.

FIG. 27(b) give some additional details of a block diagram of an optical delta-sigma ADC system 2700 according to an exemplary embodiment of the current invention.

Figure 27:
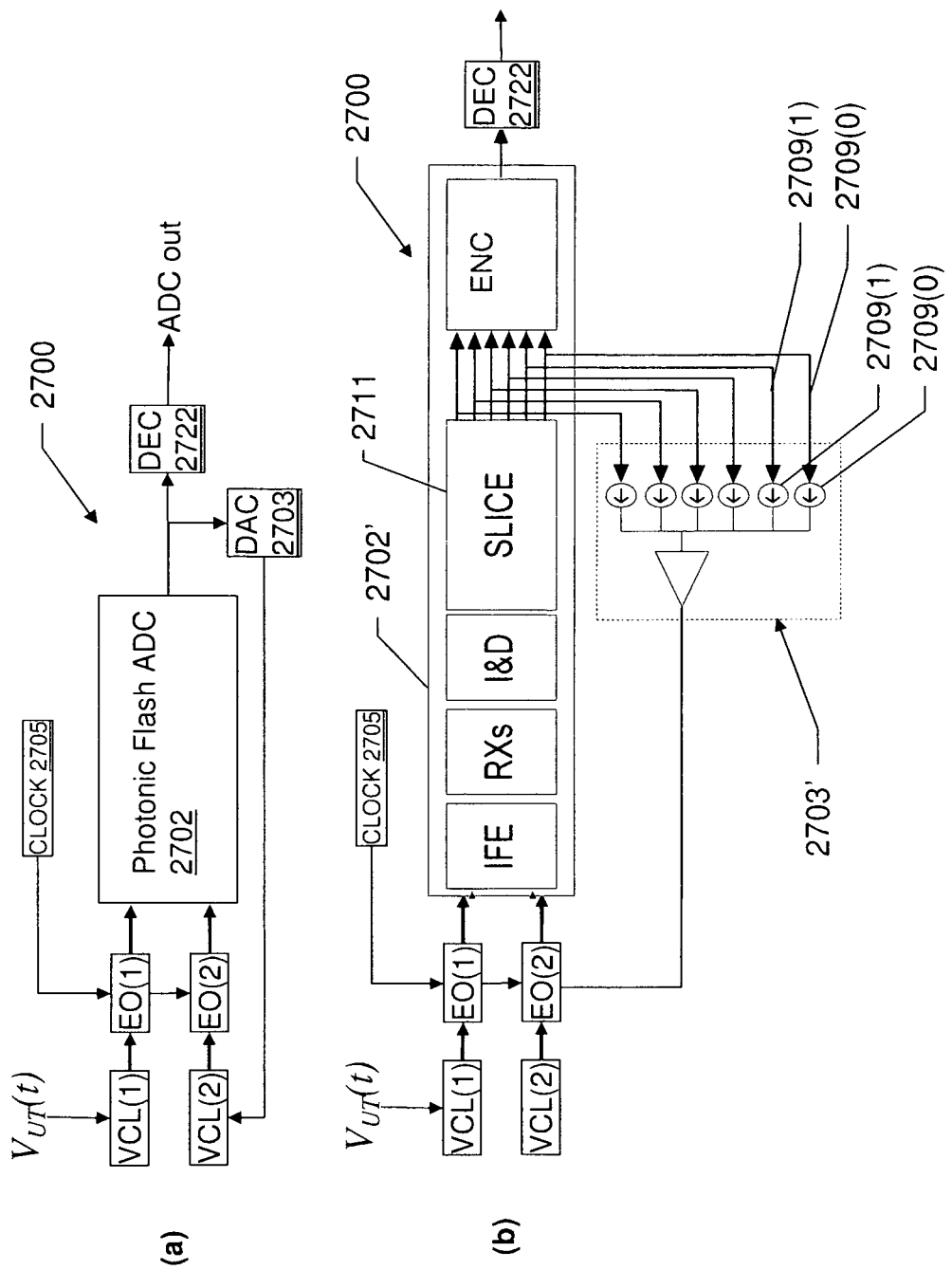
FIG. 27(a) schematically depicts a block diagram of an optical delta-sigma ADC system according to an exemplary embodiment of the current invention.
FIG. 27(b) gives some additional details of a block diagram of an optical delta-sigma ADC system according to an exemplary embodiment of the current invention.

FIG. 27 realizes a ΣΔ PADC according to the generic block diagram of Fig., by means of a pair of tunable lasers VCL(1) and VCL(2) used as integrators, a photonic flash ADC module 2702 (essentially the cascade of an IFE followed by post-detection slicers) and an electronic DAC 2703 in the feedback loop, driving the optical frequency tuning input of second of the two tunable lasers (VCL(2), while the optical frequency tuning input of the first laser VCL(1) is driven by the voltage under test $V_{UT}(t)$.

What is preferably added to the system to enable its ADC operation is a sampling means: the two lasers, VCL(1) and VCL(2) are feed two optical switches EO(1) and EO(2) respectively, which are driven in synchronized matter by an electrical comb generator CLOCK 2705, in order to carve sampling pulses out of the continuously phase modulated optical signals generated by the two lasers. Once carved, the two phase-modulated pulse trains are fed into the photonic flash PADC module 2702 in order to quantize the difference between the phases of the two pulses. This is a feasible scheme to the extent that the photonic switches may be realized at the requisite speed with low jitter of the electronic sampling combs.

FIG. 27(b) depicts another implementation improvement proposed here with regards to the electronic DAC 2703 used in the feedback loop. In this embodiment, DAC 2703 is not realize by means of current sources in the ratio of 1, ½, ¼, ... etc. Instead, DAC 2703' comprises a larger array of current sources 2709(0), 2709(1), etc., each one of which is driven by one of the logic outputs 2710(0), 2710(1), etc., of a slicer SLCE 2711 in the photonic flash ADC module 2702' (the same logic outputs which are used as logic inputs into the encode logic unit, translating the thermometer codes into conventional ADC output codes).

Decimator DEC 2722 bring performs the same decimation function as in a sigma-delta ADC of the art.

Figure 28:
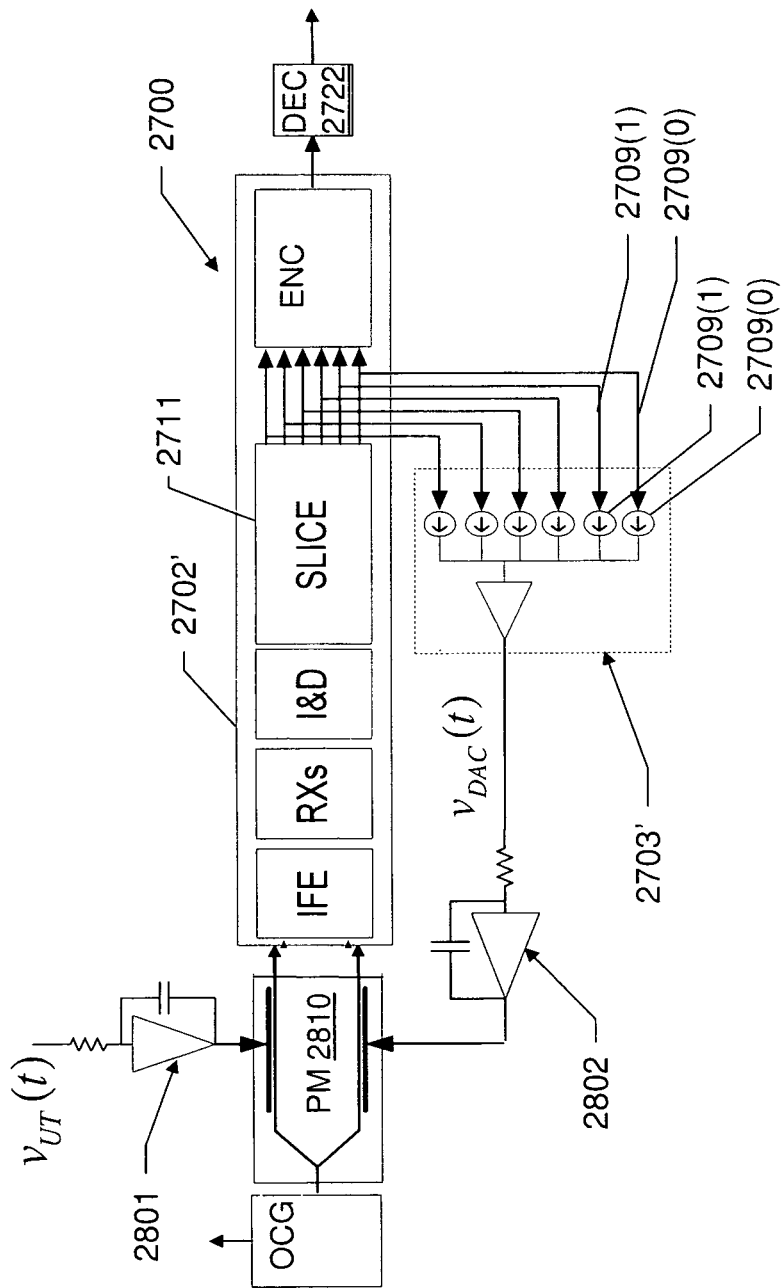
FIG. 28 schematically depicts a block diagram of an optical delta-sigma ADC system using electronic integrators according to another exemplary embodiment of the current invention.

FIG. 28 schematically depicts a block diagram of an optical delta-sigma ADC system 2800 using electronic integrators according to another exemplary embodiment of the current invention.

FIG. 28 illustrates another ΣΔ PADC scheme with a pair of electronic integrators 2801 and 2802, a K-bit DAC 2703', a push-pull modulator PM 2810 and an IFE (photonic flash PADC) module 2702' also realizing the generic block diagram of FIG. 4E.

In this embodiment, the integrators 2801 and 2802 integrating the input voltage $V_{UT}(t)$ and the DAC output voltage $V_{DAC}(t)$ respectively, are electronically realized (e.g. as operational amplifiers as shown). This is a feasible scheme to the extent electrical integrators may be realized at high speed (the only problem may be overflow—optionally requiring integrate & dump, i.e. a reset option). Starting from this implementation on, we re-institute the OCG as pulsed source performing the sampling.

Figure 29:
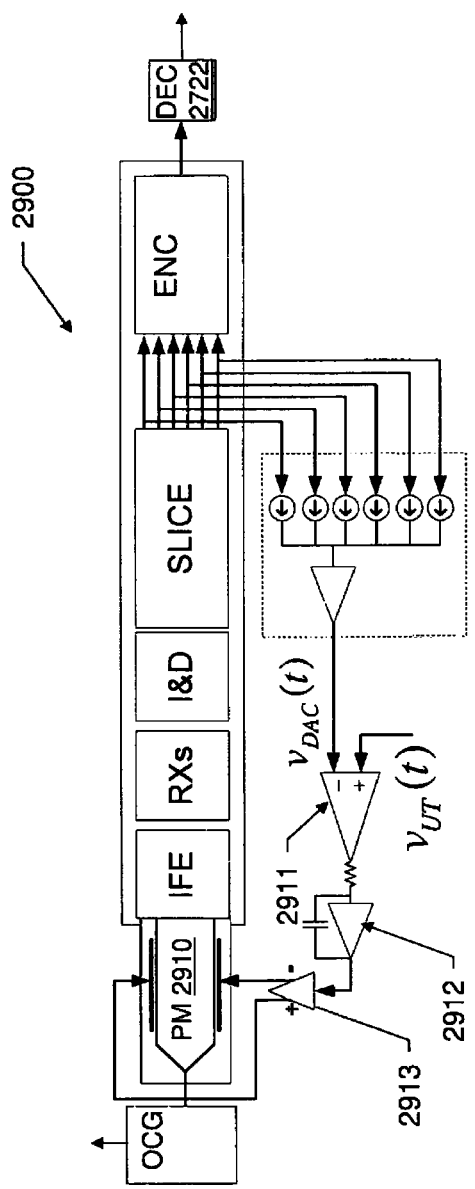
FIG. 29 schematically illustrates yet another delta-sigma PADC scheme with a single electronic integrator differentially amplified for driving the push-pull phase modulator, followed by IFE-based ADC according to an exemplary embodiment of the current invention.

FIG. 29 schematically illustrates yet another ΣΔ PADC scheme 290 with a single electronic integrator 2912 differentially amplified 2912 for driving the push-pull phase modulator PM 2910 followed by IFE-based ADC. The integrator 2912 is driven by the difference created in subtractor 2911 between the voltage under test $V_{UT}(t)$ and the K-bit feedback DAC electrical output $V_{DAC}(t)$.

Figure 30:
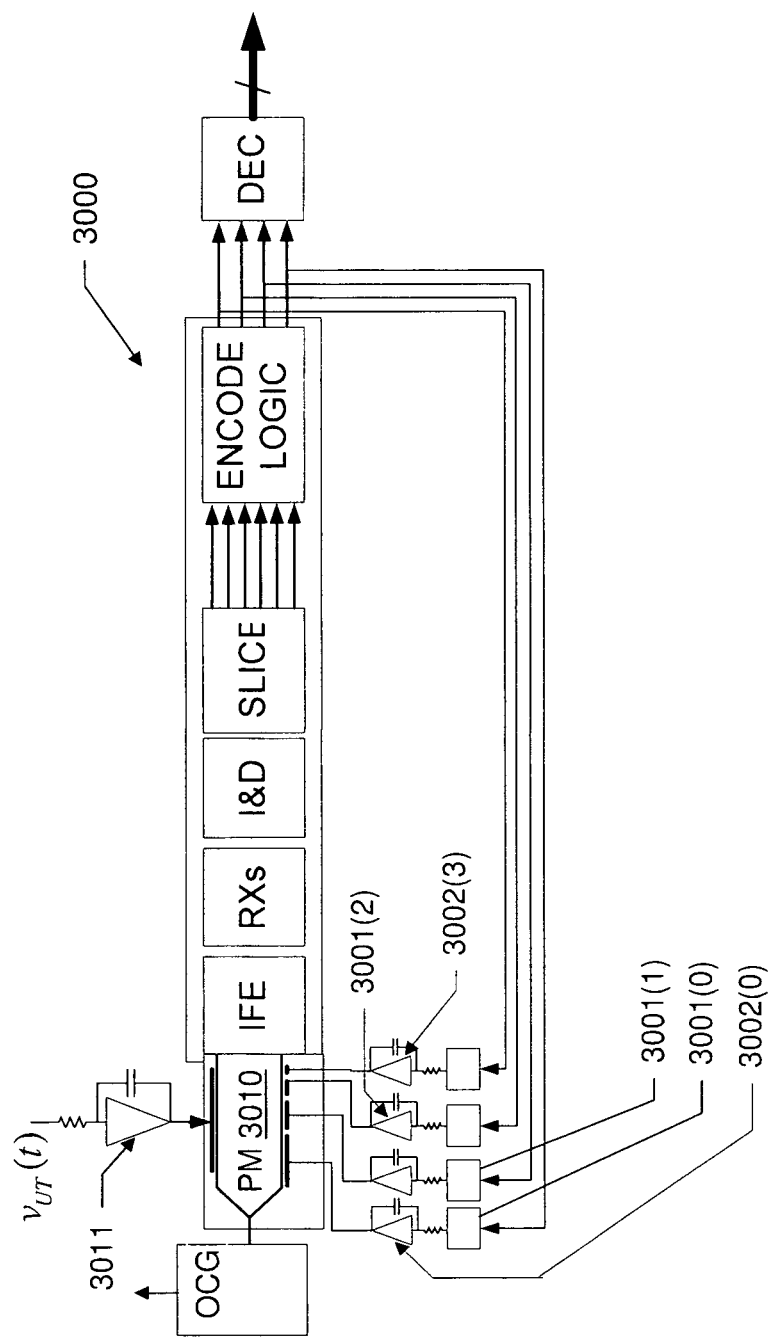
FIG. 30 schematically illustrates yet another delta-sigma PADC scheme with multiple 1-bit DACs outputs of which are integrated and applied to the lower multi-section electrode of the push-pull phase modulator according to a preferred embodiment of the current invention.

FIG. 30 schematically illustrates yet another ΣΔ PADC scheme 3000 with multiple 1-bit DACs outputs of which are integrated and applied to the lower multi-section electrode of the push-pull phase modulator according to a preferred embodiment of the current invention.

In the embodiment of FIG. 30 ΣΔ PADC 3000 comprises multiple 1-bit DACs 3001(0), 3000(1), etc., the outputs of which are integrated in integrators 3002(0), 3002(2), etc., respectively and applied to the lower multi-section electrode of the push-pull phase modulator PM 3010. To the upper electrode of PM 3010 is applied the voltage under test $V_{UT}(t)$ after it was integrated by integrator 3011. Although this scheme is less voltage efficient than some of the other embodiments, it may have the advantage that its electrodes section is twice as short, and since the round trip loop delay is at premium this may be a worthwhile tradeoff.

Figure 31:
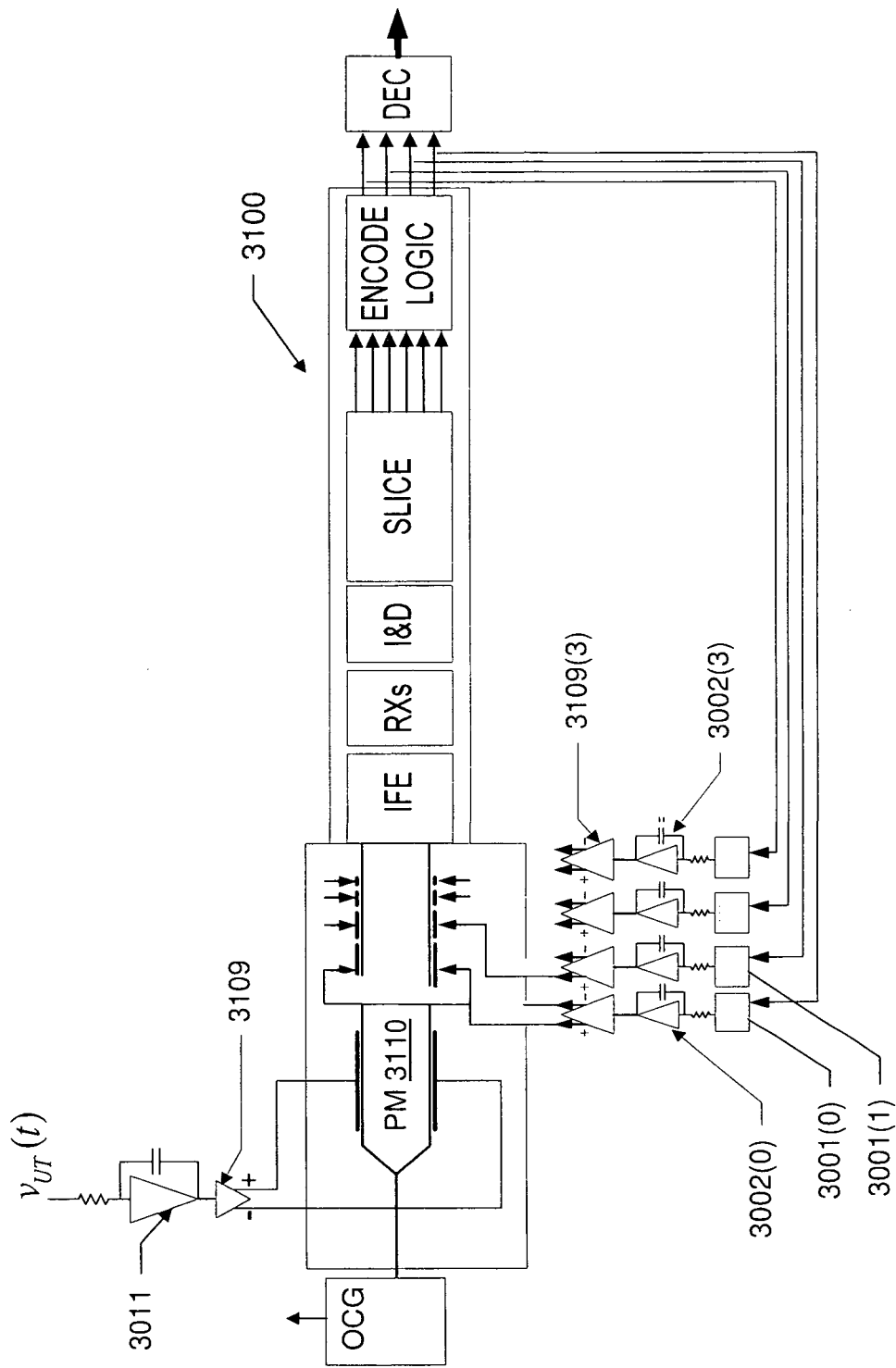
FIG. 31 schematically illustrates yet another delta-sigma PADC scheme with multiple 1-bit DACs outputs of which are integrated and differentially applied to the multi-section electrodes of the push-pull phase modulator separately from integrated test signal the according to a preferred embodiment of the current invention.

FIG. 31 schematically illustrates yet another ΣΔ PADC scheme 3100 with multiple 1-bit DACs outputs of which are integrated and differentially applied to the multi-section electrodes of the push-pull phase modulator PM 3110 separately from integrated test signal the according to a preferred embodiment of the current invention.

In the exemplary embodiment of FIG. 31, ΣΔ PADC scheme 3100 uses multiple 1-bit DACs 3001(0), 3001(1), etc., the outputs of each of which are integrated by corresponding integrators 3002(0), 30002(1), etc., differentially amplified 3009(0), 3009(1), etc., and applied to pairs of multi-section electrodes of the push-pull phase modulator PM 3110. The voltage under test $V_{UT}(t)$ is integrated 3011 and applied to another pair of phase modulating electrodes in modulator 3110, and the cascade of the electrodes generates in a push-pull fashion the difference between the phase under test and the DAC generated phase. The principle of operation of the phase modulation generated by this multi-electrodes structure is identical to that outlined in the SAR PADC scheme of FIG. 21 and the Pipeline PADC scheme of FIG. 24.

Figure 32:
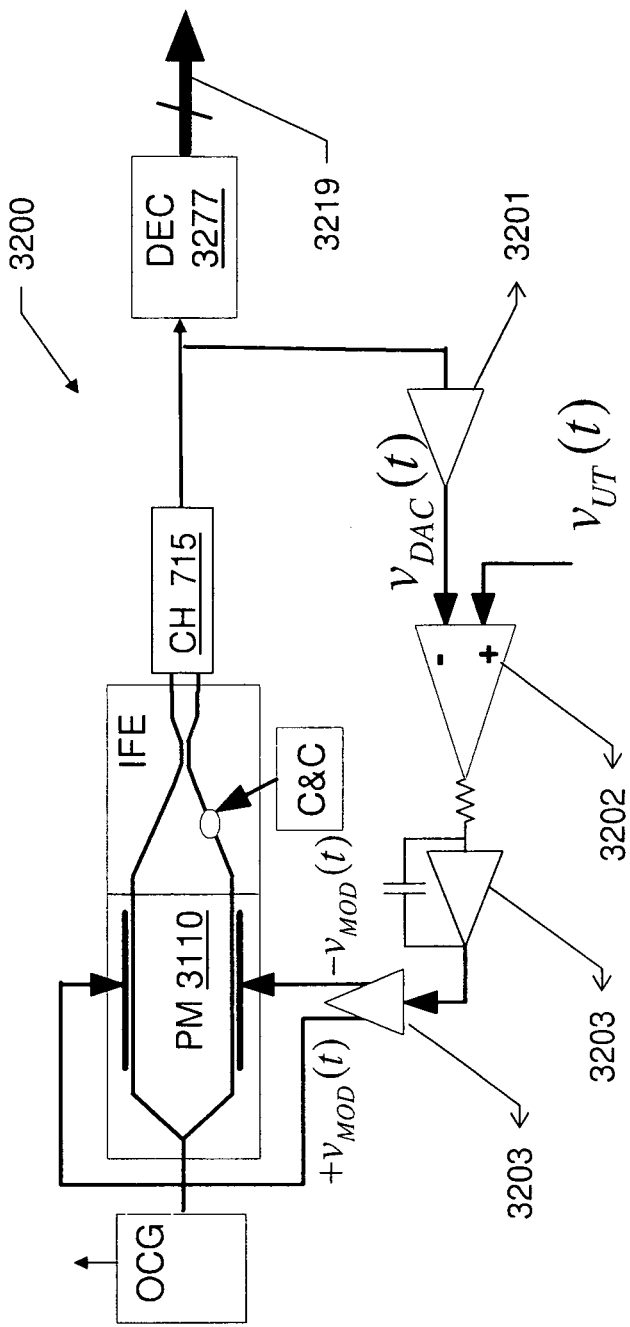
FIG. 32 schematically illustrates yet another delta-sigma PADC scheme with a single 1-bit ADC, electronic subtraction and integration of test signal and DAC signal and differential phase modulation according to another preferred embodiment of the current invention.

FIG. 32 schematically illustrates yet another ΣΔ PADC scheme 3200 with a single 1-bit ADC, electronic subtraction and integration of test signal and DAC signal and differential phase modulation according to another preferred embodiment of the current invention.

The embodiment illustrated in FIG. 32 is of a ΣΔ PADC scheme 3200, which may be viewed as a special case of FIG. 31, with the WE reduced to a single PC (e.g. CH 715), and the feedback DAC degenerated to a single 1-bit ADC 3201 (a linear amplifier driven by the 1-bit ADC output), feeding an electrical subtractor 3202 (differential amplifier subtracting $V_{DAC}(t)$ from $V_{UT}(t)$) then an integrator 3203 and an differential amplifier 3204 in order to push-pull drive the phase modulators with voltages $+V_{MOD}(t)$ and $-V_{MOD}(t)$. Decimator DEC 3277 monitors the output of the 1-bit slicer in CH 715 and produces the multi-bit results in output 3219. This scheme then operates with a 1-bit ADC (slicer) in CH 715 and has the simplest structure and the potential for lowest round trip loop delay as its IFE degenerates to a single directional coupler (single PC). On the downside its speed is less than ones we disclosed with more PCs in the IFE, however its simplicity and robustness of its 1-bit ADC and its short round trip delay, make it a preferred scheme.

Figure 33:
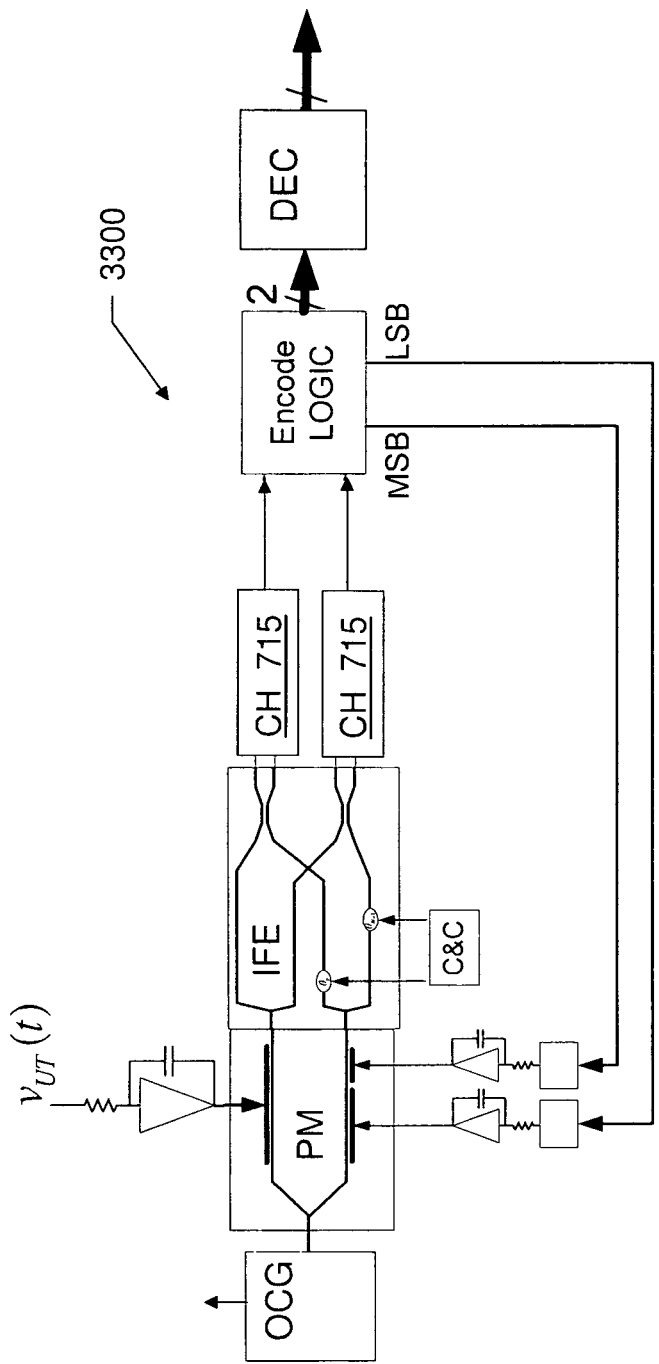
FIG. 33 schematically illustrates yet another delta-sigma PADC scheme with two 1-bit ADC, electronic subtraction and integration of test signal and DAC signal and differential phase modulation according to another preferred embodiment of the current invention which is a specific implementation of FIG. 30.

FIG. 33 schematically illustrates yet another ΣΔ PADC scheme 3300 with two 1-bit ADC, electronic subtraction and integration of test signal and DAC signal and differential phase modulation according to another preferred embodiment of the current invention which is a specific implementation of FIG. 30.

Finally, FIG. 33 illustrates a ΣΔ PADC with 2-bit ADC and a pair of 1-bit DACs and split electrodes. This scheme is similar to the one in the previous figure, except for doubling up from 1 bit to 2 bits, hence using a 2-PCs IFE (equivalent to I&Q detection) and using two 1-bit DACs the outputs of which are electrically integrated, respectively driving the two electrodes (in 2:1 length ratio) in the lower two-electrode section of the push-pull phase modulator, and also integrating the voltage under test prior to its application to the upper electrode.

Note that Encoding logic stage in FIGS. 30, 31, and 33 may be optional and its function may be performed by the decimator, while the 1-bit ADCs are responsive to outputs of the slicers.

Note that number of spilt electrodes in various embodiments of the phase modulator may be different than specified in the corresponding figures.

Optionally, PM and IFE may be constructed together or integrated on same substrate.

Optionally, a plurality of electronic and optionally optoelectronic elements or sub-systems may be constructed or integrated together, for example on one or few solid state substrates.

Bandpass Photonic PADCs

Other variants of our proposed PADC systems are bandpass PADC systems. Each of the broadband PADC systems disclosed so far is amenable to a corresponding bandpass version. The idea of combining sampling and down-conversion is not new (e.g. [31]), and is a known advantage of optical sampling by OCG pulse trains. Optical bandpass sampling may be combined here with our novel disclosures of various types of PADCs.

As an application consider the digitization of a 5 GHz bandpass in the overall range of from 0 to 20 GHz, say in the spectral intervals 0-5, 5-10, 10-15, 15-20 GHz. Another application example, for broadband radar is the digitization of 1 GHz but positioned at intervals of 1 GHz in the X-band. Bandpass sampling may be achieved by undersampling the waveform (relative to the Nyquist frequency associated with the bandpass signal's highest frequency) by means of an OCG of the appropriate sampling rate. The sampling rate should be no less than the spectral extent of the sampling waveform [32]. The aliasing occurring in sampling a phase modulated waveform with an optical comb, means that a given bandpass spectral slice under test is duplicated multiple times all the way down to around DC (say in the first example, the 15-20 GHz slice is brought down to 0 to 5 GHz). Once the bandpass slice has been effectively down-converted, we terminate our photonic flash-ADC in 1-bit ADCs (slicers) operating up to 5 GHz (including a low-pass anti-aliasing filter), which electronic slicers may now be realized in CMOS rather than using more exotic electronic technologies, such as InP. Moreover, in a pipeline configuration, the amplifier stages and the 1-bit DACs in the middle stages are also less prone to non-linearities, slewing, etc. Another aspect that is relieved by going bandpass rather than full broadband is the phase modulators design. Reducing bandwidth, even if not around DC, but around a high center frequency, may improve the modulation efficiency if appropriate phase matching techniques are used. E.g. for a bandpass slice, say 15-20 GHz, the $v_\pi$ switching voltage can be reduced by making the modulator four times as long, and addressing the frequency roll-off due to walk-off between the RF and optical waveforms by means of quasi-phase-matching techniques, alternating the electrode polarities. As for the modulator in the mid residual-generation stage of a pipeline system, which operates at baseband anyway, having it cover a narrower band directly helps with reducing its $v_\pi$ (e.g. comparing a 20 GHz system with a 5 GHz bandpass system, we just make the electrodes four times longer). Likewise the DAC driven electrodes, may also be made longer as the frequency is lower and there is less walkoff, which means now that the DACs are required to generate even lower voltage (and at a slower rate) so the DAC requirements are also alleviated.

It is reasonable that under a bandpass requirement we may gain several ENOBs, relative to the full broadband solution.

It is also possible to process a broadband signal by processing the spectral slices in parallel, similar to a filter bank concept. The common RF signal is split into multiple replicas, each is bandpass filtered to select a different spectral slice (this amounts to having an analog FDM demux), and each of these bandpass electrical signals drives its own photonic ADC, all of which operate in parallel. As a projection of performance, we would aim for 15 ENOBs for each spectral slice of 5 GHz (a 90 dB dynamic range) based on a pipelining architecture for digitizing each spectral slice, aiming to obtain 15 effective bits in narrowband slices of 5 GHz up to 20 GHz and effective 13 bits in the full 200 Hz band at once.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub combination.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims. All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

The invention claimed is:

1. An ultra-high-speed optical analog to digital converter comprising: an input for receiving electrical input voltage; at least one laser source for providing a train of equally spaced coherent light pulses; at least one phase modulator for modulating the phase of said light pulses in response to said electrical input voltage to provide phase modulated light pulses; an optical front end comprising at least one optical channel, wherein each optical channel comprises an optical coupler for interfering said phase modulated light pulses with a reference light to create a first and a second interference beams, wherein light intensities in said first and second interference beams depend on relative phase of said phase modulated light pulses and said reference light; at least one optical receiver comprising: a first and a second photodiode for detecting light from said first and a second interference beams to produce a first and a second photocurrents indicative of intensity of said detected light; and an electronic comparator for producing a binary signal indicative of a difference in said first and second photocurrents; and an electronic encoding logic, for creating a multi-bit result from a plurality of said binary signals.

2. A method of photonic analog-to-digital conversion, comprising: receiving an electrical analog input test signal; generating a coherent laser beam; phase modulating said coherent laser beam, thus linearly mapping said input signal into optical phase of a phase-modulated signal beam; generating at least a first phase-shifted reference beam coherent with said phase-modulated signal beam, and relatively phase shifted with respect to said phase-modulated signal beam by a first phase shift angle; interfering at least a portion of said phase-modulated signal beam with said first phase-shifted reference beam to generate a positive and a negative interference beams; and detecting said positive and a negative interference beams and generating a first electrical signal having Boolean value indicative of a sign of a phase difference between said phase-modulated signal beam and said first phase-shifted reference beam.

3. The method of claim 2 and further comprising: generating a plurality of phase-shifted reference beams, each coherent with said phase-modulated signal beam, and each relatively phase shifted with respect to said phase-modulated signal beam by a corresponding one of phase shift angles; interfering a corresponding portion of said phase-modulated signal beam with each of said phase-shifted reference beams to generate corresponding positive and negative interference beams; detecting said positive and negative interference beams and generating a plurality of corresponding electrical signals having Boolean values indicative of the sign of the corresponding phase difference between said phase-modulated signal beam and said phase-shifted reference beams; and using said plurality of Boolean electrical signal to obtain multiple bits digital value indicative of the strength of said analog input test signal.

4. The method of claim 3, wherein said plurality of corresponding phase shift angles are substantially evenly spaced; said steps of interfering corresponding beams; detecting said positive and negative interference beams, and generating said electrical signals, having Boolean values are substantially performed in parallel; and said using the plurality of Boolean electrical signals to obtain a multiple bits digital value indicative of a strength of said analog input test signal is equivalent to performing flash analog to digital conversion of said electrical analog input test signal.

5. The method of claim 2, wherein detecting said positive and negative interference beams and generating an electrical signal having a Boolean value indicative of the sign of the phase difference between said phase-modulated beam and said first phase-shifted reference beam comprises: converting said positive and negative interference beams to positive and a negative electrical signal respectively using positive and negative photodiodes respectively; and comparing said positive and negative electrical signals.

6. The method of claim 5 wherein comparing said positive and a negative electrical signals comprises: subtracting photo-currents generated by said positive and a negative photodiodes and generating difference electrical signal; and testing the sign of said difference electrical signal.

7. The method of claim 2 wherein said interfering a portion of said phase-modulated signal beam with said phase-shifted reference beam comprises using an optical directional coupler with splitting ratio substantially equal to 50/50.

8. The method of claim 2 wherein said generating a phase-shifted reference beam further comprising phase-modulating said reference beam by phase proportional to, but opposite to a modulation of said signal beam.

9. The method of claim 2 wherein said signal beam comprises a train of short optical pulses.

10. The method of claim 9 wherein said reference beam comprises a train of short optical pulses.

11. An opto-electronic Successive Approximation Register type analog to digital converter, comprising: an input for receiving electrical input voltage; a laser source for providing coherent laser beam; a beam splitter for splitting said coherent laser beam to a signal beam and reference beam; at least a first input phase modulator for modulating a phase of said signal beam in response to said input voltage; at least a first feedback phase modulator for modulating a phase of said reference beam in response to a feedback voltage; at least one interferometer for interfering said signal beam and said reference beam and generating a positive and a negative interference beams; at least one channel for detecting said positive and a negative interference beams and generating an electrical signal having Boolean value indicative of a sign of the corresponding phase difference between said signal beam and said reference beam; and Successive Approximation Register logic unit arranged to use said Boolean electrical signal to provide feedback voltage to said first feedback phase modulator, and to obtain a multiple bits digital value indicative of a strength of said analog input voltage.

12. The opto-electronic Successive Approximation Register analog to digital converter of claim 11, and further comprising a second input phase modulator, modulating phase of said reference beam in response to said input voltage but oppositely to a phase shift of said first input phase modulator.

13. The opto-electronic Successive Approximation Register analog to digital converter of claim 11, and further comprising a second feedback phase modulator for modulating phase of said signal beam in response to said feedback voltage but oppositely to a phase shift of said first feedback phase modulator.

14. The opto-electronic Successive Approximation Register analog to digital converter of claim 11, wherein said first feedback phase modulator comprises: a first electrode having a first length; and a second electrode having a length substantially twice the length of said first electrode.

15. The opto-electronic Successive Approximation Register analog to digital converter of claim 11, wherein said feedback voltage is provided by a plurality of 1-bit digital to analog converters.

16. The opto-electronic Successive Approximation Register analog to digital converter of claim 11, wherein said first feedback phase modulator is capable of producing phase shifts substantially equal to:

$$C \times \sum_{I=0}^{N} B_i \times 2^i$$

wherein C is an arbitrary coefficient, $B_i$ are Boolean values equal to either zero or one, and N is the number of successive approximation steps associated with said first feedback phase modulator.

17. The opto-electronic Successive Approximation Register analog to digital converter of claim 12, wherein said first feedback phase modulator is capable of producing phase shifts substantially equal to:

$$C \times \sum_{I=0}^{N} B_i \times 2^i$$

wherein C is an arbitrary coefficient, $B_i$ are Boolean values equal to either zero or one, and N is the number of successive approximation steps associated with said first feedback phase modulator.

18. The opto-electronic Successive Approximation Register analog to digital converter of claim 13, wherein said first feedback phase modulator is capable of producing phase shifts substantially equal to:

$$C \times \sum_{I=0}^{N} B_i \times 2^i$$

wherein C is an arbitrary coefficient, $B_i$ are Boolean values equal to either zero or one, and N is the number of successive approximation steps associated with said first feedback phase modulator.

19. The opto-electronic Successive Approximation Register analog to digital converter of claim 14, wherein said first feedback phase modulator is capable of producing phase shifts substantially equal to:

$$C \times \sum_{I=0}^{N} B_i \times 2^i$$

wherein C is an arbitrary coefficient, $B_i$ are Boolean values equal to either zero or one, and N is the number of successive approximation steps associated with said first feedback phase modulator.

* * * * *